(12) United States Patent
Honda et al.

(10) Patent No.: US 8,565,019 B2
(45) Date of Patent: Oct. 22, 2013

(54) METHOD FOR CONTROLLING THRESHOLD VALUE IN NONVOLATILE SEMICONDUCTOR MEMORY DEVICE

(75) Inventors: Yasuhiko Honda, Hiratsuka (JP); Ryu Hondai, Yokohama (JP); Manabu Satoh, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 943 days.

(21) Appl. No.: 12/273,845

(22) Filed: Nov. 19, 2008

(65) Prior Publication Data

US 2009/0129157 A1 May 21, 2009

(30) Foreign Application Priority Data

Nov. 20, 2007 (JP) ................................. 2007-300820
Nov. 20, 2007 (JP) ................................. 2007-300838
Oct. 20, 2008 (JP) ................................. 2008-270066

(51) Int. Cl.
*G11C 11/34* (2006.01)
*G11C 16/04* (2006.01)

(52) U.S. Cl.
USPC ............. 365/185.03; 365/185.22; 365/185.24

(58) Field of Classification Search
USPC ........................... 365/185.03, 185.24, 185.22
See application file for complete search history.

(56) References Cited

U.S. PATENT DOCUMENTS

| | | | |
|---|---|---|---|
| 5,959,882 A | 9/1999 | Yoshida et al. | |
| 6,040,993 A * | 3/2000 | Chen et al. ............... | 365/185.03 |
| 6,522,580 B2 | 2/2003 | Chen et al. | |
| 6,556,474 B1 * | 4/2003 | Kobayashi et al. ...... | 365/185.03 |
| 6,636,437 B2 | 10/2003 | Kobayashi et al. | |
| 7,020,026 B2 * | 3/2006 | Guterman et al. ....... | 365/185.28 |
| 7,095,654 B2 | 8/2006 | Quader et al. | |
| 7,212,444 B2 * | 5/2007 | Hisamoto et al. ........ | 365/185.19 |
| 7,292,477 B2 | 11/2007 | Honda | |

(Continued)

FOREIGN PATENT DOCUMENTS

| | | |
|---|---|---|
| JP | 7-169284 A | 7/1995 |
| JP | 2001-101879 | 4/2001 |

(Continued)

OTHER PUBLICATIONS

Japanese Office Action Issued Aug. 3, 2012 in Patent Application No. 2007-300820 (with English translation).
Office Action issued May 8, 2012, in Japanese Patent Application No. 2007-300838, (with English-language Translation).

*Primary Examiner* — Harry W Byrne
*Assistant Examiner* — Lance Reidlinger
(74) *Attorney, Agent, or Firm* — Oblon, Spivak, McClelland, Maier & Neustadt, L.L.P.

(57) ABSTRACT

A method for controlling a threshold value in a nonvolatile semiconductor memory device, includes: performing writing at least once on at least one of the memory cells to be adjusted to a state other than an erased state with an applied voltage that does not cause excess writing, with verify reading being not performed; and performing verify reading by applying a verify voltage corresponding to a target threshold value of the memory cell after the writing is performed on the at least one of the memory cells to be adjusted to the state other than the erased state, and, when the threshold value of the memory cell is determined to be lower than the target threshold value, repeating the writing with the applied voltage that does not cause excess writing and the verify reading until the threshold value of the memory cell becomes equal to or higher than the target threshold value.

10 Claims, 32 Drawing Sheets

(56) References Cited

U.S. PATENT DOCUMENTS

| | | |
|---|---|---|
| 7,411,819 B2 | 8/2008 | Takeuchi |
| 7,593,266 B2 * | 9/2009 | Senoo et al. ............. 365/185.22 |
| 2002/0080660 A1 * | 6/2002 | Kanamitsu et al. ........... 365/200 |
| 2003/0026146 A1 | 2/2003 | Kobayashi et al. |
| 2005/0169057 A1 * | 8/2005 | Shibata et al. ........... 365/185.28 |
| 2007/0064482 A1 | 3/2007 | Takeuchi |
| 2007/0159892 A1 | 7/2007 | Kang et al. |
| 2013/0083603 A1 | 4/2013 | Harada |

FOREIGN PATENT DOCUMENTS

| | | |
|---|---|---|
| JP | 2004-94987 | 3/2004 |
| JP | 2006-228427 | 8/2006 |
| JP | 2007-012237 | 1/2007 |
| JP | 2007-87526 A | 4/2007 |
| JP | 2007-141447 | 6/2007 |

* cited by examiner

140: COLUMN ADDRESS GENERATOR

| | |
|---|---|
| COUNTER OUTPUT | 0 0 0 0 0 1 |
| XOR OUTPUT | 0 0 0 0 1 |
| COUNTER OUTPUT | 0 0 0 0 1 0 |
| XOR OUTPUT | 0 0 0 1 1 |
| COUNTER OUTPUT | 0 0 0 0 1 1 |
| XOR OUTPUT | 0 0 0 1 0 |
| COUNTER OUTPUT | 0 0 0 1 0 0 |
| XOR OUTPUT | 0 0 1 1 0 |
| COUNTER OUTPUT | 0 0 0 1 0 1 |
| XOR OUTPUT | 0 0 1 1 1 |

ADDRESS INCREMENT ORDER
IN THIS EMBODIMENT

| CAD | <7> | <6> | <5> | <4> | <3> | <2> | <1> | <0> |
|---|---|---|---|---|---|---|---|---|
| CHARGE CONSUMPTION/TIME → | 3 | 2 | 1 | 5 | | 4 | | |
| NUMBER OF CHANGES → | 2 | 4 | 8 | 16 | | 32 | TOTAL | |
| CHARGE CONSUMPTION AMOUNT → | 6 | 8 | 8 | 80 | | 128 | 230 | |

WRITE

| | | | | | | | |
|---|---|---|---|---|---|---|---|
| 0 | 0 | 0 | 0 | – | 0 | – | – |
| 0 | 0 | 0 | 0 | – | 1 | – | – |
| 0 | 0 | 0 | 1 | – | 0 | – | – |
| 0 | 0 | 0 | 1 | – | 1 | – | – |
| 0 | 0 | 1 | 0 | – | 0 | – | – |
| 0 | 0 | 1 | 0 | – | 1 | – | – |
| 0 | 0 | 1 | 1 | – | 0 | – | – |
| 0 | 0 | 1 | 1 | – | 1 | – | – |
| 0 | 1 | 0 | 0 | – | 0 | – | – |
| 0 | 1 | 0 | 0 | – | 1 | – | – |
| 0 | 1 | 0 | 1 | – | 0 | – | – |
| 0 | 1 | 0 | 1 | – | 1 | – | – |
| 0 | 1 | 1 | 0 | – | 0 | – | – |
| 0 | 1 | 1 | 0 | – | 1 | – | – |
| 0 | 1 | 1 | 1 | – | 0 | – | – |
| 0 | 1 | 1 | 1 | – | 1 | – | – |
| 1 | 0 | 0 | 0 | – | 0 | – | – |
| 1 | 0 | 0 | 0 | – | 1 | – | – |
| 1 | 0 | 0 | 1 | – | 0 | – | – |
| 1 | 0 | 0 | 1 | – | 1 | – | – |
| 1 | 0 | 1 | 0 | – | 0 | – | – |
| 1 | 0 | 1 | 0 | – | 1 | – | – |
| 1 | 0 | 1 | 1 | – | 0 | – | – |
| 1 | 0 | 1 | 1 | – | 1 | – | – |
| 1 | 1 | 0 | 0 | – | 0 | – | – |
| 1 | 1 | 0 | 0 | – | 1 | – | – |
| 1 | 1 | 0 | 1 | – | 0 | – | – |
| 1 | 1 | 0 | 1 | – | 1 | – | – |
| 1 | 1 | 1 | 0 | – | 0 | – | – |
| 1 | 1 | 1 | 0 | – | 1 | – | – |
| 1 | 1 | 1 | 1 | – | 0 | – | – |
| 1 | 1 | 1 | 1 | – | 1 | – | – |

VERIFY

| | | | | | | | |
|---|---|---|---|---|---|---|---|
| 0 | 0 | 0 | 0 | – | 0 | – | – |
| 0 | 0 | 0 | 0 | – | 1 | – | – |
| 0 | 0 | 0 | 1 | – | 0 | – | – |
| 0 | 0 | 0 | 1 | – | 1 | – | – |
| 0 | 0 | 1 | 0 | – | 0 | – | – |
| ⋮ | ⋮ | ⋮ | ⋮ | | ⋮ | | |
| 1 | 1 | 0 | 1 | – | 1 | – | – |
| 1 | 1 | 1 | 0 | – | 0 | – | – |
| 1 | 1 | 1 | 0 | – | 1 | – | – |
| 1 | 1 | 1 | 1 | – | 0 | – | – |
| 1 | 1 | 1 | 1 | – | 1 | – | – |

FIG. 30B

METHOD FOR CONTROLLING THRESHOLD VALUE IN NONVOLATILE SEMICONDUCTOR MEMORY DEVICE

CROSS-REFERENCE TO RELATED APPLICATION

This application is based upon and claims the benefit of priority from prior Japanese Patent Applications No. 2007-300820, No. 2007-300838 and No. 2008-270066 filed on Nov. 20, 2007, Nov. 20, 2007, and Oct. 20, 2008 respectively in Japan, the entire contents of which are incorporated herein by reference.

BACKGROUND OF THE INVENTION

1. Field of the Invention

The present invention relates to a nonvolatile semiconductor memory device and a method for controlling threshold values in a nonvolatile semiconductor memory device, and more particularly, to a method for controlling multi-value data stored in memory cells.

2. Related Art

As nonvolatile semiconductor memory devices such as flash memories have larger capacities at lower costs than ever, the data stored in each memory cell is formed with a larger number of bits than ever. If the threshold voltage corresponding to each data state has a wide distribution in a multi-value memory, the space between each two adjacent states becomes narrower, and it becomes difficult to perform data reading with precision. Therefore, a very narrow distribution is required for each threshold value in the memory cells. For example, JP-A 2004-94987 (KOKAI) discloses a write method for obtaining narrow threshold voltage distributions.

As the memory cells in such a multi-value memory are becoming smaller and smaller, a variation of the threshold value of a memory cell adjacent to a subject memory cell causes the threshold value of the subject memory cell to vary. This is the problem called the adjacency effect.

Also, the adjustment time (the write time) is expected to become shorter, even though very narrow threshold value distributions are required. For example, JP-A 2007-141447 (KOKAI) discloses a write method for increasing the write speed.

SUMMARY OF THE INVENTION

According to a first aspect of the present invention, there is provided a method for controlling threshold values in a nonvolatile semiconductor memory device that includes a plurality of memory cells each capable of having a multi-value state by adjusting a threshold voltage, and a word line connected to the memory cells, writing being performed by applying a write voltage to the word line, the method including: performing writing at least once on at least one of the memory cells to be adjusted to a state other than an erased state with an applied voltage that does not cause excess writing, with verify reading being not performed; and performing verify reading by applying a verify voltage corresponding to a target threshold value of the memory cell after the writing is performed on the at least one of the memory cells to be adjusted to the state other than the erased state, and, when the threshold value of the memory cell is determined to be lower than the target threshold value, repeating the writing with the applied voltage that does not cause excess writing and the verify reading until the threshold value of the memory cell becomes equal to or higher than the target threshold value.

According to a second aspect of the present invention, there is provided a method for controlling a threshold value in a nonvolatile semiconductor memory device that includes a plurality of memory cells each capable of having a multi-value state by adjusting a threshold voltage, and a word line connected to the memory cells, writing being performed by applying a write voltage to the word line, the method including: performing writing at least once on at least one of the memory cells to be adjusted to a state other than an erased state with an applied voltage that does not cause excess writing, with verify reading being not performed; performing low verify reading by applying a low verify voltage corresponding to a first target threshold value after the writing is performed on the at least one of the memory cells to be adjusted to the state other than the erased state, and, when the threshold value of the memory cell is determined to be lower than the first target threshold value, repeating the writing with the applied voltage that does not cause excess writing, and the low verify reading until the threshold value of the memory cell becomes equal to or higher than the first target threshold value; and performing verify reading by applying a verify voltage corresponding to a second target threshold value higher than the first target threshold value after the low verify reading is performed on the at least one of the memory cells to be adjusted to the state other than the erased state, and, when the threshold value of the memory cell is determined to be lower than the second target threshold value, repeating the writing with the applied voltage that does not cause excess writing, and the verify reading until the threshold value of the memory cell becomes equal to or higher than the second target threshold value.

According to a third aspect of the present invention, there is provided a method for controlling a threshold value in a nonvolatile semiconductor memory device that includes a plurality of memory cells each capable of having a multi-value state by adjusting a threshold voltage, and a word line connected to the memory cells, verify reading being performed on the memory cells to be adjusted to a state other than an erased state, writing being performed on the memory cells having not reached a target threshold value by increasing a write voltage to be applied to the word line, the method including: performing writing simultaneously on a first memory cell to be adjusted to a first target threshold value and a second memory cell connected to the same word line as the first memory cell, when the write voltage to be applied to the word line at the time of writing on the first memory cell becomes equal to or higher than a write start voltage of the second memory cell to be adjusted to a second target threshold value next higher than the first target threshold value.

According to a fourth aspect of the present invention, there is provided a nonvolatile semiconductor memory device that has a plurality of memory cells capable of holding a multi-value state by adjusting a threshold voltage, and performs writing on each of the memory cells by applying one of write voltages suitable for the multi-value state to each of the memory cells, the nonvolatile semiconductor memory device including: a plurality of word lines configured to be connected to two or more of the memory cells; a first row address decoder configured to decode one or more of bit strings forming a row address, using a first power supply voltage as a drive power supply; a second row address decoder configured to decode the remaining ones of the bit strings forming the row address, using a second power supply voltage as a drive power supply; a third row address decoder configured to use the second power supply voltage as a drive power supply to drive one of the word lines, based on decoding results of the first and second row address decoders; a first voltage switching unit configured to generate the first power supply voltage that is at a first voltage level when a group of memory cells including a memory cell in which writing is to be performed is selected, and is at a second voltage level when another group of memory cells is selected; and a second voltage switching unit configured to generate the second power supply voltage that is at a third voltage level when a group of memory cells including the memory cell in which writing is to be performed is selected, and is at the second voltage level when another group of memory cells is selected.

According to a fifth aspect of the present invention, there is provided a method for controlling a threshold value in a nonvolatile semiconductor memory device that has a plurality of memory cells capable of holding a multi-value state by adjusting a threshold voltage, and performs writing on each of the memory cells by applying one of write voltages suitable for the multi-value state to each of the memory cells, the method including: performing writing by applying a voltage corresponding to a first target threshold value, only a required minimum number of times, to the memory cells to be adjusted to a first state other than an erased state of the multi-value state; performing writing with an initial voltage lower than a voltage corresponding to a second target threshold value, and, when a predetermined intermediate level lower than the second target value is not reached, performing re-writing with a voltage increased to avoid excess writing, the writing and re-writing being performed on the memory cells to be adjusted to a second state having the second target threshold value lower than the first target threshold value, the second state being different from the erased state and the first state; and performing writing with an initial voltage lower than a voltage corresponding to a third target threshold value, and, when the second target value and the third target value are not reached, performing re-writing with a voltage increased to avoid excess writing, the writing and re-writing being performed on the memory cells to be adjusted to a third state having the third target threshold value lower than the first and second target threshold values and the memory cells to be adjusted to the second state having the second target threshold value and having the writing performed up to the intermediate level, the third state being different from the erased state, the first state, and the second state.

BRIEF DESCRIPTION OF THE DRAWINGS

FIG. 30B shows the bit variation while the column address is incremented by 1 at a time;

DETAILED DESCRIPTION OF THE INVENTION

Before embodiments of the present invention are described, adjacency effects are first explained through an example case where a NOR flash memory is used as a nonvolatile semiconductor memory device.

Figure 13:
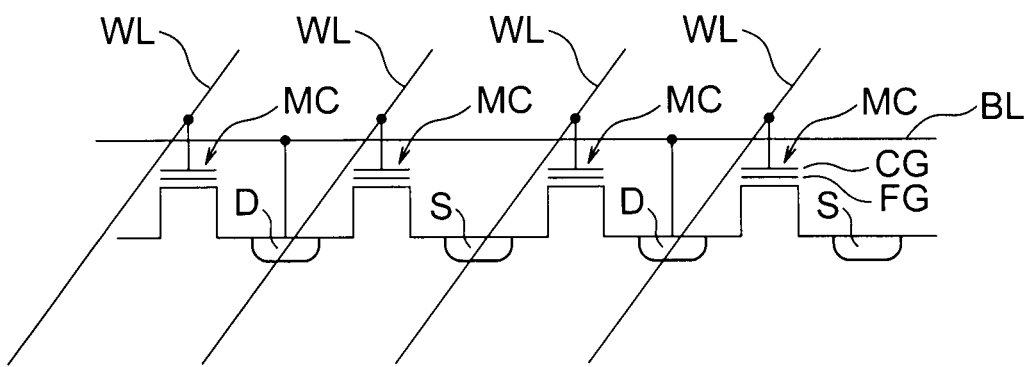
FIG. 13 illustrates a first example structure of a conventional NOR flash memory.

As shown in FIG. 13, a NOR flash memory normally has memory cells MC arranged in a matrix form. In FIG. 13, only the memory cells MC in the same column are shown. Each of the memory cells MC includes: a source region S and a drain region D formed on a semiconductor substrate; a gate insulating film (not shown) formed on the portion of the semiconductor substrate to be the channel region between the source region S and the drain region D; a floating gate FG formed on the gate insulating film; an interelectrode insulating film (not shown) formed on the floating gate FG; and a control gate CG formed on the interelectrode insulating film.

Each two adjacent ones of the memory cells MC in the same column share the source region S or the drain region D. The drain regions D of the memory cells MC in the same column are connected in parallel to a common bit line BL via bit-line contacts BC (not shown). The control gates CG of the memory cells MC in the same row are connected to a common word line WL.

Figure 14:
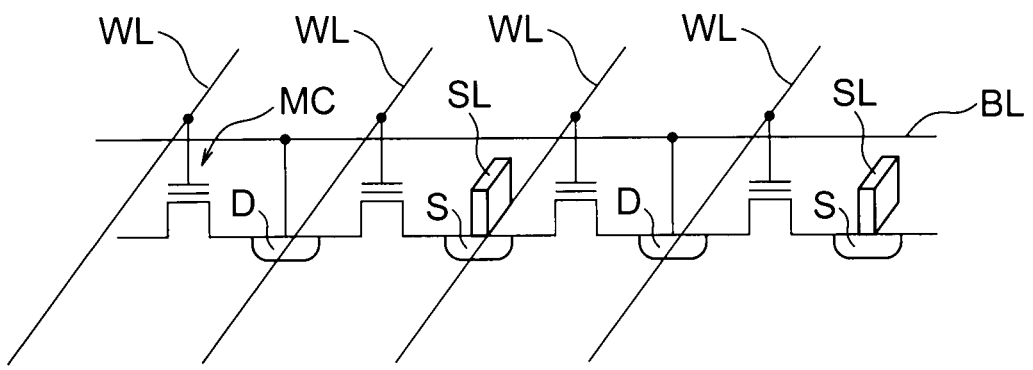
FIG. 14 illustrates a second example structure of a conventional NOR flash memory.

Although a NOR flash memory having a ground potential supplied via the source region S of each of the memory cells MC is shown in FIG. 13, a NOR flash memory may have such a structure that the source regions S of the memory cells MC in the same row are connected by a source line SL below the bit lines BL, and a ground potential is supplied through the source line SL, as shown in FIG. 14.

In a NOR flash memory having this structure, a threshold value adjustment in each memory cell MC (writing) is performed by applying a predetermined voltage to the control gate CG and the drain region D, and injecting channel hot electrons, caused by setting the source region S and the semiconductor substrate as the ground potential, into the floating gate FG.

As electrons are injected into the floating gate FG of a memory cell MC, capacitance coupling C is caused between the floating gate FG of the memory cell MC and the floating gate FG of each memory cell MC adjacent to the memory cell MC, and an adjacency effect is caused as the threshold voltage of each adjacent memory cell MC.

In a NOR flash memory, the drain regions D of the memory cell MC of the same column are connected to a bit line BL via bit-line contacts BC. Accordingly, an adjacency effect is not caused between each two adjacent memory cells sharing the same drain region D in the bit-line direction (the same column direction), as the potential is shielded by the bit-line contact BC.

However, an adjacency effect is caused between each two adjacent memory cells in the same word-line direction (the same row direction) and between each two adjacent memory cells in the same bit-line direction (the same column direction). In the NOR flash memory shown in FIG. 14 in which the source regions S in the same word-line direction (the same row direction) are connected to a common source line SL, the potential is shielded by the source line SL, and adjacency effects are caused only among the memory cells MC in the same word-line direction (the same row direction). In a NAND flash memory, the memory cells in the same column are connected in series, and therefore, an adjacency effect is caused between every two adjacent memory cells.

Therefore, a threshold value adjustment cannot be performed simultaneously in the memory cells causing an adjacency effect on one another, unless write data to be written into the memory cells connected to at least two word lines WL is determined before writing in the NOR flash memory shown in FIG. 13, and write data to be written into the memory cells connected to at least one word line WL is determined before writing in the NOR flash memory shown in FIG. 14.

The following embodiments will be described as example cases where write data to be written into the memory cells connected to at least one word line is determined in a NOR flash memory having the structure illustrated in FIG. 14. In the following embodiments, the three states in the multi-value distribution of each memory cell MC are defined as (10), (00), and (01) in order of increasing threshold value, with the erased state being defined as (11).

The following is a description of embodiments of the present invention, with reference to the accompanying drawings.

First Embodiment

Figure 1:
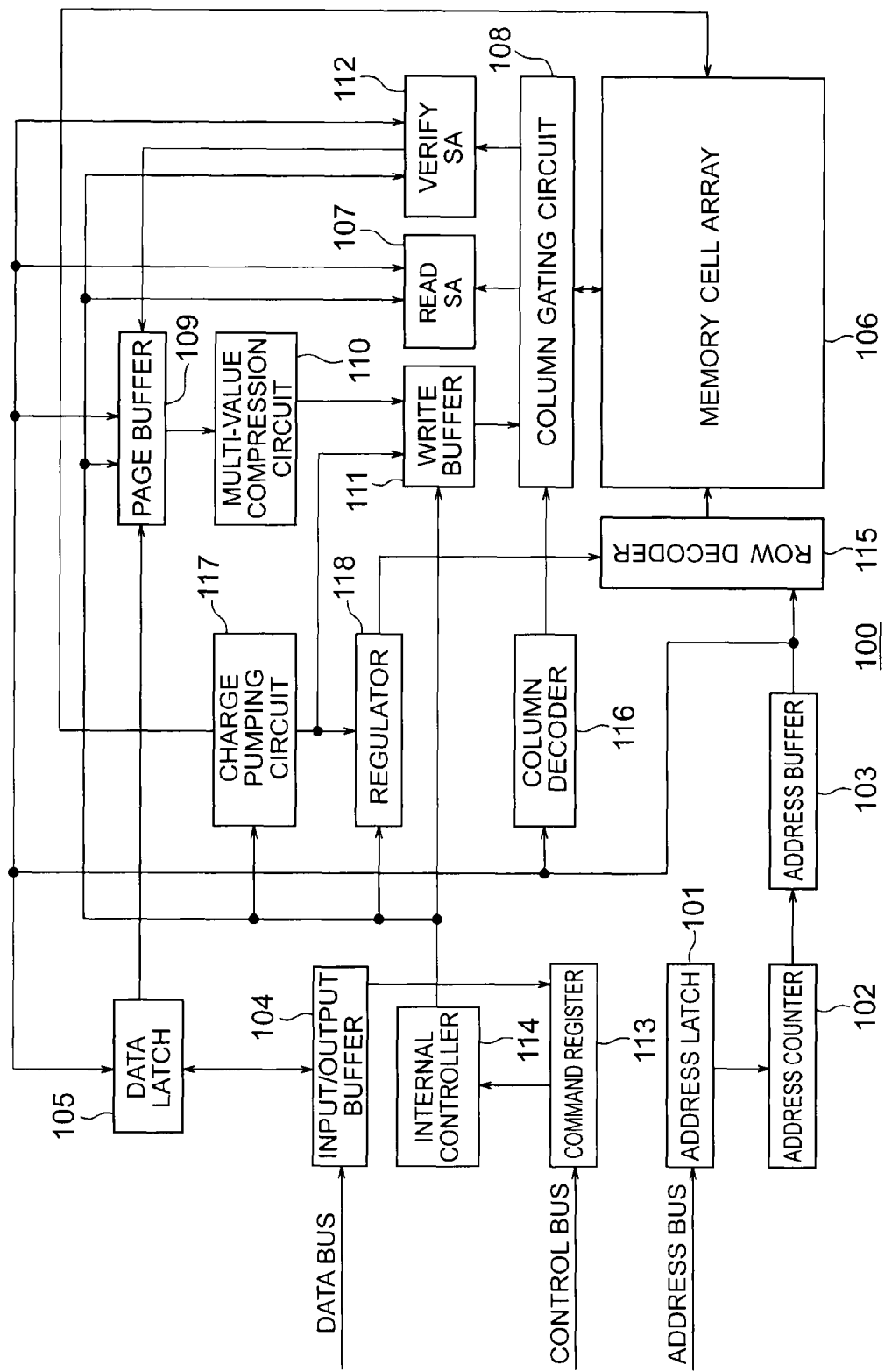
FIG. 1 is a block diagram illustrating the structure of a nonvolatile semiconductor memory device in accordance with a first embodiment of the present invention.

A method for controlling multi-value data of a nonvolatile semiconductor memory device in accordance with a first embodiment of the present invention is described. FIG. 1 is a block diagram schematically showing an example structure of a NOR flash memory 100 to which the method for controlling multi-value data of a nonvolatile semiconductor memory device in accordance with the first embodiment can be applied. The same components as those of the above described conventional NOR flash memory are denoted by the same reference numerals as those used for the conventional NOR flash memory, and therefore, explanation of them is omitted here.

The NOR flash memory 100 of this embodiment includes an address latch 101, an address counter 102, an address buffer 103, an input/output buffer 104, a data latch 105, a memory cell array 106, a read sensing amplifier circuit 107, a column gating circuit 108, a page buffer 109, a multi-value compression circuit 110, a write circuit 111, a verify sensing amplifier circuit 112, a command register 113, an internal controller 114, a row decoder 115, a column decoder 116, a charge pumping circuit 117, and a regulator circuit 118, for example.

In FIG. 1, the address latch 101 receives and latches addresses from an external address bus. The address counter 102 receives and counts the latched addresses from the address latch 101. The address buffer 103 receives a count output of the address counter 102, and outputs an internal address corresponding to a memory cell MC in which writing, reading, or erasing is to be performed.

The input/output buffer 104 exchanges read data/write data with an external data bus and the internal data latch 105. The memory cell array 106 has a structure in which nonvolatile memory cells MC are arranged in a matrix fashion, like each of the above described conventional NOR flash memory. The memory cell array 106 has word lines WL, bit lines BL, and source lines SL connected to the memory cells. The memory cell array 106 may be divided into units called banks that can be simultaneously written and read in parallel.

The read sensing amplifier (SA) circuit 107 senses the data in a memory cells MC in the memory cell array 106 via the column gating circuit 108 at the time of reading, and outputs the data to the data latch 105. For example, a predetermined read voltage is applied to the word line WL, and the cell current flowing through the bit line BL is compared with the reference current flowing in a reference cell (not shown), so as to read the data from the memory cell MC.

As in the comparative examples, quaternary data can be stored in the memory cells MC by dividing and controlling the amount of electrons to be injected into the floating gates FG. More specifically, the three states in the multi-value distribution of each memory cell MC are defined as (10), (00), and (01) in order of increasing threshold value, with the erased state being defined as (11). However, the data allocation in the multi-value distribution is not limited to that. The data that can be stored in the memory cells MC is not limited to quaternary data either, and n-value data (n being a positive integer of 4 or greater) may be stored in the memory cells, for example.

The page buffer 109 latches the write data supplied from the data latch 105. The number of page buffers to be prepared is determined to be the number necessary for determining the write data for the memory cells connected to at least one word line WL.

The multi-value compression circuit 110 compresses the multi-value write data supplied from the page buffer 109 at the time of writing, and outputs the compressed data to the write circuit 111. The write circuit 111 receives the write data input from the multi-value compression circuit 110 at the time of writing, and supplies a write voltage to the corresponding bit line BL in the memory cell array 106 via the column gating circuit 108.

The verify sensing amplifier circuit 112 senses the data in the memory cell MC in the memory cell array 106 via the column gating circuit 108, when verify reading is performed to determine whether writing has been performed up to a desired threshold voltage or more. The verify sensing amplifier circuit 112 outputs the data to the page buffer 109. For example, the verify sensing amplifier circuit 112 applies a predetermined verify voltage to the word line WL, and compares the cell current flowing through the bit line BL with the reference current flowing through the reference cell (not shown), to read the data from the memory cell MC.

As the verify reading is performed, the internal controller 114 compares the write data with the output data of the verify sensing amplifier circuit 112. If the write data matches the output data of the verify sensing amplifier circuit 112, the write data latched by the page buffer 109 is updated with data not to be written. If the write data does not match the output data, the data latched by the page buffer 109 is not updated, and is maintained as it is. The writing and the verify reading are repeatedly performed, so that writing can be continued only on the memory cells MC short of writing while no more writing is performed on the memory cells MC in which a sufficient amount of data has been written.

The command register 113 holds commands (such as a write command, a read command, and an erase command) input from an external control bus. The internal controller 114 receives a command from the command register 113, and generates a control signal for controlling each circuit in the NOR flash memory 100.

The row decoder 115 receives an internal address output from the address buffer 103, and selects the corresponding word line WL in the memory cell array 106. A write voltage, a read voltage, an erase voltage, or the like is applied to the word line WL selected by the row decoder 115, when an operation such as writing, reading, erasing, or the like is performed.

The column decoder 116 receives an internal address output from the address buffer 103, and selectively drives a column gate in the column gating circuit 108 in accordance with the internal address. Accordingly, the data in the memory cell MC connected to the selected bit line BL in the memory cell array 106 can be read into the read sensing amplifier circuit 107 or the verify sensing amplifier circuit 112.

The charge pumping circuit 117 serving as a booster circuit generates a high voltage (a write voltage, an erase voltage, or the like) in accordance with an operation such as writing, reading, erasing, or the like, and supplies the height voltage to the memory cell array 106, the write circuit 111, the row decoder 115, and the likes.

Based on the voltage obtained at the charge pumping circuit 117, the regulator circuit 118 generates and outputs the voltage to be supplied to the word line WL at the time of reading or writing of the memory cell MC, or to the control gate CG of the memory cell MC. The voltage generated at the regulator circuit 118 is supplied to the word line WL in the memory cell array 106 via the row decoder 115.

In the following, a multi-value data control method in accordance with this embodiment is described, with the NOR flash memory 100 of the above structure being taken as an example.

To reduce the above mentioned adjacency effect in a flash memory, it is necessary to minimize the variation of the threshold value of each adjacent memory cell after the threshold value of the memory cell MC on which writing is to be performed is adjusted. Therefore, a threshold value adjustment needs to be performed almost simultaneously in all the memory cells that cause an adjacency effect on one another.

In a NOR flash memory, the write unit (a 16-bit word unit, for example) is normally larger than the erase unit (a 128-Kbit block unit, for example). When excess writing is performed, erasing only on the data in the memory cell MC on which the excess writing is performed cannot be performed. Therefore, attention should be paid to excess writing, when a multi-value data adjustment is performed on the memory cells MC (when writing is performed on a memory cell).

Figure 2:
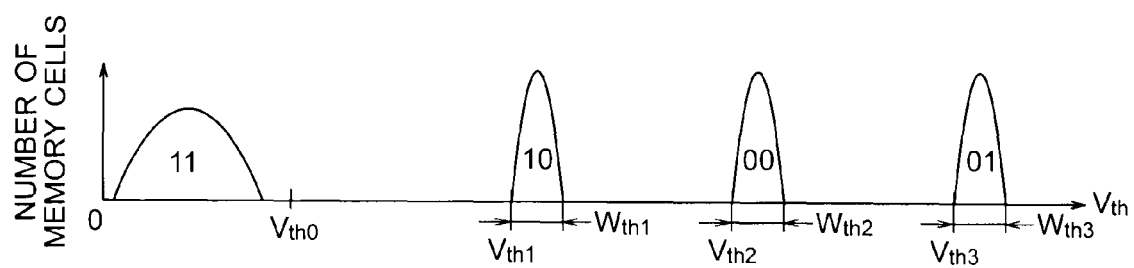
FIG. 2 is a schematic view showing a threshold value distribution of memory cells that can store multi-value data in accordance with the first embodiment.

FIG. 2 schematically shows the threshold value distribution of each state of memory cells to be controlled by the multi-value data control method in accordance with this embodiment. As shown in FIG. 2, the target threshold values (the verify voltages) $V_{th}$ of the states (10), (00), and (01) are represented by $V_{th1}$, $V_{th2}$, and $V_{th3}$, and the target widths $W_{th}$ of the threshold value distributions are represented by $W_{th1}$, $W_{th2}$, and $W_{th3}$.

More specifically, the threshold value observed after an adjustment is performed in a memory cell MC in the state (10) needs to exist between $V_{th1}$ and $V_{th1}+W_{th1}$. The threshold value observed after an adjustment is performed in a memory cell MC in the state (00) needs to exist between $V_{th2}$ and $V_{th2}+W_{th2}$. The threshold value observed after an adjustment is performed in a memory cell MC in the state (01) needs to exist between $V_{th3}$ and $V_{th3}+W_{th3}$. Also, as the read sensing amplifier circuit 107 determines each state at the time of data reading, the relationships, "$V_{th2}>V_{th1}+W_{th1}$" and "$V_{th3}>V_{th2}+W_{th2}$", are satisfied.

The memory cells on which a multi-value adjustment is to be performed are all in the erased state (11) prior to the multi-value adjustment. More specifically, the upper limit of the threshold value of each memory cell MC is $V_{th0}$ ($<V_{th1}$) or smaller, and the lower limit is 0V or more. This is because, in a case where the threshold value of each of the memory cells MC is lower than 0V (in an excessively erased state), current leaks from the bit lines BL when the word line WL voltage is 0V. The weak writing and the verify reading are repeatedly performed after data erasing, so that the threshold value of each of the memory cells MC in the erased state (11) is set between 0 and $V_{th0}$.

Figure 3:
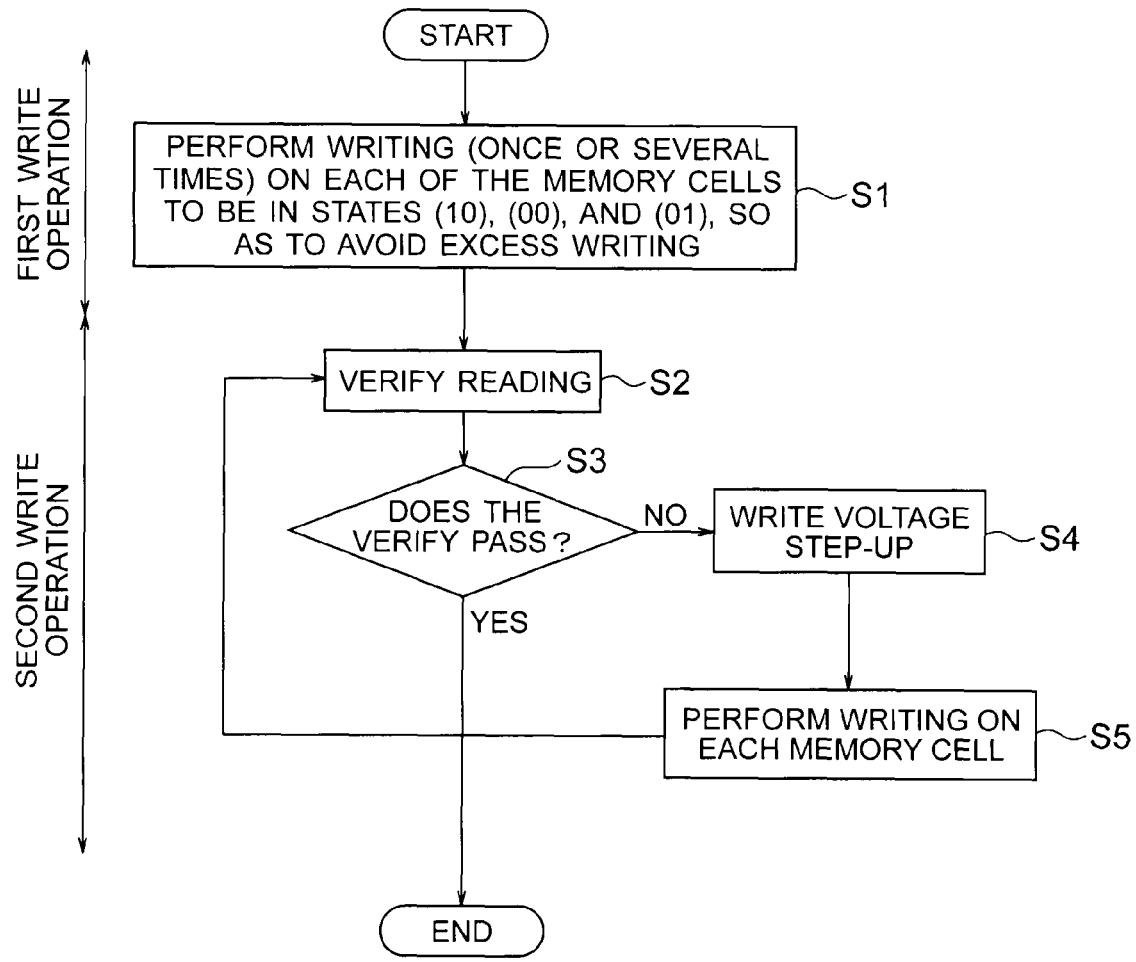
FIG. 3 is a flowchart showing the procedures of a multi-value data control method in accordance with the first embodiment.

FIG. 3 illustrates the multi-value data control method in accordance with this embodiment. In the multi-value data control method in accordance with this embodiment, two types of write methods (a first write operation and a second write operation) are defined with respect to the states (10), (00), and (01) that requires threshold value adjustment.

First, writing is performed on the memory cells MC in the first write operation. In the first write operation, writing is performed on the memory cells MC, without verify reading (see step S1 of FIG. 3). In the first write operation, a write voltage that does not cause "excess writing" is applied to the control gate CG of a memory cell MC via a word line WL selected by the row decoder 115. The memory cell MC is in one of the states (10), (00), and (01) after an adjustment.

A threshold value adjustment in the first write operation may be performed by applying a predetermined write voltage $V_{prg}$ suitable for each state to the word line WL only once, or applying a write voltage that increases by a predetermined step-up width $V_{step}$ to the word line WL several times. In either case, the write voltage does not cause excess writing. The step-up width $V_{step}$ may be set at different values for the respective sates (10), (00), and (01). The increase rate may be a constant rate or a variable rate.

Where "excess writing" is not caused, the upper limit of the threshold value of each of the memory cells MC in the first write operation is $V_{th3}+W_{th3}$ or smaller when the memory cell state after an adjustment is in the state (01), for example.

The threshold value adjustment in the first write operation is performed on all the memory cells that are to be put into the state (10), (00), or (01) after the adjustment among the memory cells that are write targets and are connected to the select word line WL. When a threshold value adjustment in one state is performed (when writing is performed), the memory cells MC that are connected to the same word line WL and are to be put into another state are unselected (0V is supplied to the drain regions D from the bit line BL).

It is preferable that the first write operation is first performed on the memory cells MC that are to be put into the state (01) with the highest threshold value after the adjustment. The first write operation is then performed on all the memory cells MC that are to be put into one of the states (00) and (10) after the adjustment. The first write operation is then performed on all the memory cells MC that are to be put into the other one of the states (00) and (10) (see FIG. 4(a)).

This is because, in the NOR flash memory 100, there are no problems even if excess writing due to an adjacency effect is caused in the memory cells MC that are to be put into the state (01) with the highest threshold value after the adjustment. Even if the distribution of the state (01) with the highest threshold value shifts toward the higher voltage side due to an adjacency effect, wrong data reading does not occur, since there is not a state having a higher threshold value than the state (01). Also, since the memory cells MC are connected in parallel to the bit lines BL in the NOR flash memory 100, there is no need to guarantee the ON state of each of the unselected memory cells as in a NAND flash memory. Accordingly, the margin for securing the cell current of the unselected memory cells MC does not need to be taken into consideration.

Figure 4:
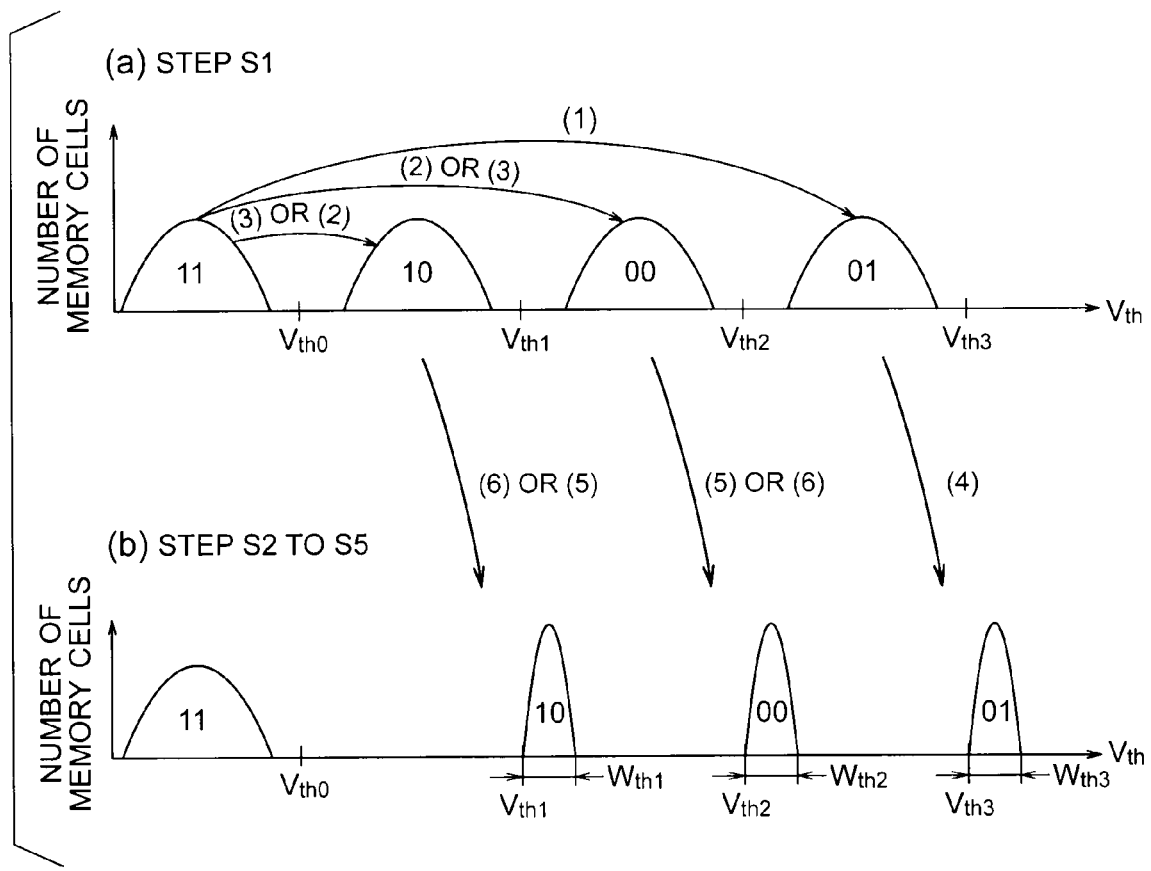
FIGS. 4(a) and 4(b) are schematic views showing the threshold value distributions of memory cells after the respective procedures of the multi-value data control method of the first embodiment are carried out.

The numbers shown in brackets in FIG. 4(a) indicate the preferred order of threshold value adjustment in the first write operation. In the first write operation, writing is performed without verify reading. Therefore, electrons are uniformly injected into the memory cells MC having relatively good write characteristics and the memory cells MC having relatively poor write characteristics, and the width of the threshold value distribution corresponding to each of the states is greatly widened (see FIG. 4(a)).

In a threshold value adjustment by the first write operation, the upper limit of the threshold voltage of each of the memory cells MC after the writing is made as high as possible, so that the period of times required for the later threshold value adjustment through the second write operation can be made shorter. Also, by performing the first write operation several times in a divided manner, a write current is restrained, and the number of memory cells on which writing is to be performed at once can be increased. Also, by skipping verify reading, the write time can be shortened.

Through the first write operation, the threshold values can be increased to the neighborhood of the target threshold values, with no excess writing being caused. However, the range of the threshold value of each state at the time when the first write operation is finished should be set appropriately, with the write characteristics of the memory cells MC and the required write time and the likes being taken into consideration. For example, the threshold value distribution of each state should be set under the target threshold value (the verify voltage) $V_{th}$ at the time when the threshold value adjustment through the first write operation is finished, as shown in FIG. 4(a).

Next, a threshold value adjustment through the second write operation is performed on each of the memory cells that are to be put into the state (10), (00), or (01) after the adjustment. In the second write operation, after writing is performed on a memory cell MC, verify reading is performed with respect to the target threshold value (the verify voltage) $V_{th}$ of the memory cell MC with the use of the verify sensing amplifier circuit 112. On the memory cells MC short of writing, which are the memory cells MC each having a threshold value lower than the target threshold value, additional writing is performed while the write voltage $V_{prg}$ to be applied to the word line WL selected by the row decoder 115 is increased by the predetermined step-up width $V_{step}$ (see steps S2 to S5 of FIG. 3).

The step-up width $V_{step}$ may be set at different values for the respective sates (10), (00), and (01). The increase rate may be a constant rate or a variable rate. The step-up width $V_{step}$ may be different values from those in the first write operation.

The additional writing and the verify reading are repeated until a sufficient amount of writing is performed. In this case, the write voltage to be first applied to the word line WL should be set at such a value that does not cause "excess writing" even in a memory cell MC with excellent write characteristics.

After the transition from the first write operation to the second write operation, verify reading is performed with the use of the verify sensing amplifier circuit 112 before the first writing is performed (see step S2 of FIG. 3). By doing so, further writing on the memory cells MC on which a sufficient amount of writing has been performed can be prevented.

After the verify reading from all the memory cells MC passes, and the threshold value adjustment through the second write operation is finished, the threshold value of each of the memory cells MC falls into the range of the target threshold value $V_{th}$ to the target threshold value $V_{th}$+the target width $W_{th}$. For example, if the state of a subject memory cell MC after the multi-value adjustment is (01), the threshold value falls into the range of $V_{th3}$ to $V_{th3}+W_{th3}$. If the state of the subject memory cell MC after the multi-value adjustment is (00), the threshold value falls into the range of $V_{th2}$ to $V_{th2}+W_{th2}$. If the state of the subject memory cell MC after the multi-value adjustment is (10), the threshold value falls into the range of $V_{th1}$ to $V_{th1}+W_{th1}$ (see FIG. 4(b)).

FIG. 4(b) is a schematic view showing the threshold value distribution of the memory cells MC in each state after the threshold value adjustment through the second write operation is completed. Like the first write operation, it is preferable that the second write operation is first performed on the memory cells MC that are to be put into the state (01) with the highest threshold value after the adjustment. The second write operation is then performed on all the memory cells MC that are to be put into one of the states (00) and (10) after the adjustment. The second write operation is then performed on all the memory cells MC that are to be put into the other one of the states (00) and (10).

The numbers shown in brackets in FIG. 4(b) indicate the preferred order of threshold value adjustment in the second write operation. This is because, in the NOR flash memory 100, there are no problems even if excess writing due to an adjacency effect is caused in the memory cells MC that are to be put into the state (01) with the highest threshold value after the adjustment.

As described above, in accordance with this embodiment, a threshold value adjustment is performed by the first write operation in which verify reading is not performed but writing is performed on the memory cells causing an adjacency effect on one another, so as to prevent excess writing. After that, a threshold value adjustment is performed by the second write operation in which verify reading is first performed, and additional writing and verify reading are performed on the memory cells MC short of writing, so as to prevent excess writing.

More specifically, in the first write operation, the threshold value distribution of the memory cells MC connected to one word line WL is caused to shift toward a position closer to the target threshold value of each state. By doing so, the adjacency effect to be caused when the threshold value adjustment through the second write operation performed to determine the final threshold value distribution can be reduced. Thus, the distribution of each threshold value of the memory cells MC can be narrowed, and the adjacent effect can be restricted.

In this embodiment, the first write operation is performed on all the memory cells MC that are to be put into the state (10), (00), or (01). After that, the second write operation is performed on all the memory cells MC that are to be put into the state (10), (00), or (01). However, the present invention is not limited to that. For example, the first write operation may be performed only on the memory cells MC in a certain state among the memory cells MC that are to be put into the state (10), (00), or (01). Also, the second write operation may be performed only on the memory cells MC in a certain state among the memory cells MC that are to be put into the state (10), (00), or (01). Further, the following modifications may be considered.

(First Modification)

First, the first write operation is performed on the memory cells MC that are to be put into the state (01), to form a threshold value distribution that is close to the target threshold value. Before the first write operation is performed on the state (10) or the state (00), the second write operation is performed on the memory cells MC that are to be put into the state (01). As a result, the threshold voltage of each of the memory cells MC that are to be put into the state (10) falls into the range of $V_{th1}$ to $V_{th1}+W_{th1}$.

The first write operation is then performed on the memory cells MC that are to be put into one of the states (10) and (00), and the second write operation is performed on those memory cells MC. The first write operation is next performed on the memory cells MC that are to be put into the other one of the states (10) and (00), and the second write operation is performed on those memory cells MC.

As for the distribution of the state (01), the threshold voltage is allowed to vary to a certain degree due to an adjacency effect, as described above. Accordingly, the distribution of each threshold value of the memory cells MC can be narrowed, and the adjacency effect can be reduced by the method of this modification.

(Second Modification)

First, the first write operation is performed on the memory cells MC that are to be put into the state (01), to form a threshold value distribution that is close to the target threshold value. The second write operation is then performed on the memory cells MC that are to be put into the state (01). As a result, the threshold voltage of each of the memory cells MC that are to be put into the state (10) falls into the range of $V_{th1}$ to $V_{th1}+W_{th1}$.

The second write operation is then performed on the memory cells MC that are to be put into one of the states (10) and (00), with the first write operation being not performed on those memory cells MC. The second write operation is next performed on the memory cells MC that are to be put into the other one of the states (10) and (00), with the first write operation being not performed on those memory cells MC.

As for the distribution of the state (01), the threshold voltage is allowed to vary to a certain degree due to an adjacency effect, as described above. Accordingly, the distribution of each threshold value of the memory cells MC can be narrowed, and the adjacency effect can be reduced by the method of this modification.

Second Embodiment

Next, a method for controlling multi-value data in a nonvolatile semiconductor memory device in accordance with a second embodiment of the present invention is described. This embodiment may be applied to the NOR flash memory 100 of the first embodiment.

In the first write operation of the first embodiment, verify reading is not performed, and accordingly, the threshold value distributions of the memory cells MC corresponding to the respective states (10), (00), and (01) are wide. In a case where the wide threshold value distributions are narrowed by the second write operation, the memory cells MC that have threshold values far away from the target threshold values after the end of the writing through the first writing operation each have a wide threshold value variation during the threshold value adjustment through the second write operation.

As a result, the threshold value adjustment through the second write operation performed on the memory cells MC that have threshold values close to the target threshold values after the end of the writing through the first write operation is completed in a short time, while additional writing and verify reading are still repeated on the memory cells MC that have threshold values far away from the target values after the end of the writing through the first write operation. Therefore, a very large adjacency effect is caused in the memory cells MC that have threshold values close to the target threshold values after the end of the writing through the first write operation, as the threshold value adjustment through the second write operation on those memory cells MC is finished in a short time.

To counter this problem, the threshold value adjustment in the second write operation is divided into two stages in this embodiment. More specifically, in the threshold value adjustment through the second write operation, a threshold value adjustment is first performed on each of the states (10), (00), and (01) with the use of a threshold voltage (a low verify voltage) $V_{Lth}$ lower than the target threshold value (the verify voltage) $V_{th}$, to form a first multi-value distribution. After that, a threshold value adjustment is again performed on each of the states (10), (00), and (01) with the use of the ultimate target threshold value $V_{th}$, to form a second multi-value distribution.

Figure 5:
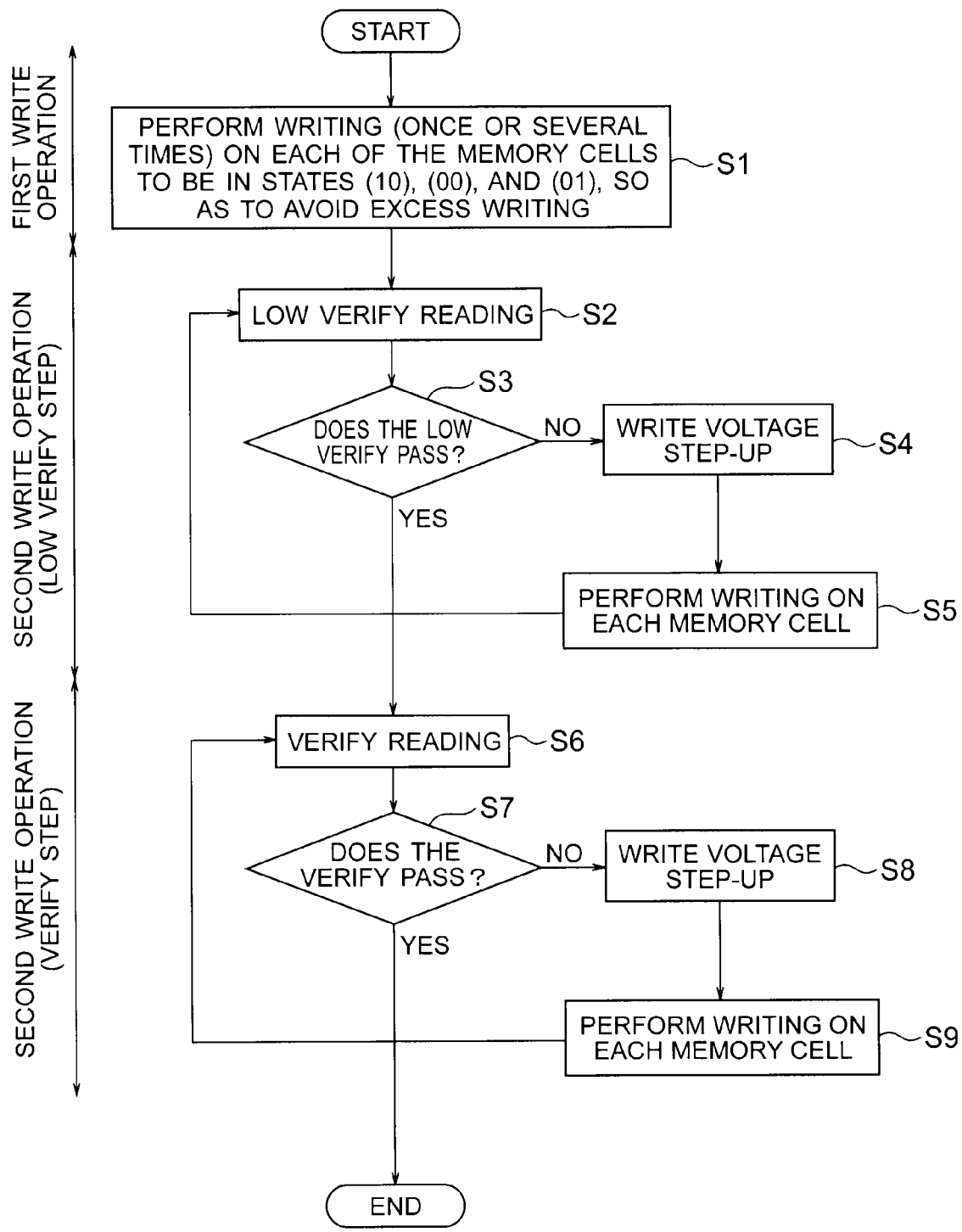
FIG. 5 is a flowchart showing the procedures of a multi-value data control method in accordance with a second embodiment of the present invention.
Figure 6:
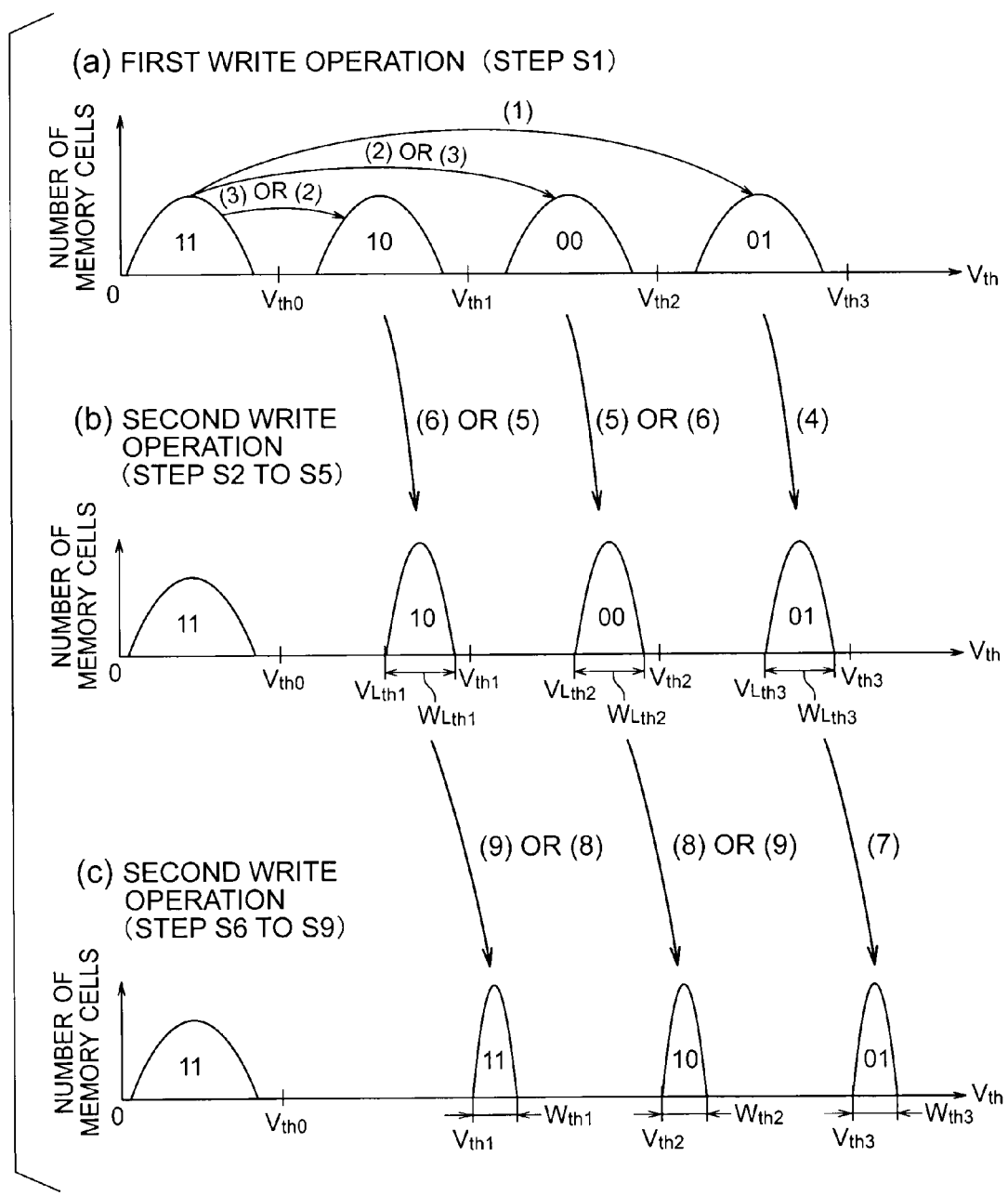
FIGS. 6(a) to 6(c) are schematic views showing the threshold value distributions of memory cells after the respective procedures of the multi-value data control method of the second embodiment.

In the second write operation of this embodiment, the threshold value adjustment performed to form the first multi-value distribution is referred to as the low verify step, and the threshold value adjustment performed to form the second multi-value distribution is referred to as the verify step. Referring now to FIGS. 5 to 6(c), the threshold value control method in accordance with this embodiment is described.

FIG. 5 is a flowchart showing the multi-value data threshold value adjustment in accordance with this embodiment. FIGS. 6(a), 6(b), and 6(c) schematically show the threshold value distributions of the respective states of the memory cells MC observed in a case where the write sequence shown in FIG. 5 is implemented.

As shown in FIG. 6(a), by the multi-value data control method of this embodiment, writing through the first write operation is first performed on all the memory cells MC that are to be put into the state (10), (00), or (01) after the adjustment, as in the first embodiment. As in the first embodiment, the threshold value adjustment through the first write operation may be performed by applying a predetermined write voltage to the word lines WL only once, or by applying a write voltage that increases by a predetermined step-up width to the word lines WL several times (see step S1 of FIG. 5).

As in the first embodiment, in the threshold value adjustment through the first write operation, it is preferable that writing is first performed on the memory cells MC that are to be put into the state (01) with the highest threshold value after the adjustment. Writing is then performed on all the memory cells MC that are to be put into one of the states (00) and (10) after the adjustment. After that, writing is performed on all the memory cells MC that are to be put into the other one of the states (00) and (10) after the adjustment. The numbers shown in brackets in FIG. 6(a) indicate the preferred order of threshold value adjustment in the first write operation.

After that, as shown in FIG. 6(b), the threshold value adjustment through the second write operation (the low verify step) is performed to form the first multi-value distribution (see steps S2 to S5 of FIG. 5). The writing performed in the low verify step differs from the writing in the first embodiment, and the voltages to be applied to the word lines WL at the time of verify reading are set at first values (low verify voltages) $V_{Lth1}$, $V_{Lth2}$, and $V_{Lth3}$, which are lower than the target threshold values $V_{th1}$, $V_{th2}$, and $V_{th3}$ of the respective states.

The verify reading and the additional writing with the use of the first values $V_{Lth1}$, $V_{Lth2}$, and $V_{Lth3}$ are repeated to perform the threshold value adjustment on each state. The verify reading performed by setting a lower value than the ultimate target voltage (the verify voltage) will be hereinafter referred to as the low verify reading.

In the first multi-value distribution, second values $W_{Lth1}$, $W_{Lth2}$, and $W_{Lth3}$ to be the target values with respect to the respective first values are set. The threshold values of the memory cells MC after the formation of the first multi-value distribution fall into the range of the first value $V_{Lth}$ to the first value $V_{Lth}$+the second value $W_{Lth}$ for each of the states.

In the low verify step, low verify reading is performed with respect to the target threshold value of a subject memory cell MC, and additional writing and low verify reading are performed on the memory cells MC short of writing or the memory cells MC having threshold voltages not higher than the target threshold value, while the voltage to be applied to the word line WL is increased by a predetermined step-up width. The additional writing and verify reading are repeated until a sufficient amount of writing is performed.

In this embodiment, after the transition from the first write operation to the low verify step of the second write operation, low verify reading is performed prior to the first writing (see step S2 of FIG. 5). Accordingly, further writing on the memory cells MC on which a sufficient amount of writing has been performed can be prevented. However, the first verify reading may be skipped if the possibility of excess writing is reasonably low, since the threshold voltages in the first multi-value distribution are set lower than the final threshold voltages in the second multi-value distribution.

In the first multi-value distribution formed by carrying out the low verify step, the threshold voltage of the state (01) is controlled to fall into the range of $V_{Lth1}$ to $V_{Lth1}+W_{Lth1}$, the threshold voltage of the state (00) is controlled to fall into the range of $V_{Lth2}$ to $V_{Lth2}+W_{Lth2}$, and the threshold voltage of the state (10) is controlled to fall into the range of $V_{Lth3}$ to $V_{Lth3}+W_{Lth3}$.

Here, the threshold voltages of the respective states in the first multi-value distribution can be set to satisfy the conditions: $V_{Lth1}+W_{Lth1}<V_{th1}$, $V_{Lth2}+W_{Lth2}<V_{th2}$, and $V_{Lth3}+W_{Lth3}<V_{th3}$. If the differences in threshold voltage between the first multi-value distribution and the second multi-value distribution are small, the write time in the later verify step can be shortened. If the differences in threshold voltage between the first multi-value distribution and the second multi-value distribution are large to some degree, the possibility of excess writing can be reduced.

As in the first embodiment, in the threshold value adjustment through the low verify step, it is preferable that writing is first performed on the memory cells MC that are to be put into the state (01) with the highest threshold value after the adjustment. Writing is then performed on all the memory cells MC that are to be put into one of the states (00) and (10) after the adjustment. Writing is next performed on all the memory cells MC that are to be put into the other one of the states (00) and (10). The numbers shown in brackets in FIG. 6(b) indicate the preferred order of threshold value adjustment in the second write operation.

After that, as shown in FIG. 6(c), the threshold value adjustment through the second write operation (the verify step) is performed to form the second multi-value distribution (the final multi-value distribution) (see steps S6 to S9 of FIG. 5). Verify reading is performed with respect to the target threshold value of the subject memory cell MC, and additional writing and verify reading are performed on the memory cells MC short of writing or the memory cells MC having threshold voltages not higher than the target threshold value, while the voltage $V_{prg}$ to be applied to the word line WL is increased by a predetermined step-up width $V_{step}$.

The additional writing and verify reading are repeated until a sufficient amount of writing is performed. In the second multi-value distribution formed by carrying out the verify step, the threshold values of the memory cells MC in the respective states exist within the range of the target threshold value $V_{th}$ to the target threshold value $V_{th}$+the target threshold width $W_{th}$, as in the threshold value distribution lastly formed in the first embodiment.

More specifically, if the state of the subject memory cell MC after the multi-value adjustment is (01), the threshold values exist in the range of $V_{th3}$ to $V_{th3}+W_{th3}$. If the state of the subject memory cell MC after the multi-value adjustment is (00), the threshold values exist in the range of $V_{th2}$ to $V_{th2}+W_{th2}$. If the state of the subject memory cell MC after the multi-value adjustment is (10), the threshold values exist in the range of $V_{th1}$ to $V_{th1}+W_{th1}$ (see FIG. 6(c)).

After the transition from the low verify step of the second write operation to the verify step of the second write operation, verify reading is performed prior to the first writing is performed (see step S6 of FIG. 5). Accordingly, further writing on the memory cells MC on which a sufficient amount of writing has been performed can be prevented.

As in the first embodiment, in the threshold value adjustment through the verify step, it is preferable that writing is first performed on the memory cells MC that are to be put into the state (01) with the highest threshold value after the adjustment. Writing is then performed on all the memory cells MC that are to be put into one of the states (00) and (10) after the adjustment. Writing is next performed on all the memory cells MC that are to be put into the other one of the states (00) and (10). The numbers shown in brackets in FIG. 6(c) indicate the preferred order of threshold value adjustment in the second write operation.

As described above, in accordance with this embodiment, the second multi-value distribution (the final multi-value distribution) is formed after the first multi-value distribution is formed. Accordingly, the threshold value variation in each of the memory cells MC at the time of the formation of the second multi-value distribution can be reduced, and the adjacency effect can be restrained.

In this embodiment, the threshold values at the time of the formation of the first multi-value distribution are set lower than the target threshold values. Accordingly, the adjacency effect caused at the time of the formation of the first multi-value distribution can be absorbed by the difference in threshold value, and the formation of the second multi-value distribution is not affected by the adjacency effect.

As for the write voltage $V_{prg}$ to be applied to the word lines WL when writing for the formation of the second multi-value distribution is started, it is preferable that a voltage lower than the voltage applied to the word lines WL at the end of the formation of the first multi-value distribution is first applied, so that excess writing is not performed on the memory cells MC having excellent write characteristics.

In this embodiment, after the first write operation is performed on all the memory cells MC that are to be put into the state (10), (00), or (01) after the adjustment, the low verify step of the second write operation is carried out on all the memory cells MC that are to be put into the state (10), (00), or (01) after the adjustment. The verify step of the second write operation is then carried out on all the memory cells MC that are to be put into the state (10), (00), or (01) after the adjustment. However, the present invention is not limited to that.

For example, the first write operation may be performed only on the memory cells MC in a certain state among the memory cells MC that are to be put into the state (10), (00), or (01). Also, the low verify step of the second write operation may be carried out only on the memory cells MC in a certain state among the memory cells MC that are to be put into the state (10), (00), or (01). Likewise, the verify step of the second write operation may be carried out only on the memory cells MC in a certain state among the memory cells MC that are to be put into the state (10), (00), or (01).

As for the distribution of the state (01), the threshold voltage is allowed to vary to a certain degree due to an adjacency effect, as mentioned in the first embodiment. For example, the threshold voltage of the state (01) may be first adjusted (the first write operation, the low verify step of the second write operation, and the verify step of the second write operation may be carried out on the memory cells MC that are to be put into the state (01)). After that, the threshold value of the state (10) or (00) may be adjusted. In such a case, the low verify step may be skipped in the threshold value adjustment performed on the memory cells MC that are to be put into the state (01).

Whether to perform the first write operation, whether to carry out the low verify step of the second write operation, and whether to carry out the verify step of the second write operation are determined for the respective states. In this manner, the same various modifications as those of the first embodiments may be made.

Third Embodiment

Figure 7:
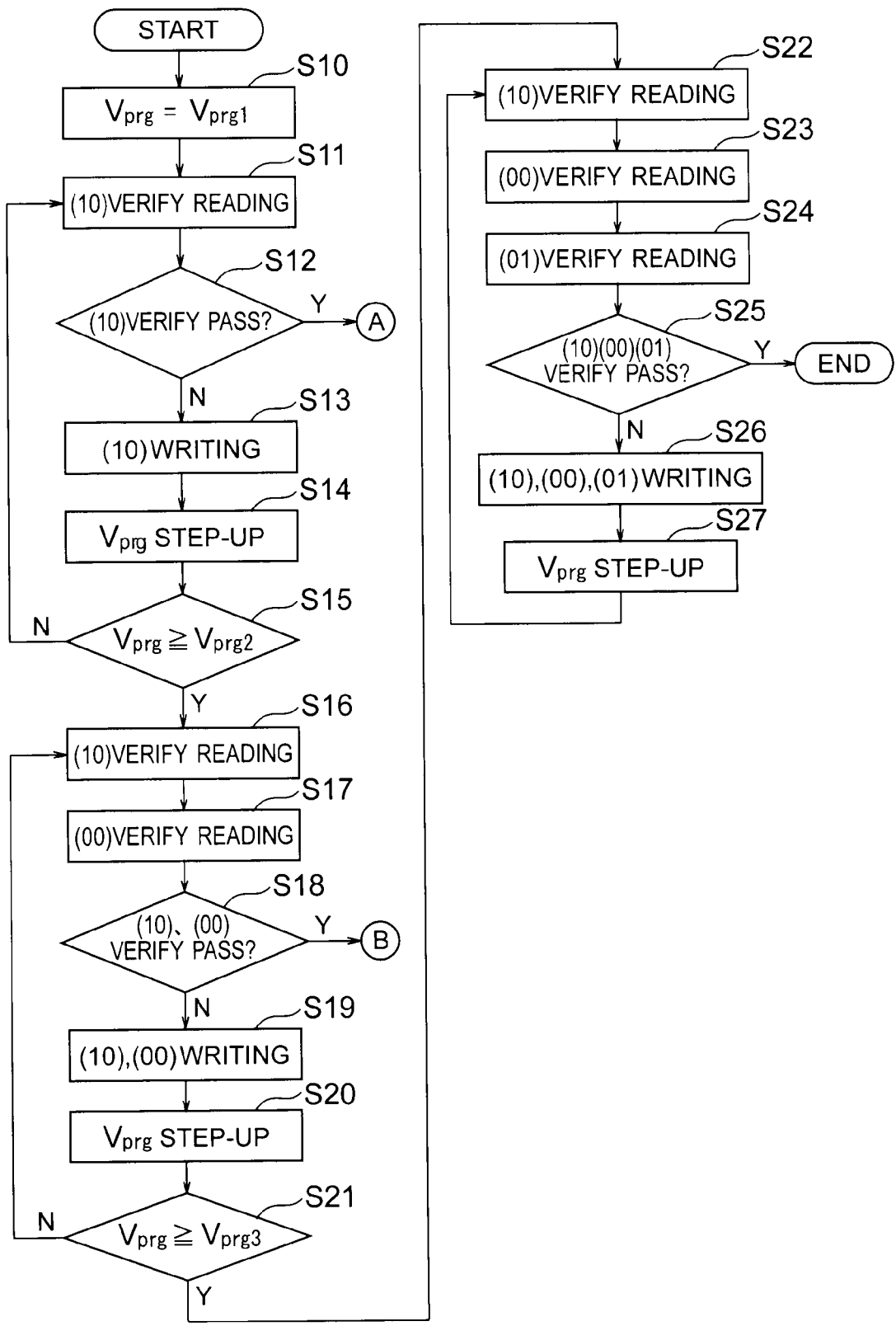
FIG. 7 is a flowchart showing the procedures of a multi-value data control method in accordance with a third embodiment of the present invention.
Figure 8:
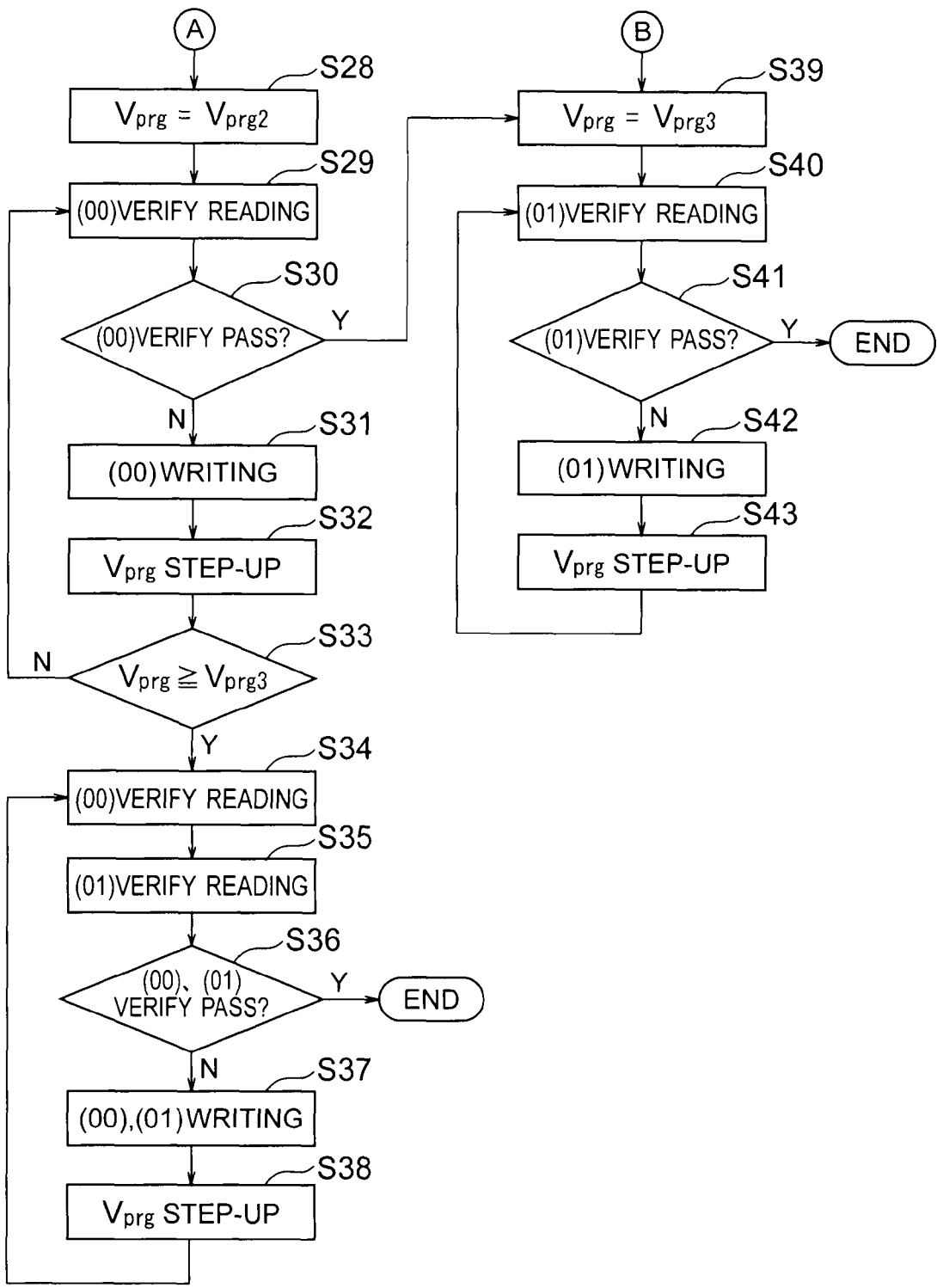
FIG. 8 is a flowchart showing the procedures of the multi-value data control method in accordance with the third embodiment.
Figure 9:
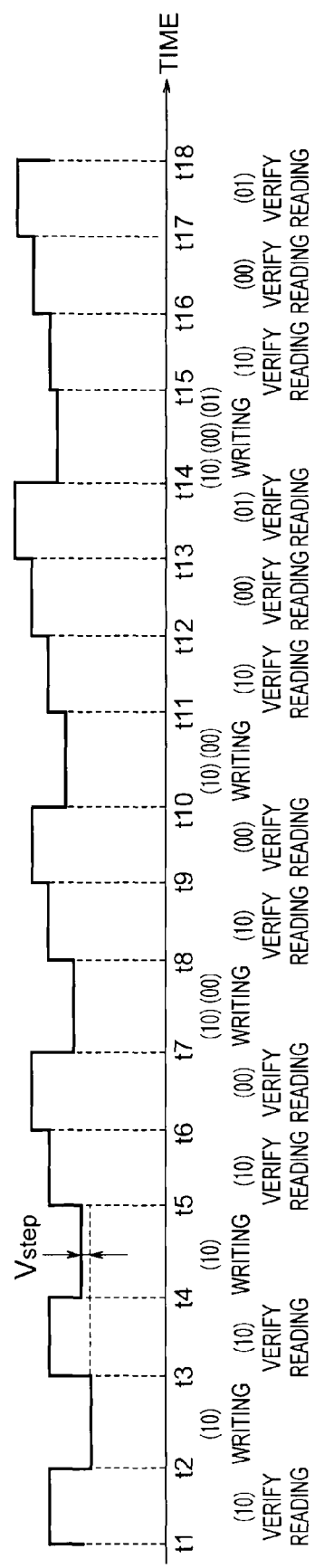
FIG. 9 is a waveform chart of a voltage to be applied to the word lines by the multi-value data control method of the third embodiment.

Referring now to FIGS. 7 to 9, a method for controlling multi-value data in a nonvolatile semiconductor memory device in accordance with a third embodiment of the present invention is described. FIGS. 7 and 8 are flowcharts showing the procedures in the multi-value data control method in accordance with this embodiment. FIG. 9 is a waveform chart of the voltage to be applied to the word lines WL by the multi-value data control method in accordance with this embodiment. This embodiment may be implemented in the NOR flash memory 100 of the first embodiment, for example.

In the following description, the write voltage $V_{prg}$ to be applied to the select word line WL at the time of writing is set at the write start voltage $V_{prg1}$ of the state (10), the write start voltage $V_{prg2}$ of the state (00), and the write start voltage $V_{prg3}$ of the state (01). Here, the relationship, $V_{prg1}<V_{prg2}<V_{prg3}$, is established.

By the multi-value data control method in accordance with this embodiment, the write voltage $V_{prg}$ is first set at the write start voltage $V_{prg1}$ (step S10 of FIG. 7). Verify reading (time t1 to t2) is then performed on all the memory cells MC that are to be put into the state (10) with the lowest threshold value after the adjustment among the memory cells that are to have writing performed thereon and are connected to the select word line WL (step S11 of FIG. 7).

In the next write operation (step S13), the memory cells MC that are determined in step S12 to have a verify pass as a result of the verify reading, or the memory cells MC on which writing has been performed up to a threshold voltage equal to or higher than the verify voltage $V_{th1}$, are excluded from the memory cells MC on which writing is to be performed. In step S13, writing (time t2 to t3) is performed on the memory cells MC that are determined not to have a verify pass as a result of the verify reading, or the memory cells MC in which the threshold voltage has not reached the verify voltage $V_{th1}$. If all the memory cells MC that are to be put into the state (10) are determined to have a verify pass in step S12, the operation moves on to step S28 of FIG. 8.

After the write voltage $V_{prg}$ is increased (stepped up) (step S14), a check is made to determine, in step S15, whether the write voltage $V_{prg}$ is higher than the write start voltage $V_{prg2}$ of the state (00) having the second lowest threshold value after the adjustment. If the write voltage $V_{prg}$ is not higher than the write start voltage $V_{prg2}$, the operation returns to step S11, and the verify reading (time t3 to t4) is again performed.

In this manner, the verify reading (time t1 to t2, and time t3 to t4) and the writing (time t2 to t3) are repeated until all the memory cells CM to be put into the state (10) are determined to have a verify pass, or the write voltage $V_{prg}$ becomes equal to or higher than the write start voltage $V_{prg2}$ for the first time (see steps S11 to S15 of FIG. 7).

The write voltage $V_{prg}$ to be applied to the word line WL in each write operation is a larger value than the voltage applied to the word line WL in the previous write operation by $V_{step}$ (the step-up width). The step-up voltage $V_{step}$ may have a constant value or a variable value. For example, the write voltage $V_{prg}$ to be applied to the word line WL during the time between t2 and t3 is $V_{prg1}+V_{step}$. Hereinafter, $V_{prg}$ is described as a constant value.

While the verify reading and the writing are repeated on the memory cells MC to be put into the state (10), verify reading of the state (10) and verify reading of the state (00) are performed in this order (see steps S16 and S17 of FIG. 7, time t5 to t6 and time t6 to t7 of FIG. 9), if the write voltage $V_{prg}$ to be applied to the word line WL becomes equal to or higher than the write start voltage $V_{prg2}$ for the first time (time t5). After that, in step S18, a check is made whether the verify has passed.

If all the memory cells MC to be put into the states (10) and (00) are determined in step S18 to have a verify pass as a result of the verify reading, the operation moves on to step S39 of FIG. 8. On the other hand, in step S19, writing is performed simultaneously on the memory cells MC that are to be put into the state (10) and have not had the threshold voltage reaching the verify voltage $V_{th1}$, and the memory cells MC that are to be put into the state (00) and have not had the threshold voltage reading the verify voltage $V_{th2}$ (see step S19 of FIG. 7, time t7 to t8 of FIG. 9).

After the write voltage $V_{prg}$ is increased (step S20), a check is made to determine, in step S21, whether the write voltage $V_{prg}$ is higher than the write start voltage $V_{prg3}$ of the state (01) having the highest threshold value after the adjustment. If the write voltage $V_{prg}$ is not higher than the write start voltage $V_{prg3}$, the operation returns to step S16, and the verify reading (time t8 to t9, and time t9 to t10) is again performed.

In this manner, the verify reading (time t5 to t6, time t6 to t7, time t8 to t9, and time t9 to t10) and the writing (time t7 to t8, and time t10 to t11) are repeated until all the memory cells CM to be put into the states (10) and (00) are determined to have a verify pass, or the write voltage $V_{prg}$ becomes equal to or higher than the write start voltage $V_{prg3}$ for the first time (see steps S16 to S21 of FIG. 7).

While the verify reading and the writing are repeated on the memory cells MC to be put into the states (10) and (00), verify reading of the state (10), verify reading of the state (00), and verify reading of the state (01) are performed in this order (see steps S22, S23, and S24 of FIG. 7, time t11 to t12, time t12 to t13, and time t13 to t14 of FIG. 9), if the write voltage $V_{prg}$ to be applied to the word line WL becomes equal to or higher than the write start voltage $V_{prg3}$ for the first time (time t11). After that, in step S25, a check is made whether the verify has passed.

If all the memory cells MC to be put into the states (10), (00), and (01) are determined in step S25 to have a verify pass as a result of the verify reading, the threshold value adjustment in the memory cells that are to have writing performed thereon and are connected to the select word line WL. On the other hand, in step S26, writing is performed simultaneously on the memory cells MC that are determined not to have a verify pass, that is, that are to be put into the state (10) and have not had the threshold voltage reaching the verify voltage $V_{th1}$, the memory cells MC that are to be put into the state (00) and have not had the threshold voltage reading the verify voltage $V_{th2}$, and the memory cells MC that are to be put into the state (01) and have not had the threshold voltage reading the verify voltage $V_{th3}$ (see step S26 of FIG. 7, time t14 to t15 of FIG. 9).

After the write voltage $V_{prg}$ is increased (step S27), the operation returns to step S22, and the verify reading (time t15 to t16, time t16 to t17, and time t17 to t18) is again performed.

In this manner, the verify reading (time t11 to t12, time t12 to t13, time t13 to t14, time t15 to t16, time t16 to t17, and time t17 to t18) and the writing (time t14 to t15) are repeated until all the memory cells CM to be put into the states (10), (00), and (01) are determined to have a verify pass (see steps S22 to S27 of FIG. 7).

If all the memory cells MC to be put into the state (10) have a verify pass in step S12 of FIG. 7, the operation moves on to step S28 of FIG. 8, and the write voltage $V_{prg}$ is set at the write start voltage $V_{prg2}$. Verify reading is then performed on all the memory cells MC that are to be put into the state (00) after the adjustment among the memory cells that are to have writing performed thereon and are connected to the select word line WL (step S29 of FIG. 8).

In the next write operation (step S31), the memory cells MC that are determined in step S30 to have a verify pass as a result of the verify reading, or the memory cells MC on which writing has been performed up to a threshold voltage equal to or higher than the verify voltage $V_{th2}$, are excluded from the memory cells MC on which writing is to be performed. In step S31, writing is performed on the memory cells MC that are determined not to have a verify pass as a result of the verify reading, or the memory cells MC in which the threshold voltage has not reached the verify voltage $V_{th2}$. If all the memory cells MC that are to be put into the state (00) are determined to have a verify pass in step S30, the operation moves on to step S39 of FIG. 8.

After the write voltage $V_{prg}$ is increased (step S32), a check is made to determine, in step S33, whether the write voltage $V_{prg}$ is higher than the write start voltage $V_{prg3}$ of the state (01). If the write voltage $V_{prg}$ is not higher than the write start voltage $V_{prg3}$, the operation returns to step S29, and the verify reading is again performed.

In this manner, the verify reading and the writing are repeated until all the memory cells CM to be put into the states (00) and (01) are determined to have a verify pass, or the write voltage $V_{prg}$ becomes equal to or higher than the write start voltage $V_{prg3}$ for the first time (see steps S29 to S33 of FIG. 8). While the verify reading and the writing are repeated, verify reading of the state (00) and verify reading of the state (01) are performed in this order (see steps S34 and S35 of FIG. 8), if the write voltage $V_{prg}$ to be applied to the word line WL becomes equal to or higher than the write start voltage $V_{prg3}$ for the first time. After that, in step S36, a check is made whether the verify has passed.

If the verify is determined in step S36 to have passed as a result of the verify reading, the threshold value adjustment on the memory cells that are to have writing performed thereon and are connected to the select word line WL is ended. On the other hand, in step S37, writing is performed simultaneously on the memory cells MC that are determined not to have a verify pass, that is, the memory cells MC that are to be put into the state (00) and have not had the threshold voltage reaching the verify voltage $V_{th2}$, and the memory cells MC that are to be put into the state (01) and have not had the threshold voltage reading the verify voltage $V_{th3}$.

After the write voltage $V_{prg}$ is increased (step S38), the operation returns to step S34, and the verify reading (time t15 to t16, time t16 to t17, and time t17 to t18) is again performed.

In this manner, the verify reading and the writing are repeated until all the memory cells CM to be put into the states (00) and (01) are determined to have a verify pass (see steps S34 to S38 of FIG. 8).

If all the memory cells MC to be put into the states (10) and (00) have a verify pass in step S18 of FIG. 7, or if all the memory cells MC to be put into the state (00) have a verify pass in step S30 of FIG. 8, the operation moves on to step S39 of FIG. 8, and the write voltage $V_{prg}$ is set at the write start voltage $V_{prg3}$. Verify reading is then performed on all the memory cells MC that are to be put into the state (01) after the adjustment among the memory cells that are to have writing performed thereon and are connected to the select word line WL (step S40 of FIG. 8).

In the next write operation (step S42), the memory cells MC that are determined in step S41 to have a verify pass as a result of the verify reading, or the memory cells MC on which writing has been performed up to a threshold voltage equal to or higher than the verify voltage $V_{th3}$, are excluded from the memory cells MC on which writing is to be performed, and the operation is ended. In step S42, writing is performed on the memory cells MC that are determined not to have a verify pass as a result of the verify reading, or the memory cells MC in which the threshold voltage has not reached the verify voltage $V_{th3}$. After the write voltage $V_{prg}$ is increased (step S43), the operation returns to step S40, and the verify reading is again performed.

In this manner, the verify reading and the writing are repeated until all the memory cells MC to be put into the state (01) have a verify pass in step S41 (see steps S40 to S43 of FIG. 8).

Although not shown clearly in FIGS. 7 to 9, while the writing and the verify reading are repeated on the memory cells MC to be put into the state (10), the memory cells MC to be put into the state (00), and the memory cells MC to be put into state (01), writing is performed on the memory cells MC to be put into the state (01) and the memory cells MC to be put into the state (10) in which writing is not sufficient, or on the memory cells MC to be put into the state (00), if there are no longer any memory cells MC to be put into state (10) determined to have insufficient writing performed thereon, or if there are no longer any memory cells MC to be put into the state (00). In this case, the verify reading for the state (10) and the state (00) may be skipped.

If there are no longer any memory cells MC to be put into the state (01) determined to have insufficient writing performed thereon, and there still remain the memory cells MC to be put into the state (10) determined to have insufficient writing performed thereon or the memory cells MC to be put into the state (00) as a result of the verify reading, writing is performed only on the memory cells MC to be put into the state (10) or the memory cells MC to be put into the state (00). In this case, the verify reading for the state (10) or the state (00) may be skipped.

In this manner, all the memory cells MC that are to have writing performed thereon, are connected to the select word line WL, and are to be put into the state (10), the state (00), and the state (01) are lastly determined to have sufficient writing performed thereon as a result of the verify reading, and the write operation is ended. For example, where a predetermined write time has passed since the write start, or where the write voltage has been increased (stepped up) a predetermined number of times, the write operation can of course be suspended, as the write is determined to have failed.

As described above, in this embodiment, the writing is started from the memory cells MC to be put into the state (10) with the lowest threshold value, and then moves on to the memory cells MC to be put into the state (00) and to the memory cells MC to be put into the state (01), while the write voltage is increased. As the writing and the verify reading are repeated while the write voltage is increased, the write voltage becomes equal to the write start potential for the memory cells MC to be put into the state having the threshold value of the next adjustment or the state (00), for example. Accordingly, writing can be performed simultaneously on the memory cells MC to be put into the state (00) as well as on the memory cells MC to be put into the state (10) not having passed the verify reading. Thus, the write time can be shortened.

If the write characteristics of the memory cells MC are good, and the writing for the state (10) is completed before the write voltage $V_{prg}$ reaches the write start voltage $V_{prg2}$ of the state (00) with the second highest threshold value, the write voltage $V_{prg}$ may be set at the write start voltage $V_{prg2}$ of the state (00), and the writing may be started. When the write voltage $V_{prg}$ reaches the write start voltage $V_{prg3}$ of the state (01) after the start of the writing for the state (00), the writing for the state (00) and the state (01) may be started.

If the write characteristics of the memory cells MC are good, and the writing for the state (00) is completed before the write voltage $V_{prg}$ reaches the write start voltage $V_{prg3}$ of the state (01) with the highest threshold value, the write voltage $V_{prg}$ may be set at the write start voltage $V_{prg3}$ of the state (01), and the writing may be started.

The multi-value data control method in accordance with this embodiment may be combined with the first embodiment or the second embodiment. Accordingly, the multi-value data control method in accordance with this embodiment may be implemented in the second write operation in accordance with the first embodiment, or in the second write operation in accordance with the second embodiment. In the second embodiment, this embodiment may be applied to both the low verify step and the verify step, or may be applied only to one of the two steps.

As described above, in accordance with this embodiment, writing is simultaneously performed on the memory cells that are connected to the select word line WL to have writing performed thereon, and are adjusted to have several threshold value states. Accordingly, the write time can be shortened.

In this embodiment, the operation is started from the state (10) with the lowest threshold value, and gradually moves on to higher threshold values. However, the following multi-value data control method may be implemented as a modification of this embodiment.

(First Modification)

First, writing and verify reading are repeatedly performed on the memory cells MC to be put into the state (01) with the highest threshold value for adjustment, so as to complete the threshold value adjustment on the memory cells MC to be put into the state (01). After that, writing and verify reading are repeatedly performed on the memory cells MC to be put into the state (10) with the lowest threshold value, as in this embodiment.

If the write voltage $V_{prg}$ becomes equal to the write start voltage $V_{prg2}$ of the state (00) with the next threshold value, the writing and the verify reading are repeatedly performed on the memory cells MC to be put into the state (00) as well as on the memory cells MC to be input into the state (10) not having passed the verify reading.

The repetitive writing is continued until there are no longer any memory cells MC to be put into the state (10) not having passed the verify reading. After that, the writing and the verify reading are repeatedly performed on the memory cells MC to be put into the state (00).

By the multi-value data control method in accordance with this modification, the write time can be shortened as in this embodiment. Also, in this modification, a desired distribution is formed by performing a threshold value adjustment first on the memory cells MC to be put into the state (01) with the highest threshold value. The threshold value adjustment is then performed on the memory cells MC to be put into the states with the other threshold values. Thus, the adjacency effect on the memory cells MC to be input into the states (10) and (00) can be reduced.

Fourth Embodiment

Figure 10:
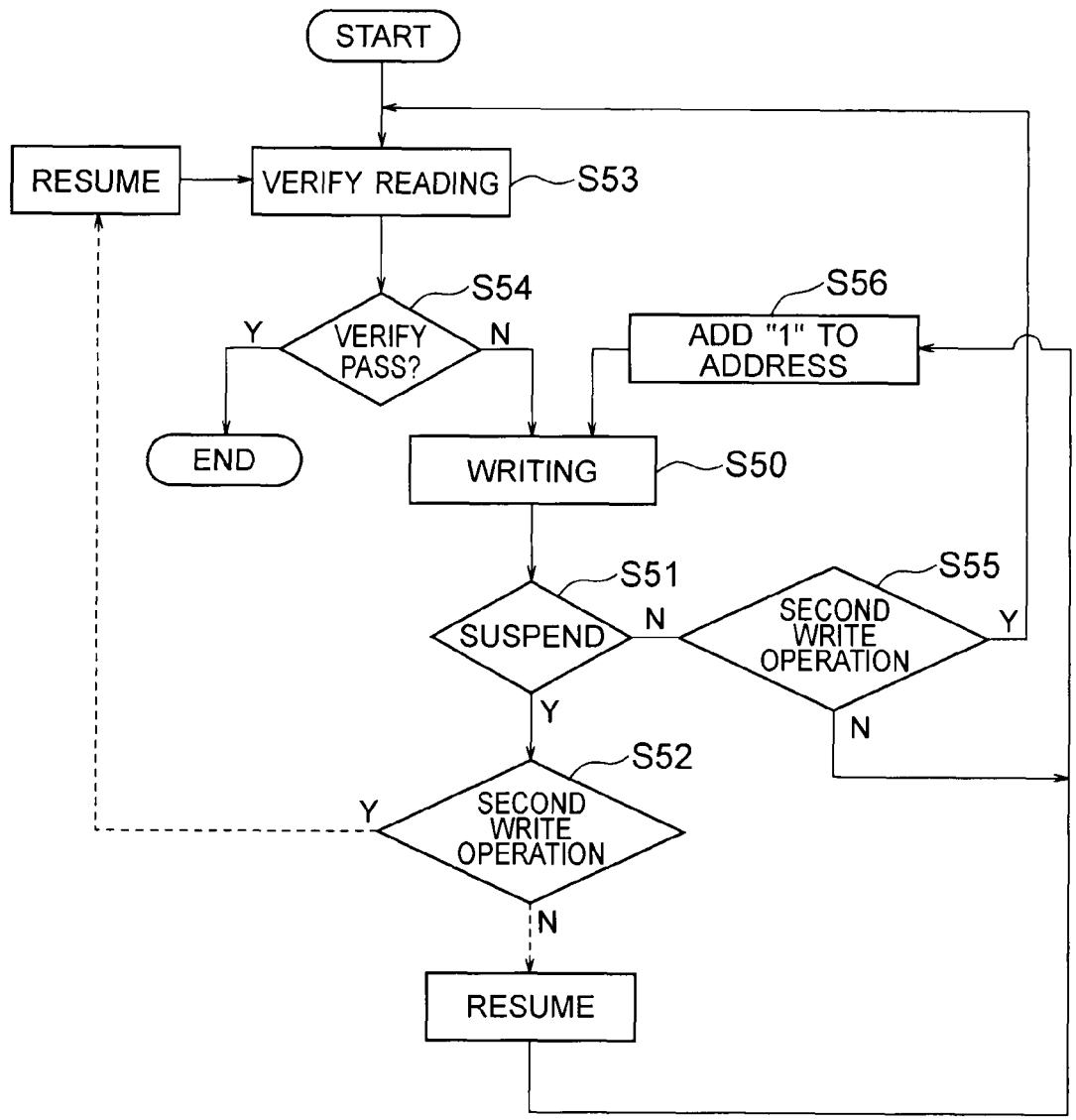
FIG. 10 is a flowchart showing the procedures of a multi-value data control method in accordance with a fourth embodiment of the present invention.

Referring now to FIG. 10, a method for controlling multi-value data in a nonvolatile semiconductor memory device in accordance with a fourth embodiment of the present invention is described. FIG. 10 is a flowchart showing the procedures in the multi-value data control method in accordance with this embodiment. This embodiment may be implemented in the NOR flash memory 100 of the first embodiment, for example.

The multi-value data control method in accordance with this embodiment is the same as the multi-value data control method of the first embodiment or the second embodiment, except that the multi-value data control method of this embodiment can cope with a case where a suspend operation occurs during a write operation. For example, this embodiment involves a nonvolatile semiconductor memory device in which a suspended state is formed by a suspend command that is input through an external command bus, for example. The write operation is then suspended, and reading is performed. A resume command is input through the external command bus, to return the operation from the suspended state.

First, as shown in step S50 of FIG. 10, writing is performed on each memory cell MC that is to be put into the state (10), (00), or (01) after the adjustment. When a suspend command is input during the writing (step S51), the writing is immediately suspended, even before the threshold value adjustment is completed on the memory cells MC having the writing being currently performed thereon.

A check is made to determine whether the writing is the first write operation or the second write operation (step S52). If the writing is the second write operation that involves verify reading, verify reading is performed (step S53) after a return from the suspended state (after a resume).

After that, based on the result of the verify reading, a check is made to determine whether the threshold value adjustment is completed on the memory cells MC that are to have writing performed thereon but have the writing suspended by the input of the suspend command (step S54). If the threshold value adjustment has not been completed, the operation returns to step S50, and additional writing is performed.

If the writing is determined in step S52 to be the first write operation that does not involve verify reading, the write address is incremented (step S56) after a return from the suspended state (after a resume). The operation then returns to step S50, and writing is performed. Accordingly, in the case of the first write operation that does not involve verify reading, writing is not performed again on the memory cell MC at the same address, and writing is started from the memory cell MC at the next address, so as to prevent excess writing after the resume.

If there is not a suspend command input during the writing, the operation moves on to step S55 after the writing, and a check is made to determine whether the writing is the second write operation (step S55). If the writing is determined to be the first write operation that does not involve verify reading, the write address is incremented, and the operation returns to step S50. Writing is then performed.

If the writing is determined in step S55 to be the second write operation that involves verify reading, the operation moves on to step S53, and verify reading is performed. Accordingly, in the case of the second write operation that involves verify reading, verify reading is started from the memory cell MC at the same address, so as to prevent excess writing after the resume. Writing is then performed.

As described above, in this embodiment, to prevent excess writing, a write operation can be immediately suspended even before the threshold value adjustment is completed on the memory cells MC having writing being currently performed thereon. In the case of the second write operation that involves verify reading, verify reading is performed after a return from a suspended state (after a resume), so as to prevent excess writing and guarantee the later threshold value distribution. In the case of the first write operation that does not involve verify reading, writing is not performed again on the memory cell MC at the same address after the resume, and writing is started from the memory cell MC at the next address. In this manner, excess writing is prevented, and the later threshold value distribution is guaranteed.

This embodiment can also be applied in a case where the third embodiment is combined with the first embodiment or the second embodiment.

Fifth Embodiment

Figure 11:
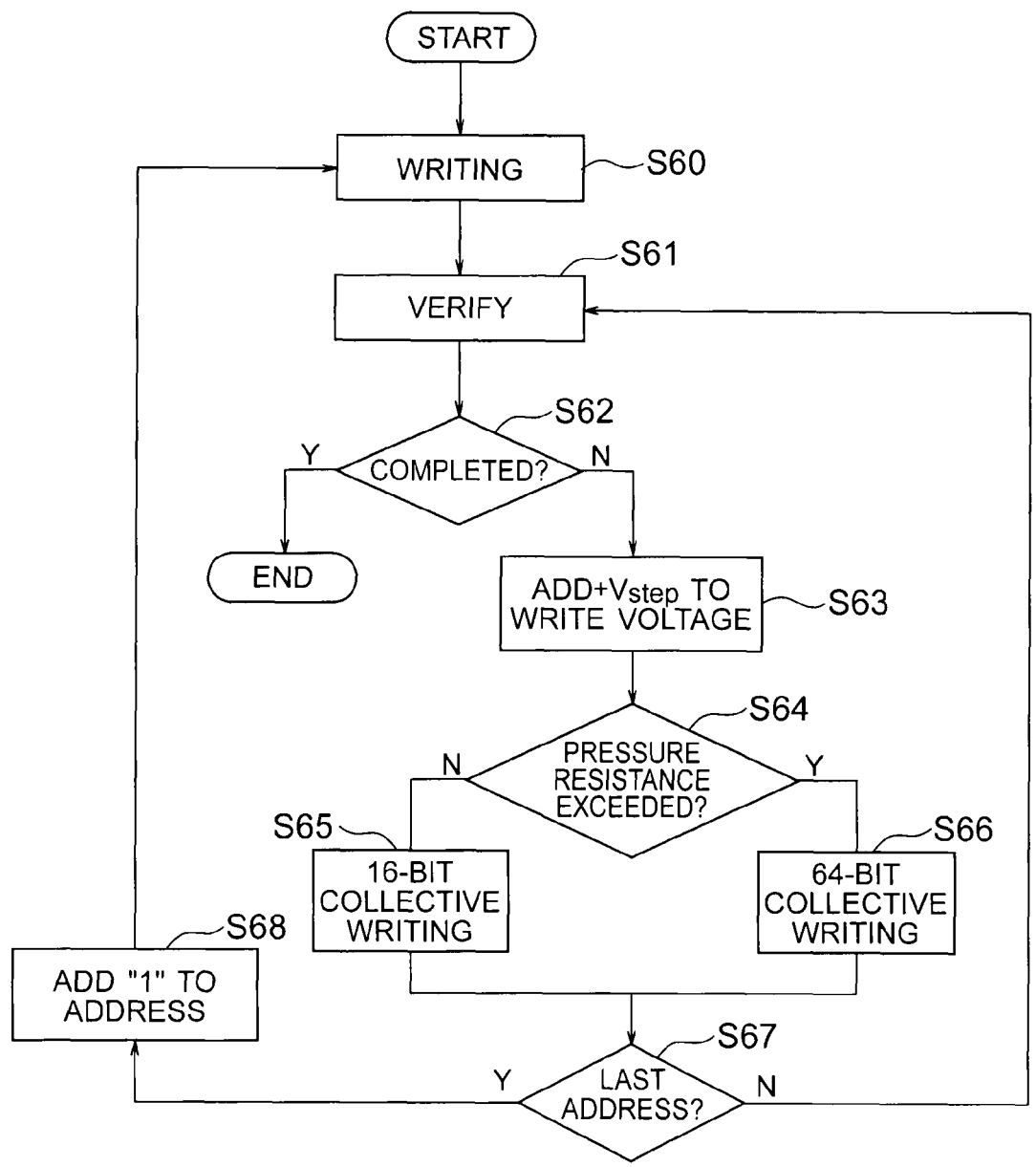
FIG. 11 is a flowchart showing the procedures of a multi-value data control method in accordance with a fifth embodiment of the present invention.
Figure 12:
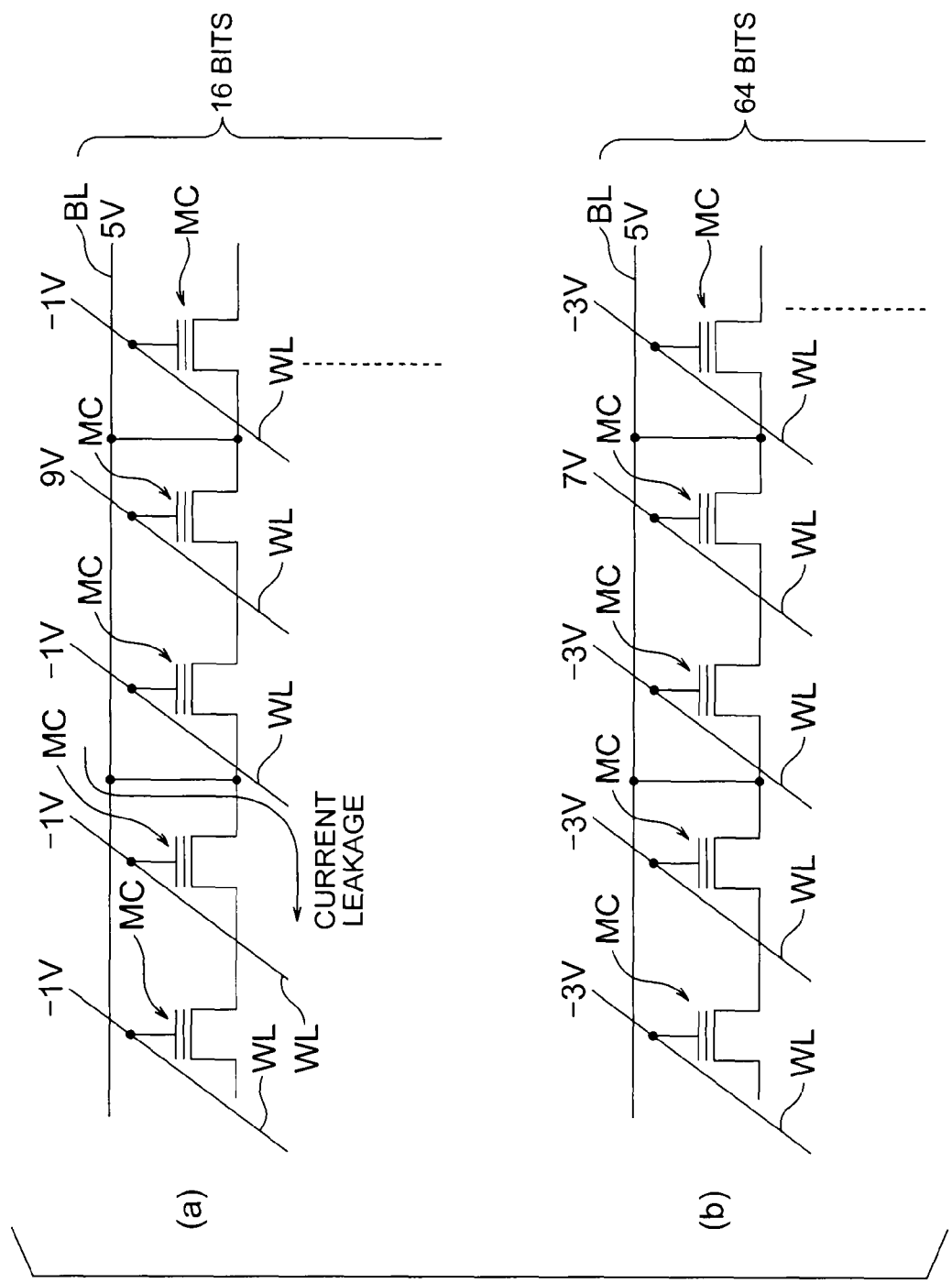
FIGS. 12(a) and 12(b) illustrate the multi-value data control method in accordance with the fifth embodiment.

Referring now to FIGS. 11 to 12(b), a method for controlling multi-value data in a nonvolatile semiconductor memory device in accordance with a fifth embodiment of the present invention is described. FIG. 11 is a flowchart showing the procedures in the multi-value data control method in accordance with this embodiment. FIGS. 12(a) and 12(b) are schematic views illustrating the multi-value data control method in accordance with this embodiment. This embodiment may be implemented in the NOR flash memory 100 of the first embodiment, for example.

Hereinafter, the memory cells MC on which writing (electron injection) is to be performed will be also referred to as the selected memory cells, the word line WL to which the selected memory cells are connected will be also referred to as the select word line, the bit line BL to which the selected memory cells are connected will be also referred to as the selected bit line, the memory cells MC other than the selected memory cells will be also referred to as the unselected memory cells, the word lines WL other than the select word line will be also referred to as the unselect word lines, the bit lines BL other than the selected bit line will be also referred to as the unselected bit lines.

In the case of a NOR flash memory, the write characteristics of a subject memory cell MC on which writing is to be performed are degraded by the leakage current flowing from the unselected memory cells on the same bit line BL at the time of writing, and as a result, the write time becomes longer.

Therefore, as shown in FIG. 12(a), the voltage of the word lines WL of the unselected memory cells is lowered to a negative value (−1V, for example), so as to restrain current leakage. However, if the write voltage $V_{prg}$ to be applied to the word line WL connected to the selected memory cells is high (+9V, for example), the pressure resistance of the memory cells MC or the peripheral elements may be exceeded due to the difference (10V, for example) between the negative potential and the positive potential. The negative voltage to be applied to the unselect word lines at the time of writing will be hereinafter referred to as the control voltage $V_{reg}$.

In this embodiment, as shown in FIG. 12(b), while multi-value distributions are formed in the same manner as in the third embodiment, the control voltage $V_{reg}$ is reduced to a lower value (−3V, for example) until the write voltage $V_{prg}$ of the word line WL reaches a predetermined value, and the number of memory cells for collective writing is increased from 16 bits (1 word) to 64 bits (4 words), for example.

While writing is performed with the increasing write voltage $V_{prg}$, the control voltage $V_{reg}$ is reset (−1V as shown in FIG. 12(a), for example) when the write voltage $V_{prg}$ becomes equal to or higher than the predetermined value. The number of memory cells for collective writing is also returned from the 64 bits (4 words) to 16 bits (1 word), for example. In this manner, the write time can be shortened. Here, the predetermined value for changing (switching) the number of memory cells for collective writing may be determined based on the pressure resistance of the memory cells MC or the peripheral elements, the allowed amount of current leakage, and the likes.

By the multi-value data control method of this embodiment, 16-bit collective writing is first performed as shown in step S60 of FIG. 11, and verify reading is then performed (step S61). Based on the result of the verify reading, a check is made to determine whether the writing on all the memory cells MC of the 16 bits has been completed (step S62). If the writing has been completed, the adjustment operation comes to an end.

If the result of the verify reading shows that there are memory cells MC having not reached the target threshold value $V_{th}$ and the writing is not to be ended, the operation moves on to step S63. The write voltage $V_{prg}$ (the voltage to be applied to the word line WL) is then increased by $V_{step}$ (the step-up width).

In step S64, a check is made to determine whether there is a margin of pressure resistance in the memory cells MC into which data is to be written with the write voltage $V_{prg}$ (whether the write voltage $V_{prg}$ is equal to or higher than the predetermined value). If there is not a margin, collective writing (the 16-bit collective writing) is performed on the 16 memory cells MC connected to the select word line WL (step S65). If there is a margin, the voltage of the word lines WL of the unselected memory cells MC is lowered, and collective writing (the 64-bit collective writing) is performed on the 64 memory cells MC connected to the select word line WL (step S66).

After the collective writing is completed, the operation moves on to step S67. If the current address is not the last address, the operation returns to step S61, and verify reading is performed. If the current address is the last address, "1" is added to the current address, and the operation returns to step S60. The above procedures are then repeated.

As described above, in accordance with this embodiment, the voltage on the negative side is lowered while the pressure resistance is not exceeded with respect to the voltage to be applied to the word lines WL, and the number of memory cells for collective writing is increased. In this manner, the write time is shortened. This embodiment may be combined with any of the first to fourth embodiment.

Sixth Embodiment

Next, a method for controlling multi-value data in a non-volatile semiconductor memory device in accordance with a sixth embodiment of the present invention is described. This embodiment may be implemented in the NOR flash memory 100 of the first embodiment, for example.

By the multi-value data control method of this embodiment, where multi-value distributions are formed in the same manner as in the first embodiment or the second embodiment, the control voltage $V_{reg}$ to be applied to the word lines WL of the unselected memory cells is made even lower at the time of adjustment of the multi-value data of the memory cells MC that are to be put into the states (10) and (00) with low threshold values for which the write voltage $V_{prg}$ to be applied to the select word line WL does not need to be made very high. The number of memory cells for collective writing is thus increased. When an adjustment is performed on the memory cells MC that are to be put into the state (01) with a high threshold value, the voltage on the negative side is reset, and the number of memory cells for collective writing is reduced. In this manner, the write time can be shortened. This embodiment may be combined with any of the first to fourth embodiment.

Application Example

An example case where a NOR flash memory 100 having the above structure and functions is mounted on a semiconductor chip is now described. Any of the control methods in accordance with the first to sixth embodiments may be implemented in the NOR flash memory 100 in this application example.

Figure 17:
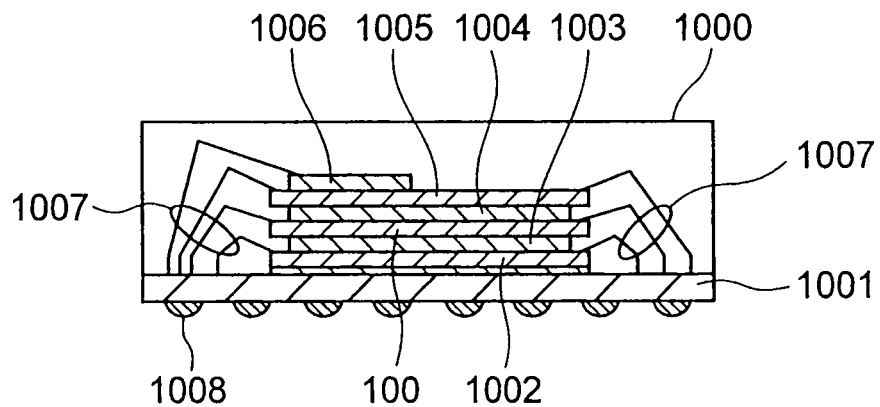
FIG. 17 is a cross-sectional view illustrating the structure of a semiconductor chip including the nonvolatile semiconductor memory device in accordance with the first embodiment.

FIG. 17 is a cross-sectional view of a semiconductor chip (a multi chip package (MCP)) 1000 that includes the NOR flash memory 100 of the first embodiment of the present invention.

As shown in FIG. 17, in the semiconductor chip 1000, a NAND flash memory 1002, a spacer 1003, the NOR flash memory 100, a spacer 1004, a PSRAM (Pseudo Static Random Access Memory) 1005, and a controller 1006 are stacked on a substrate 1001 in this order, and are mounted in the same package.

The NAND flash memory 1002 includes memory cells that can store multi-value data. In the semiconductor chip 1000, a SDRAM (Synchronous Dynamic Random Access Memory) may be employed, instead of the PSRAM.

Among the above memories, the NAND flash memory 1002 is used as the memory for storing data, in accordance with the usage in a memory system. The NOR flash memory 100 may be used as the memory for storing programs, for example. The PSRAM 1005 may be used as the work memory, for example.

The controller 1006 performs data input/output control and data control mostly on the NAND flash memory 1002. The controller 1006 includes an ECC correction circuit (not shown). When data is written, the controller 1006 adds an error correction code to the data. When data is read, the controller 1006 analyzes and processes the error correction code.

The NAND flash memory 1002, the NOR flash memory 100, the PSRAM 1005, and the controller 1006 are bonded to the substrate 1001 with wires 1007.

Solder balls 1008 provided on the bottom face of the substrate 1001 are electrically connected to the respectively wires 1007. The package has a BGA (Ball Grid Array) of a surface mounting type in which the solder balls 1008 are two-dimensionally arranged.

Next, a case where the semiconductor chip 1000 is employed in a portable telephone device as an example of an electronic device is described.

Figure 18:
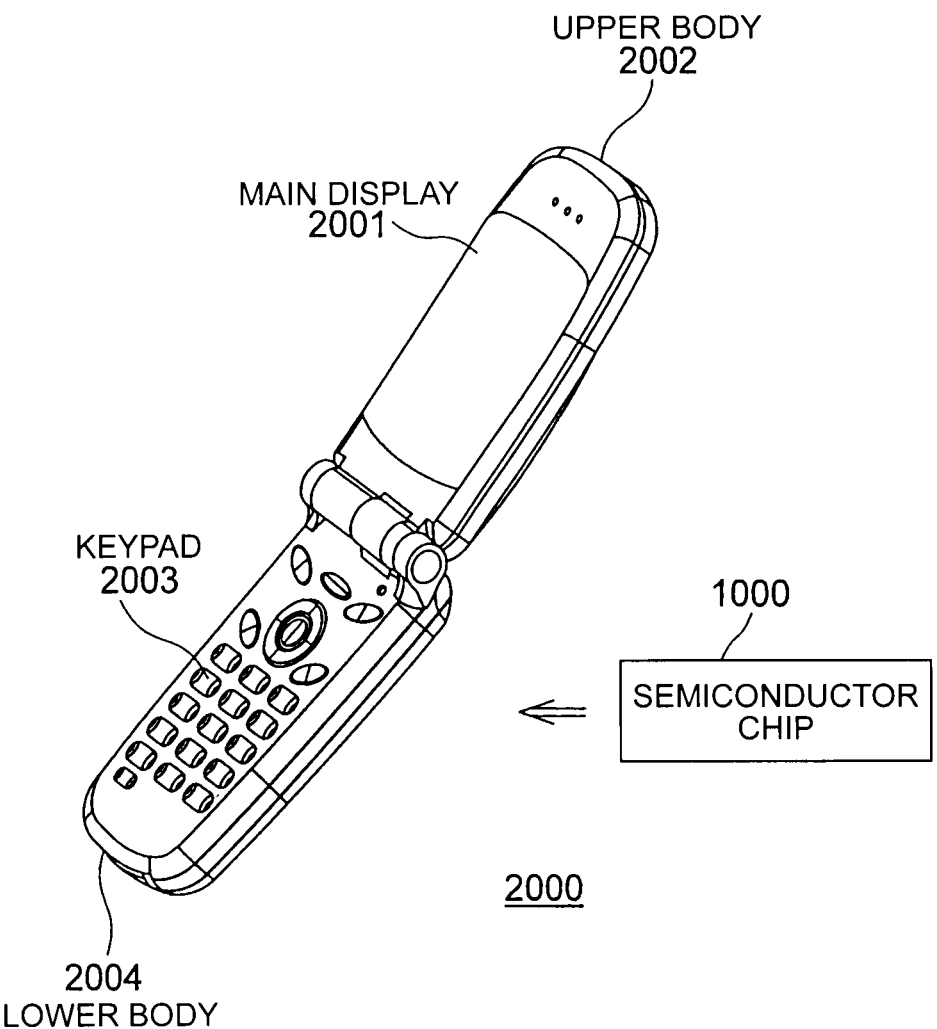
FIG. 18 is a schematic view of a portable telephone device that contains a semiconductor chip including the nonvolatile semiconductor memory device in accordance with the first embodiment.

FIG. 18 shows the portable telephone device in which the semiconductor chip 1000 is mounted. As shown in FIG. 18, the portable telephone device 2000 includes an upper body 2002 with a main display 2001, and a lower body 2004 with a keypad 2003. The semiconductor chip 1000 is mounted in the portable telephone device 2000.

The CPU (not shown) in the portable telephone device 2000 accesses the semiconductor chip 1000 via an interface (not shown), and transfers data and the likes.

The portable telephone device 2000 uses the NAND flash memory 1002 as the user data storage area, and the NOR flash memory 100 as the program storage area for firmware and the likes.

In such a memory system, the NOR flash memory 100 is required to maintain high data reliability. Meanwhile, the data amounts in the programs to be stored are increasing, as the application software is becoming more and more sophisticated.

The NOR flash memory 100 in accordance with the first embodiment of the present invention includes memory cells that store multi-value data, and is capable of solving the above mentioned problems by restricting the adjacency effect with the use of the above mentioned threshold value control method.

The semiconductor chip 1000 can be used in various electronic devices other than the above portable telephone device, such as a personal computer, a digital still camera, and a PDA.

Seventh Embodiment

Figure 19:
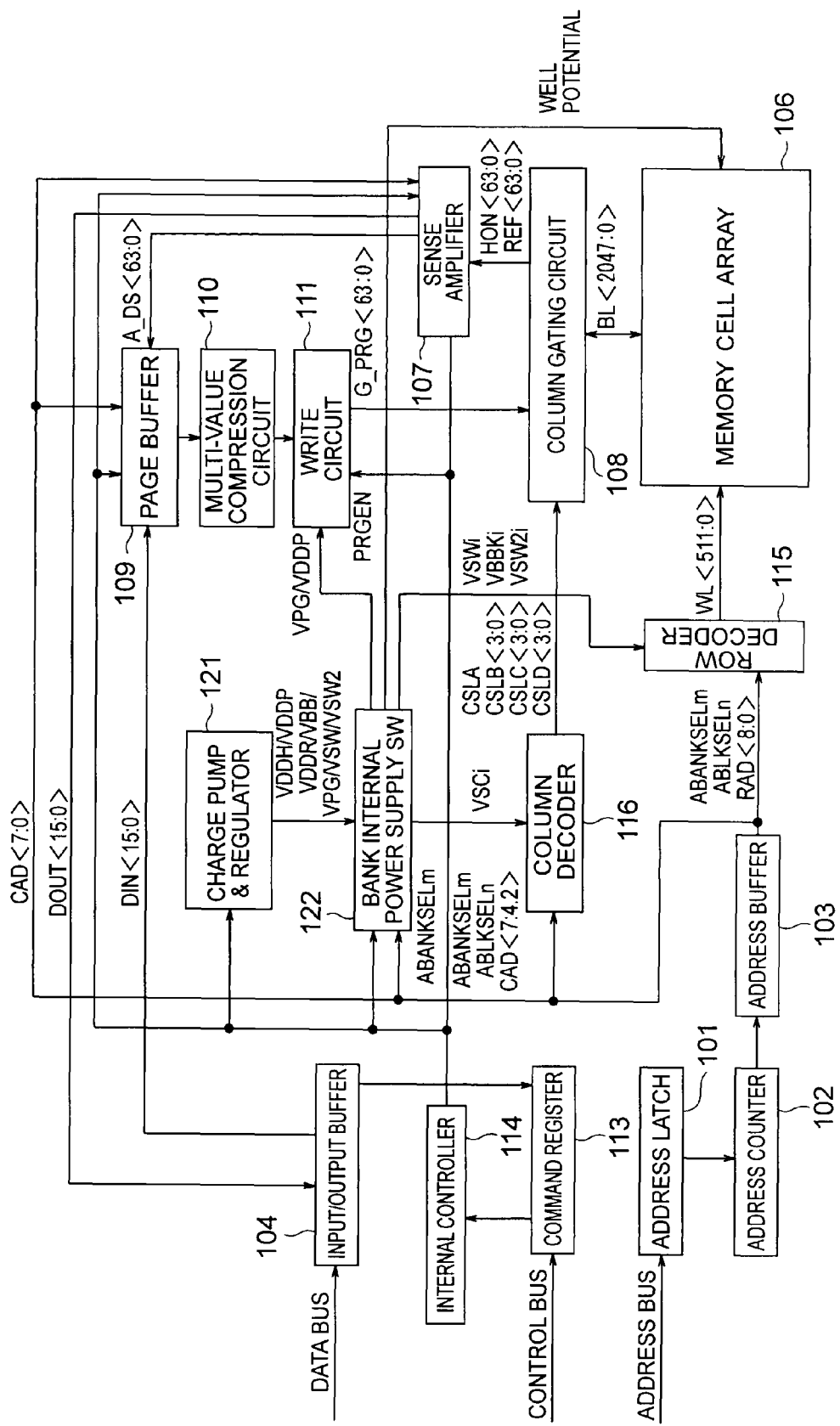
FIG. 19 is a block diagram schematically showing the structure of a nonvolatile semiconductor memory device in accordance with a seventh embodiment of the present invention.
Figure 20:
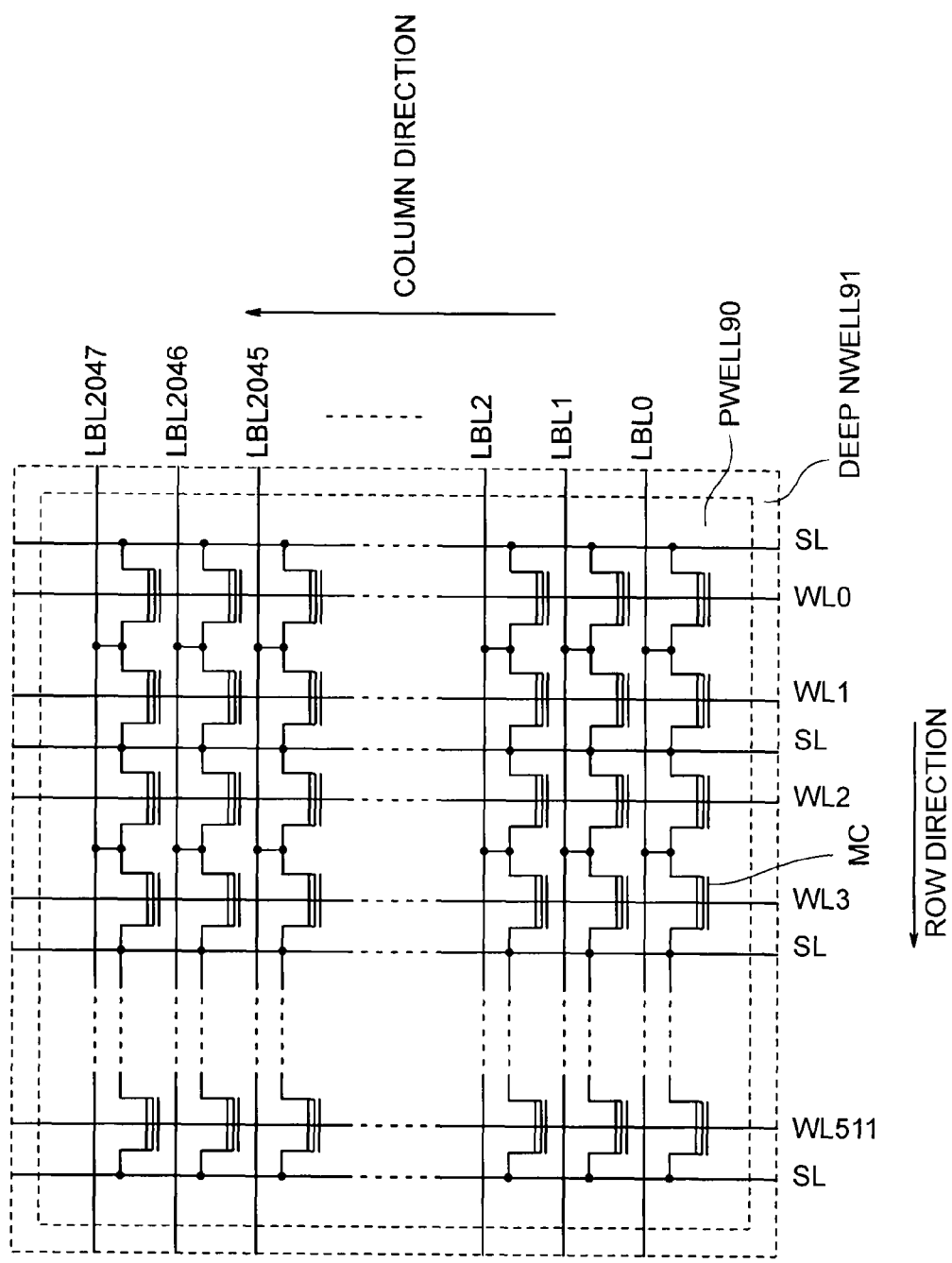
FIG. 20 shows an example of the memory cell connections in the NOR flash memory.
Figure 21:
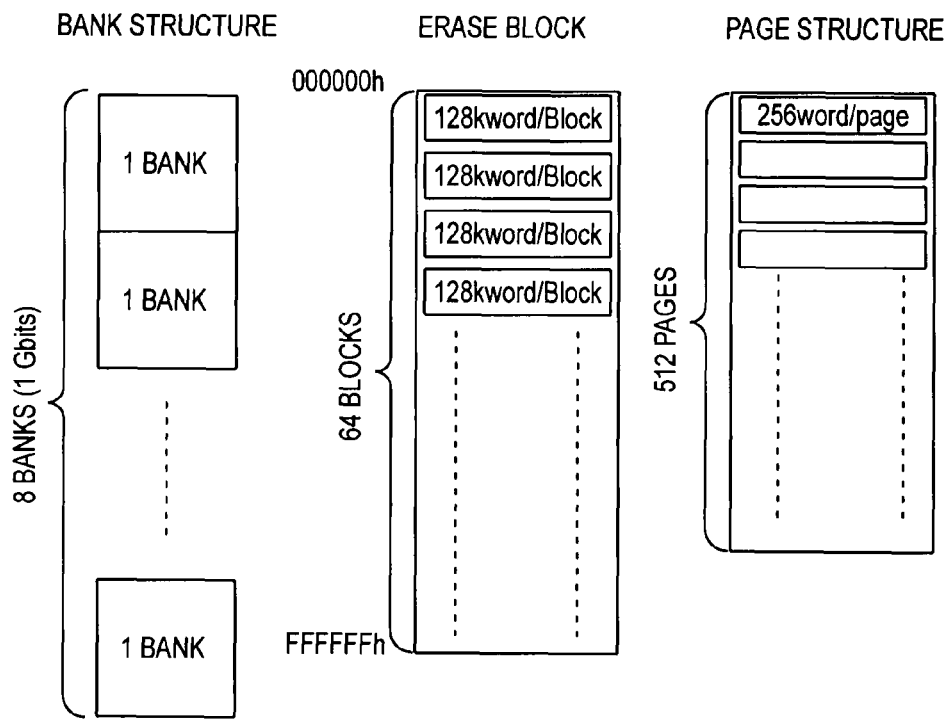
FIG. 21 shows an example of the data structure in the NOR flash memory.

FIG. 19 is a block diagram schematically showing the structure of a NOR nonvolatile semiconductor memory device in accordance with a seventh embodiment of the present invention. As an example of a nonvolatile semiconductor memory device, the structure of a NOR flash memory is schematically illustrated. FIG. 20 shows an example of connections among the memory cells in the NOR flash memory. FIG. 21 shows an example data structure in the NOR flash memory.

Referring first to FIG. 21, the data structure in the NOR flash memory is described. The NOR flash memory of FIG. 21 has a 1-Gbit capacity, for example, and is divided into eight banks (each being of 128 Mbits). Each of the banks is divided into 64 blocks. Data erasing is performed by the block. Each of the blocks has a data size of 2 Mbits=128 K words.

Each of the blocks is divided into 512 pages, and data writing is performed by the page. Each of the pages has a data size of 4 Kbits=256 words.

As shown in FIG. 20, each of the blocks has 512 word lines WL0 to WL511 arranged in the row direction, 257 source lines SL each arranged between each corresponding two adjacent word lines, 2048 bit lines LBL0 to LBL2047 arranged in the column direction, and 2048×512=1,048,576 memory cells MC arranged in the vicinities of the respective cross points of the word lines and the bit lines.

To hold multi-value data including four threshold value ranges, each memory cell MC stores 2-bit data. Each of the blocks has a memory capacity of 1,048,576×2 bits=2 Mbits, as described above.

The gate of each memory cell MC is connected to a word line, the drain is connected to a bit line, and the source is connected to the source line SL. The memory cells MC adjacent to one another in the row direction have the drains connected to one another, and are connected to the same bit line. Likewise, the memory cells MC adjacent to one another in the column direction have the source connected to one another, and are connected to the same source line SL.

Each of the memory cells MC is formed with a MNOS, and has a p-well 90 as the bottom face. A deep n-well 91 is provided to cover the p-well 90 bottom face, and the bottom face of the deep n-well 91 is covered with a p-substrate (not shown). The source lines SL, the p-well 90, the deep n-well 91, and the p-substrate are fixed at a ground potential, except when an erase bias is applied. In this embodiment, the erase time is not explained, and the case where the source lines SL, the p-well 90, the deep n-well 91, and the p-substrate are fixed at the ground potential is described.

The memory cells MC adjacent to one another in the column direction have the control gates CG connected to a common word line. Each of the word lines has 2048 memory cells MC connected thereto, and writing into the memory cells MC is performed by this unit (the page unit). In practice, data is not written into 2048 memory cells MC at the same time, but is written into 64 memory cells MC every time. The writing into the memory cells MC is performed by applying predetermined high voltages to the control gates CG via the word line, and to the drains via the bit lines, and then injecting hot electrons into the floating gates FG. The hot electrons are electrons that have not been scattered and have obtained high energy among the large number of electrons traveling trough the channels between the sources and the drains.

The NOR flash memory shown in FIG. 19 includes an address latch 101, an address counter 102, an address buffer 103, an input-output buffer 104, a memory cell array 106, a sense amplifier 107, column gating circuit 108, a page buffer 109, a multi-value compression circuit 110, a write circuit 111, a command register 113, an internal controller 114, a row decoder 115, a column decoder 116, a charge pump and regulator 121, and a bank internal power supply switching circuit (bank internal SW) 122.

In FIG. 19, the address latch 101 receives and latches addresses from an external address bus. The address counter 102 receives and counts the latched addresses from the address latch 101. The address buffer 103 receives an address output from the address counter 102, and outputs an internal address corresponding to a memory cell MC in which writing, reading, or erasing is to be performed.

The input/output buffer 104 performs data exchanges between an external data bus and an internal data bus. The memory cell array 106 has the structure illustrated in FIGS. 20 and 21. Data writing, verifying, and reading are performed by switching voltages to be applied to the word lines WL and the bit lines BL in the memory cell array 106.

The sense amplifier 107 is used to verify or read data. Hereinafter, the reading operation for checking the write level after a write pulse is applied will be referred to as "verify read", and the regular data reading operation will be referred to as "regular read". The sense amplifier 107 accesses a memory cell MC on which "verify read" or "regular read" is to be performed, and compares the current flowing from the memory cell MC to the bit line with the current flowing to the reference bit line, so as to sense the data in the memory cell MC. The sensed data is latched by the page buffer 109.

At the time of "verify read", the data in the memory cell MC is read, so as to determine whether writing has been performed up to a desired threshold voltage or higher. The data read at the time of "verify read" is supplied to the page buffer 109, and a verify check is performed. If the result of the verify check is positive, the data in the page buffer 109 is updated, and writing is performed on the next group of memory cells. If the result of the verify check is negative, the write data is updated for additional writing to be performed on the memory cell MC on which the verify check has failed, and the additional writing is performed.

A verify sense amplifier and a regular read sense amplifier may be prepared independently of each other. However, such two independent amplifiers require an extra chip area, and might reduce the read margin due to the variation difference between the two sense amplifiers. Therefore, the sense amplifier 107 is used to perform sensing operations for both "verify read" and "regular read" in this embodiment.

Figure 22:
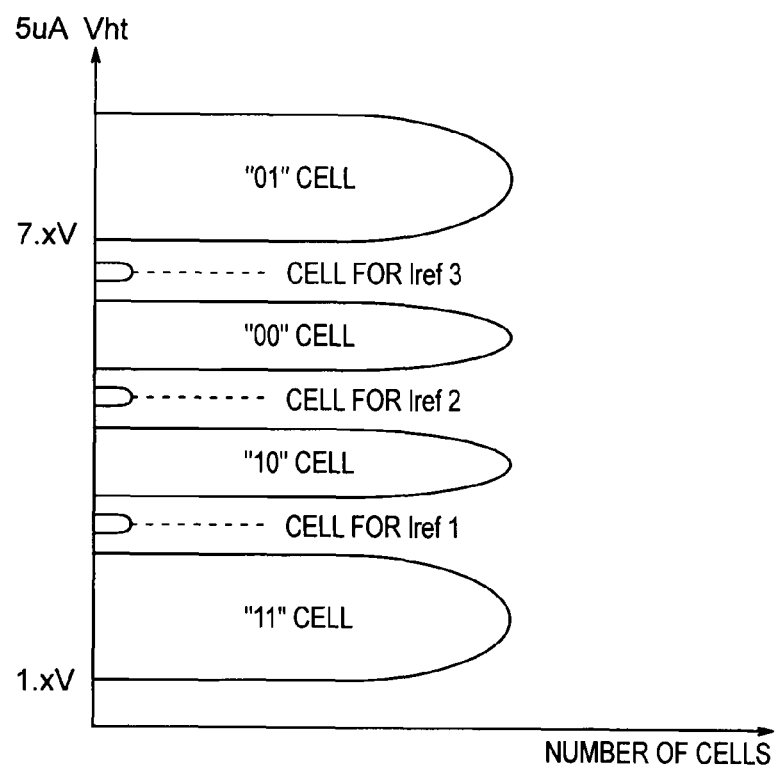
FIG. 22 illustrates a multi-value state.

Quaternary data can be stored in the memory cells MC by dividing and controlling the amount of electrons to be injected into the floating gates FG. More specifically, the erased state is defined as (11), and the other three states in the multi-value distribution of each memory cell MC are defined as (10), (00), and (01) in order of increasing threshold value, as shown in FIG. 22. However, the data bit allocation in the multi-value distribution is not limited to the allocation shown in FIG. 22. Also, the data that can be stored in the memory cells MC is not limited to quaternary data, and n-value data (n being a positive integer of 4 or greater) may be stored in the memory cells MC, for example.

The page buffer 109 latches the write data supplied via the input-output buffer 104. The page buffer 109 includes the necessary number of data latches for determining the write data for the memory cells connected to at least one select word line WL.

The multi-value compression circuit 110 compresses the multi-value write data supplied from the page buffer 109 at the time of writing, and outputs the compressed data to the write circuit 111. The write circuit 111 generates a write voltage in accordance with the multi-value write data, and supplies the write voltage to the corresponding bit line BL via the column gating circuit 108.

The command register 113 holds commands (such as a write command, a read command, and an erase command) input from an external control bus. The internal controller 114 receives a command from the command register 113, and generates various control signals for controlling each circuit in the NOR flash memory 100.

The row decoder 115 receives a row address output from the address buffer 103, and generates signal that selects the corresponding word line WL in the memory cell array 106. A write voltage, a read voltage, an erase voltage, or the like is applied to the word line WL selected by the row decoder 115, when an operation such as writing, reading, erasing, or the like is performed.

The column decoder 116 receives a column address output from the address buffer 103, and selectively drives a column gate in the column gating circuit 108 in accordance with the internal address. Accordingly, the data in the memory cell MC connected to the selected bit line BL in the memory cell array 106 can be read into the sense amplifier 107. At the time of writing, the data of the bit line BL is written into a designated memory cell MC at the write circuit 111.

The charge pump and regulator 121 serving as a booster circuit generates a high voltage (a write voltage, an erase voltage, or the like) in accordance with an operation such as writing, reading, erasing, or the like, and supplies the high voltage to the memory cell array 106, the write circuit 111, the row decoder 115, the column decoder 116, and the likes. The voltage generated from the charge pump and regulator 121 is supplied to the select word line WL in the memory cell array 106 via the row decoder 115.

The bank internal power supply switching circuit 122 controls the switching of the internal power supply voltage at the time of writing, reading, or erasing, and includes first to fourth voltage switching units. The first to fourth voltage switching units will be described later in detail.

Figure 23:
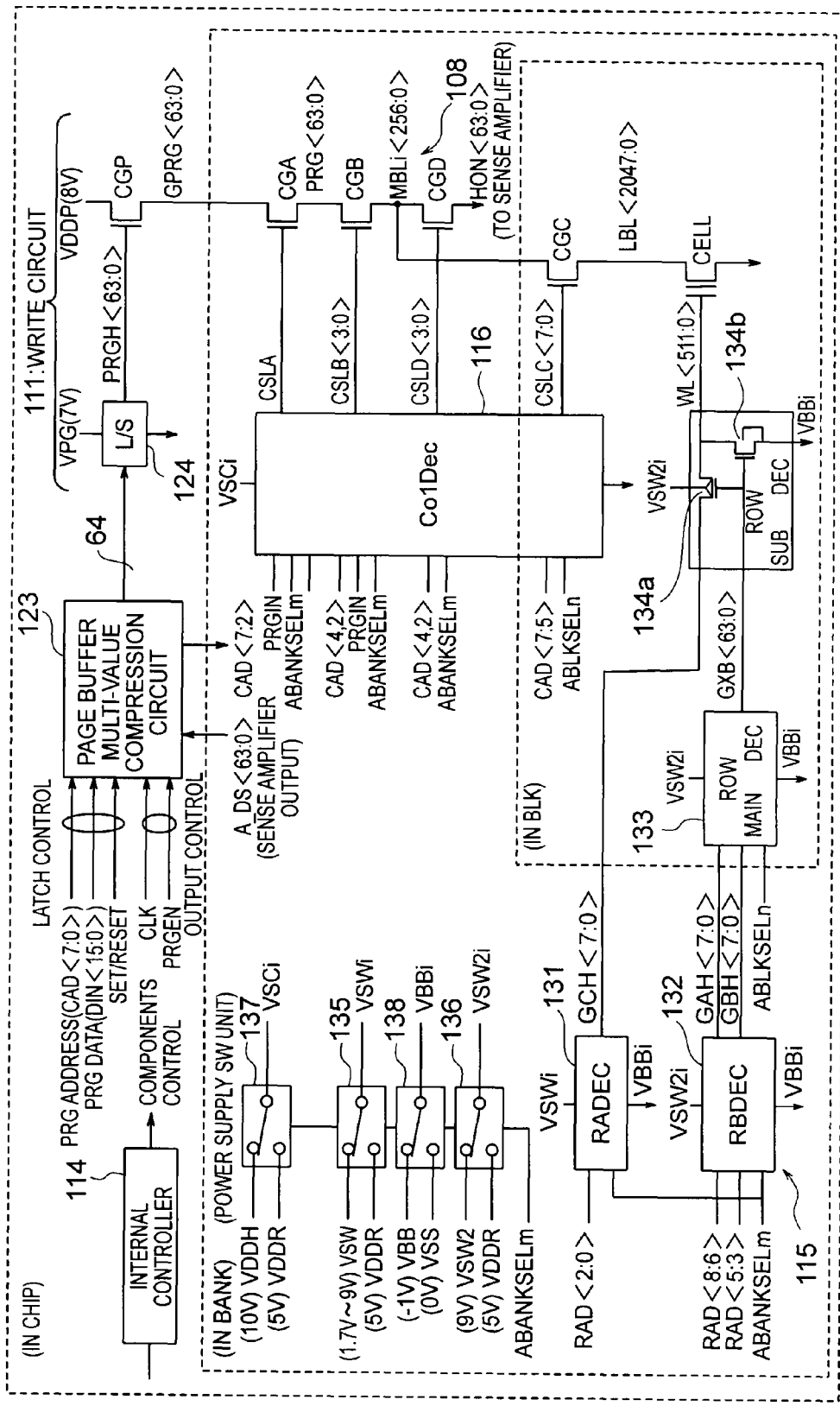
FIG. 23 is a block diagram showing an example of each internal structure of the column gating circuit 108, the write circuit 111, and the row decoder 115 of FIG. 19.

This embodiment is characterized by being able to promptly determine the voltage level of the word line at the time of writing. FIG. 23 is a block diagram showing example internal structures of the column gating circuit 108, the write circuit 111, and the row decoder 115 of FIG. 19. In FIG. 23, the page buffer 109 and the multi-value compression circuit 110 are shown as one block 123.

In FIG. 23, the write circuit 111 includes a level shifter 124 and a transistor CGP. The level shifter 124 shifts the voltage level of the output voltage (VDD/VSS) of the multi-value compression circuit 110 to (VPG/VSS). The transistor CGP is a write load, and is switched on and off in accordance with the output voltage of the level shifter 124. The gate voltage of the transistor CGP becomes a voltage VPG at the time of writing, and a potential that is lowered by the threshold value of the transistor CGP is applied to the drain of the memory cell MC. More specifically, the voltage level of the power supply voltage VPG of the level shifter 124 is adjusted to 5 V at the drain end of the memory cell MC.

The column gating circuit 108 includes three transistors CGA, CGB, and CGD that are connected in a cascade form between the source of the transistor CGP and the sense amplifier 107, and a transistor CGC that is connected between the drain of the memory cell MC and the drain of the transistor CGD.

Although each of the transistors CGP, CGA, CGB, CGD, and CGC is shown as a single transistor in FIG. 23, each of those transistors is formed with a number of transistors. More specifically, 64 transistors CGP, 64 transistors CGA, 256 transistors CGB, 64 transistors CGD, and 2048 transistors CGC are provided in each block.

Figure 24:
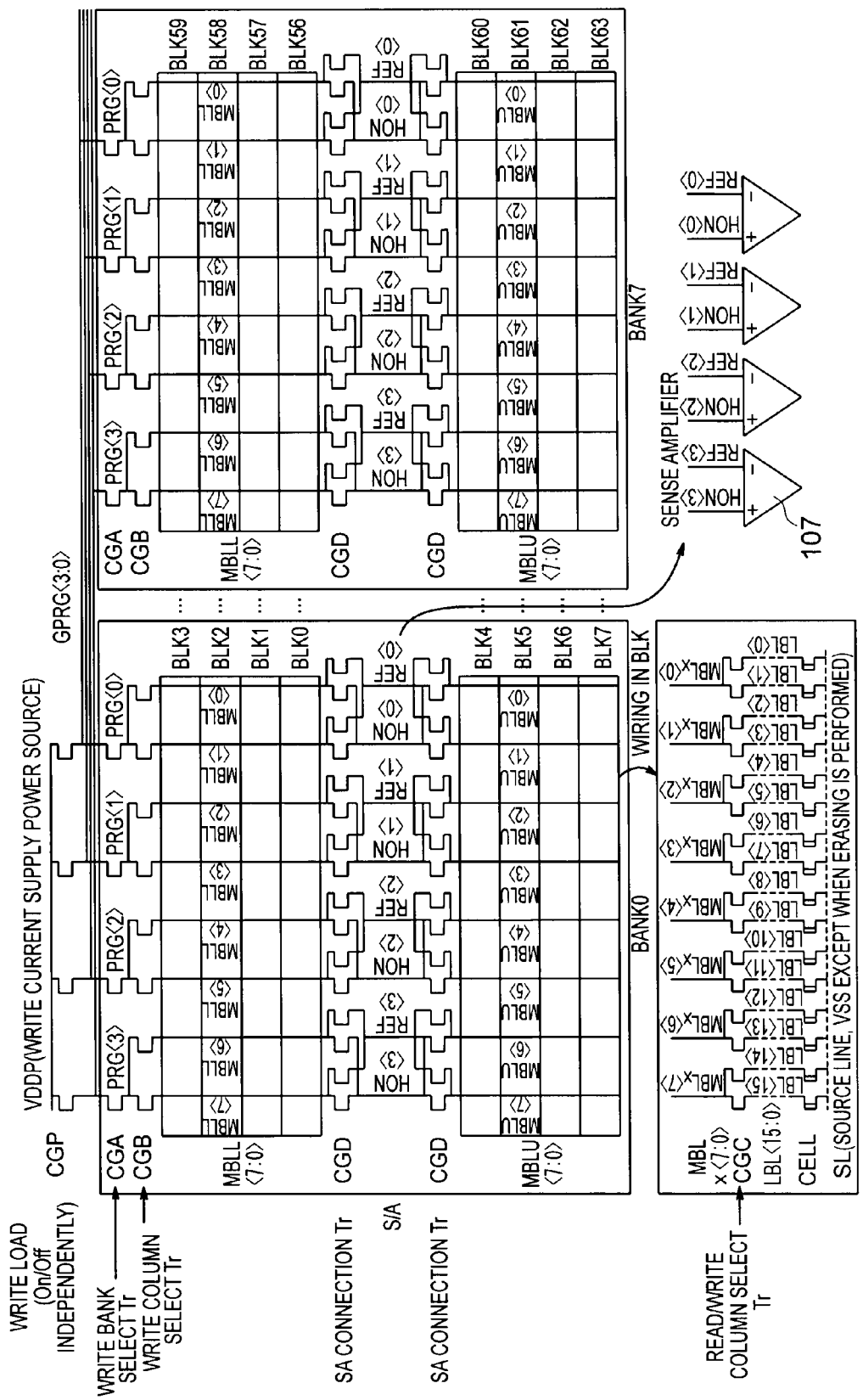
FIG. 24 shows the connections among the transistors CGP, CGA, CGB, CGD, and CGC in greater detail.

FIG. 24 illustrates the connections among the transistors CGP, CGA, CGB, CGD, and CGC. For ease of explanation, FIG. 24 shows an example case where four transistors CGP, four transistors CGA, eight transistors CGB, sixteen transistor CGD, and sixteen transistors CGC are provided in each block.

In FIG. 24, the arrangement of the memory cells MC in the memory cell array 106, and the internal structure of the sense amplifier 107 are shown in enlarged views at the positions indicated by arrows.

As shown in FIG. 24, the transistors CGA are bank select transistors, and each of the drains is connected to the corresponding transistor CGP that is a write load. Since four transistors CGP and four transistors CGA exist in each block in the case shown in FIG. 24, the number of bits that can be written at once is four. As 64 transistors CGP and 64 transistors CGA actually exist in each block as shown in FIG. 22, 64 bits can be written at once.

As shown in FIG. 24, the transistors CGP are provided for all the banks, the transistors CGA, CGB, and CGD are provided for each bank, and the transistors CGC are provided for each block.

The transistors CGD are transistors that are connected to the input line of the sense amplifier 107, and are switched on and off in accordance with the logics of column addresses A2 and A4. The transistors CGC are transistors that are connected to the memory cells MC, and are switched on and off in accordance with the logics of column addresses A0 to A7. Main bit lines MBL are connected to the drains of the transistors CGC, and local bit lines LBL are connected to the sources of the transistors CGC. In FIG. 24, eight main bit lines MBL and sixteen local bit lines LBL are shown. However, 256 main bit lines MBL and 2048 local bit lines LBL are actually provided as shown in FIG. 23.

As shown in FIG. 24, the sense amplifier 107 is located substantially at the center of each bank, and the same number of blocks are placed on either side of the sense amplifier 107. Although eight blocks are provided in each bank in FIG. 24, there are actually 64 blocks in each bank as shown in FIG. 21. Therefore, 32 blocks are placed on either side of the sense amplifier 107. The transistors CGD are also placed on either side of the sense amplifier 107.

At the time of data regular reading and writing, the non-selected bit lines MBL are reset to the ground potential VSS, and serve as shielding lines. At the time of data regular reading and verify reading, the sense amplifier 107 compares the drain voltage HON of the transistors CGD with the reference voltage REF on the reference cell side (not shown), as indicated in the enlarged view in FIG. 24.

Referring to FIG. 24, the operation to be performed at the time of writing is described. The bit lines MBLL <7, 5, 3, 1> are connected to the bit lines MBLU <7, 5, 3, 1> via the transistors CGD, or the bit lines MBLL <6, 4, 2, 0> are connected to the bit lines MBLU <6, 4, 2, 0> via the transistors CGD. With this arrangement, the write drain voltage is supplied to the memory cells MC in the blocks on either side of the sense amplifier 107.

Referring also to FIG. 24, the operation to be performed at the time of regular reading or verify reading is described. To read the data from the memory cells MC connected to the bit lines LBL <14, 10, 6, 2> of the block BLK0, for example, the bit lines MBLL <7, 5, 3, 1> are connected to the drain voltages HoN <3:0> via the transistors CGD. In this case, the bit lines MBLL <6, 4, 2, 0> are fixed at the ground potential, and serve as the shielding lines. Also, the bit lines MBLL <7, 5, 3, 1> are connected to the reference voltages <3:0> via the transistors CGD. With this arrangement, the voltage according to the dummy capacitance of the bit lines MBLL <7, 5, 3, 1> is supplied to the sense amplifier 107, and the bit lines MBLU <6, 4, 2, 0> are fixed at the ground potential and serve as the shielding lines.

As shown in FIG. 23, the row decoder 115 includes a first pre-decoder 131 that decodes the lower bit strings RAD <2:0> of a row address, a second pre-decoder 132 that decodes the upper bit rows RAD <8:6> and pre-decodes the middle bit strings RAD <5:3> of the row address, a row main decoder 133 that decodes the upper bit strings RAD <8:3> based on the pre-decoding result of the second pre-decoder 132, and a row sub decoder 134 that generates word line potentials WL <511:0> based on the decoding result of the row main decoder 133 and the decoding result of the first pre-decoder 131.

The first pre-decoder 131 is equivalent to the first row address decoder, the second pre-decoder 132 and the row main decoder 133 are equivalent to the second row address decoder, and the row sub decoder 134 is equivalent to the row address decoder.

The first pre-decoder 131 and the second pre-decoder 132 are provided for each bank, while the row main decoder 133 and the row sub decoder 134 are provided for each block.

The power supply voltage of the first pre-decoder 131 is VSWi, and the voltage level of the power supply voltage is switched by a first voltage switching unit 135. The power supply voltage of the second pre-decoder 132, the main row decoder 133, and the row sub decoder 134 is VSW2$i$, and the voltage level of the power supply voltage is switched by a second voltage switching unit 136. The voltage level of the power supply voltage VSCi for the column decoder 116 is switched by a third voltage switching unit 137. The ground potential of the first pre-decoder 131 and the second pre-decoder 132 is VBBi, and the voltage level of the ground potential is switched by a fourth voltage switching unit 138.

The first voltage switching unit 135 switches the power supply voltage VSWi to VSW when a program bank select signal ABANKSELm is high (writing is to be performed on the subject bank), and switches the power supply voltage VSWi to VDDR when the program bank select signal ABANKSELm is low (writing is not to be performed on the subject bank).

The second voltage switching unit 136 switches the power supply voltage VSW2$i$ to VSW2 when the program bank select signal ABANKSELm is high, and switches the power supply voltage VSW2$i$ to VDDR when the program bank select signal ABANKSELm is low.

The third voltage switching unit 137 switches the power supply voltage VSCi to VDDH when the program bank select signal ABANKSELm is high, and switches the power supply voltage VSCi to VDDR when the program bank select signal ABANKSELm is low.

The fourth voltage switching unit 138 switches the ground voltage VBBi to VBB when the program bank select signal ABANKSELm is high, and switches the power supply voltage VBBi to VSS when the program bank select signal ABANKSELm is low.

As described above, depending on whether writing is to be performed on the subject bank, the first to fourth voltage switching units 135 to 138 switch the voltage levels of the four bank internal power supply voltages VSWi, VSW2$i$, VBBi, and VSCi. In this embodiment, voltage switching is not performed at the time of writing and verifying.

The column gating circuit 108 is controlled by the column decoder 116, and more specifically, the gate voltages of the transistors CGA, CGB, CGC, and CGD are generated at the column decoder 116. Accordingly, those gate voltages vary with the voltage level of the power supply voltage VSCi of the column decoder 116. More specifically, the gate voltages of the transistors CGA, CGB, CGC, and CGD corresponding to the banks in which writing is not to be performed are VDDR or 0 V. Accordingly, at the time of data regular reading and verify reading, the column gating circuit 108 is driven with the power supply voltage VDDR (5 V, for example).

The power supply voltage VSCi=VDDH (10 V, for example) is supplied to the column decoder 116 of each bank in which writing is to be performed. Accordingly, when writing is performed, the column gating circuit 108 is driven with the power supply voltage VDDH.

The reason that the drive voltage of the column gating circuit 108 is set high at the time of writing is as follows. At the time of writing, a voltage of approximately 5 V needs to be supplied to the drain of each memory cell MC, and a current of 50 μA or higher needs to flow between the drain and the source. Therefore, the gate voltage of each transistor needs to be sufficiently higher than 5V, so as to reduce the voltage drops in the transistors CGA, CGB, CGC, and CGD in the column gating circuit 108.

VDDR is used not only as the power supply voltage of the column decoder 116 at the time of regular reading, but also as the power supply voltage for the row decoder 115. The voltage level of FDDR is set at 5 V, for example.

Read voltages suitable for the respective read methods may be prepared for multi-value writing in the memory cells MC, and may be sequentially applied to the gates of the memory cells MC. In this embodiment, however, a read method involving a single control gate voltage is employed, for ease of explanation. By this method, it is necessary to prepare three reference currents for a threshold value check at the time of reading.

To avoid wrong write, the drain voltage of each memory cell MC at the time of reading needs to be 1 V or lower, and the read current in such a case is as low as 20 μA or less. Accordingly, the select voltage of the column gating circuit 108 can be made lower than the select voltage for writing. Therefore, the power supply voltage of the column decoder 116 at the time of reading is set at VDDR, which is lower than VDDH at the time of writing. This leads to a reduction in the current consumption.

The first voltage switching unit 135 maintains the voltage VSWi at VSW during the write sequence for the banks in which writing is to be performed. Accordingly, the voltage VSWi is at VSW not only during the writing but also during the verify reading.

The voltage VSWi is used as the power supply voltage of the entire row decoder 115 in a conventional case. In this embodiment, however, the voltage VSWi is used as the power supply voltage for the first pre-decoder 131, and the load capacitance of VSWi is made much smaller.

During the time period in which writing and verify reading are repeated, the charge pump and regulator 121 causes the voltage level of the voltage VSW to vary at the time of writing and verify reading. Accordingly, the voltage of the select word lines WL also varies. In this embodiment, however, the voltage VSWi set at the voltage VSW is used only at the first pre-decoder 131, and the load capacitance of the lines of the voltage VSWi becomes smaller. Thus, the voltage level of the voltage VSWi can be promptly stabilized.

Compared with the conventional case where the voltage VSWi is used as the power supply voltage of the entire row decoder 115, the latency time required for the voltage VSWi to stabilize in the case where the voltage VSWi is used as the power supply voltage only for the first pre-decoder 131 can be shortened to 1/10-1/90 of that in the conventional case.

The power supply voltage VSW2$i$ that is switched by the second voltage switching unit 136 is supplied to each of the components in the row decoder 115 other than the first pre-decoder 131. The power supply voltage VSW2$i$ is set at VSW2 in the banks in which writing is to be performed. The voltage VSW2 is set in accordance with the maximum value of the word line voltage at the time of writing and verify reading, and may be fixed at 9 V, for example.

Figure 25:
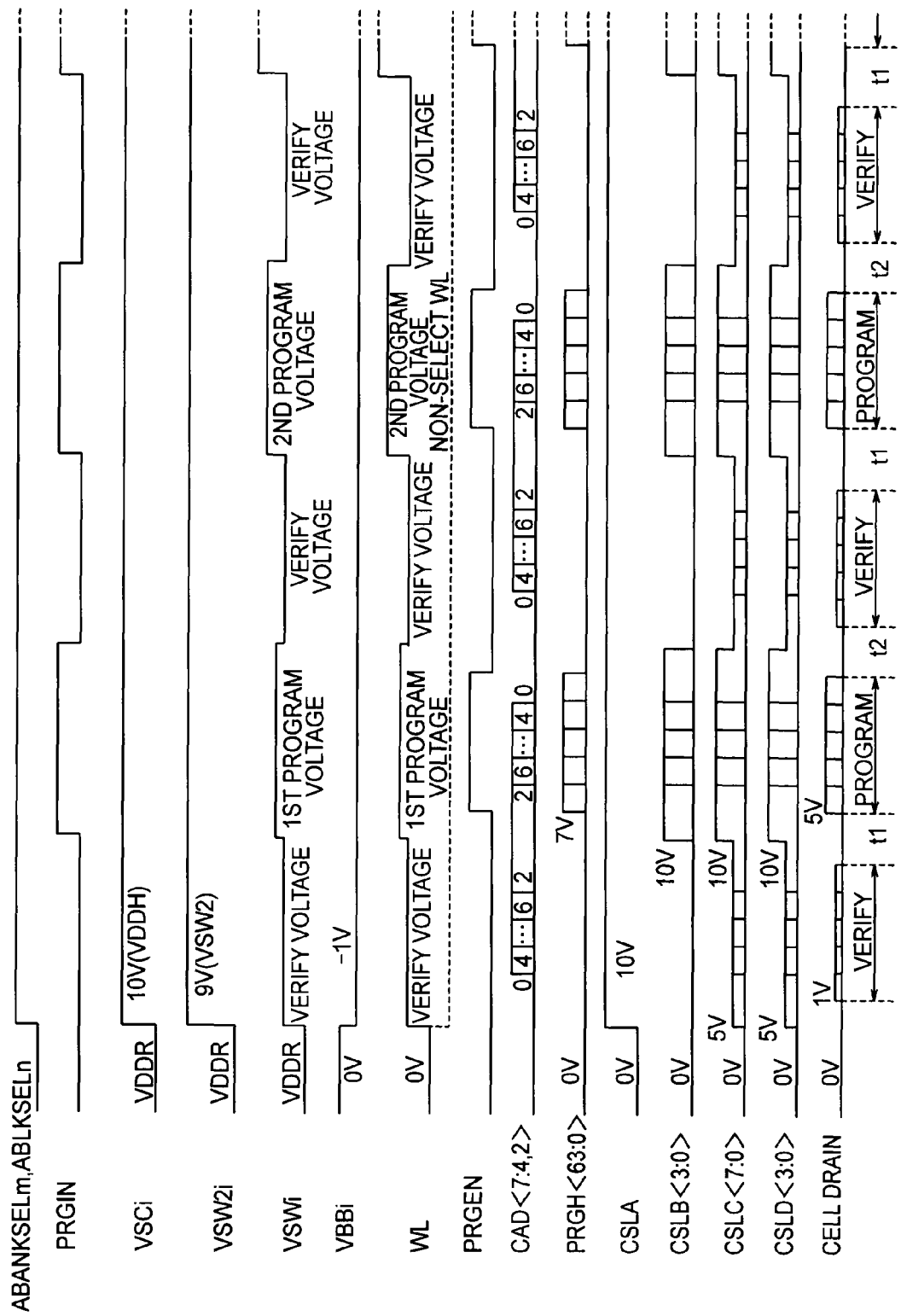
FIG. 25 is a timing chart showing the voltage waveforms of the respective components shown in FIG. 23.

FIG. 25 is a timing chart showing the voltage waveforms of the respective components of FIG. 23. From the top, FIG. 25 shows the program bank select signal ABANKSELm, a PRGIN signal indicating a write period, the voltage VSCi that is switched by the third voltage switching unit 137, the voltage VSW2$i$ that is switched by the second voltage switching unit 136, the voltage VSWi that is switched by the first voltage switching unit 135, the voltage VBBi that is switched by the fourth voltage switching unit 138, the voltage of the select word lines WL, a PRGEN signal that allows the write load transistors CGP to be switched on, the column address signal CAD <7:4, 2> generated at the page buffer 109, the gate voltage PRGH <63:0> of the write load transistor CGP, the gate voltage CSLA of the transistors CGA, the gate voltage CSLB <3:0> of the transistors CGB, the gate voltage CSLC <7:0> of the transistors CGC, the gate voltage CSLD <3:0> of the transistors CGD, and the drain voltage CellDrain of the memory cells MC.

As shown in FIG. 25, the program bank select signal ABANKSELm is always high during the bank selection. The PRGIN signal is high during each write period, and is low during each verify read period. The voltage VSCi is switched from VDDR to VDDH and is fixed at VDDH, when the banks in which writing is to be performed are selected, and the write sequence starts. Accordingly, the voltage VSCi is fixed while the writing and the verify reading are performed.

When the write sequence starts, the voltage VSW2$i$ is switched from VDDR to VSW2 and is fixed at VSW2. The VSW2 is 9 V, for example. The voltage VSW2$i$ is used as the power supply voltage at the components in the row decoder 115 other than the first pre-decoder 131. Therefore, the load capacitance of the voltage VSW2$i$ is relatively large, but the voltage level of the voltage VSW2$i$ does not vary during the writing and the verify reading. Accordingly, the voltage VSW2$i$ does not greatly affect the write time.

After the write sequence starts, the voltage VSWi is set at the program voltage according to the number of times writing has been performed during each write period, and is set at the verify voltage during each verify read period. Outside the write sequence, the voltage VSWi is at VDDR. Since the voltage VSWi is the power supply voltage only for the first pre-decoder 131, the load capacitance of the voltage VSWi can be restricted, and the transition speed of the select word-line WL voltage can be increased accordingly.

The voltage VBBi is a negative voltage (fixed at −1 V, for example) in the write sequence, and is fixed at 0 V outside the write sequence.

The voltage of the select word lines WL varies with the power supply voltage VSW. The voltage of the select word lines WL is set at the program voltage according to the number of times writing has been performed during each write period, and is set at the verify voltage during each verify read period. Outside the write sequence, the voltage of the select word lines WL is at VDDR. The voltage of the non-select word lines is a VBBi voltage (−1 V, for example) in the write sequence, and is fixed at 0 V outside the write sequence.

The PRGEN signal is high while the write pulse is applied in the write sequence, and is low in the other time periods. The column address signal CAD <7:4, 2> is updated in the timing of writing. The PRGH signal instructs to apply the write voltage to the drains of the cells in which writing is to be performed among the simultaneous write cells selected through the column address signal CAD <7:4, 2>.

The gate voltage CSLA of the transistors CGA is fixed at 10 V in the write sequence, for example, and is at 0 V in the other time periods. The gate voltage CSLB <3:0> of the transistors CGB becomes high (10 V, for example) in the timing of writing. In the conventional case, the gate voltage CSLC <7:0> of the transistors CGC and the gate voltage CSLD <3:0> of the transistors CGD are set at 10 V during each write period, are set at 5 V during each verify read period and each regular read period, and are set at 0 V in the other time periods, for example. In this embodiment, on the other hand, the gate voltage CSLC <7:0> of the transistors CGC and the gate voltage CSLD <3:0> of the transistors CGD are set at 10 V during each write period and each verify read period, are set at 5 V during each regular read period, and are set at 0 V in the other time periods, for example.

A pulse of 5 V is supplied to the drain of each cell in which writing is to be performed among the memory cells MC, a pulse of 1 V is supplied to the drain during each verify read period, and the drain is set at 0 V in the other time periods.

As shown in FIGS. 23 and 25, in this embodiment, the power supply voltage VSCi of the column decoder 116 is fixed at VDDH (10 V, for example) during each write period and verify read period in the write sequence. In the conventional case, the power supply voltage VSCi of the column decoder 116 is set at 10 V during each write period, and is set at 5 V during each verify read period. The inventor of the present invention examined the characteristics of the sense amplifier 107 in both cases where the power supply voltage VSCi is 10 V and 5V during verify read periods through simulations.

Figures 26A, 26B:
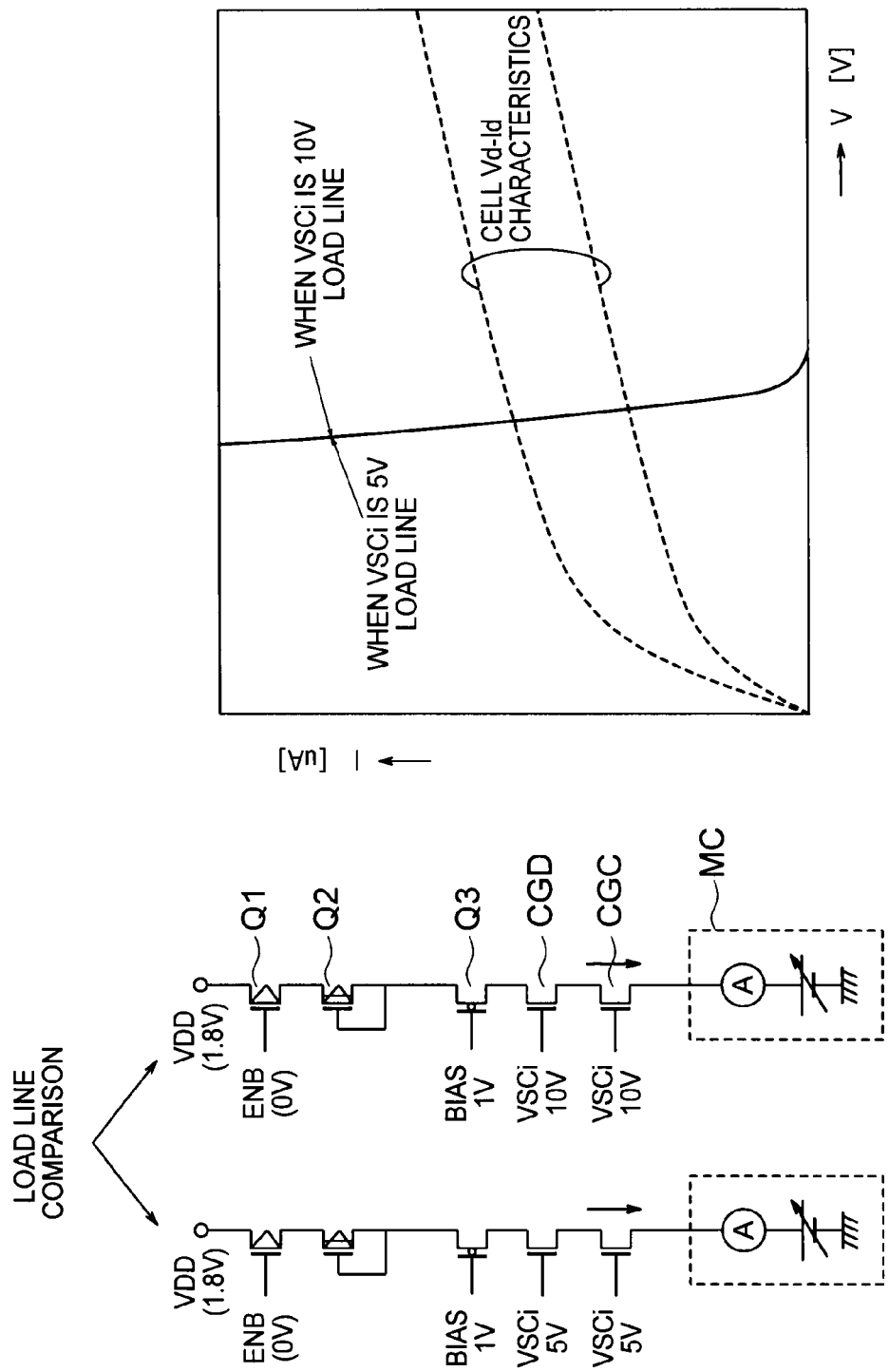
FIG. 26A is an equivalent circuit diagram showing the current paths in the vicinity of the sense amplifier.
FIG. 26B shows the results of a simulation performed on the voltage-current characteristics between the drain and the source of each transistor CGD.

FIG. 26A is an equivalent circuit diagram of load circuits provided in the sense amplifier 107. In FIG. 26A, transistors Q1 to Q3 connected in a cascade fashion are transistors in the sense amplifier 107, and transistors CGC and CGD are connected in a cascade fashion between the source of the transistor Q3 and a memory cell MC. Through simulations performed in the cases where the gate voltage of the transistors CGC and CGD is 5V and 10 V, the source voltage-current characteristics of the transistor CGC are examined.

FIG. 26B shows the results of simulations performed to examine the voltage-current characteristics of the source voltage of the transistor CGC and the current flowing between the drain and source of the transistor CGC. As can be seen from FIG. 26B, the same characteristics are obtained whether the gate voltage of the transistors CGC and CGD is 5 V or 10 V. The broken lines in FIG. 26B are graphs showing the characteristics of the drain voltage Vd–drain current Id of the memory cells MC. Since the control gate of the memory cell is fixed at approximately 5 V at the time of regular reading, the Id characteristics fluctuate with the threshold value of each memory cell MC. The current values at the cross points between the broken lines and the above two curves represent the currents flowing in the memory cells MC at the time of verify reading and regular reading.

As can be seen from FIG. 26B, the operating characteristics are not affected, even if the power supply voltage VSCi of the column decoder 116 is changed from 5 V to 10 V when verify reading is started. Accordingly, there are no problems in operations, even if the power supply voltage VSCi of the column decoder 116 is fixed at VDDH in the write sequence as in this embodiment.

In this embodiment, the power supply voltage VSWi is provided only for the pre-decoder 131 in the row decoder 115, and the power supply voltage VSW2i is supplied to the second pre-decoder 132, the row main decoder 133, and the row sub decoder 134. The power supply voltage VSW2i is fixed at the voltage VSW2 (9 V, for example) in the write sequence. The inventor performed simulations to examine whether the lowest voltage level that can be applied to the word lines WL can be provided through the voltage VSWi without any problems.

Figure 27B:
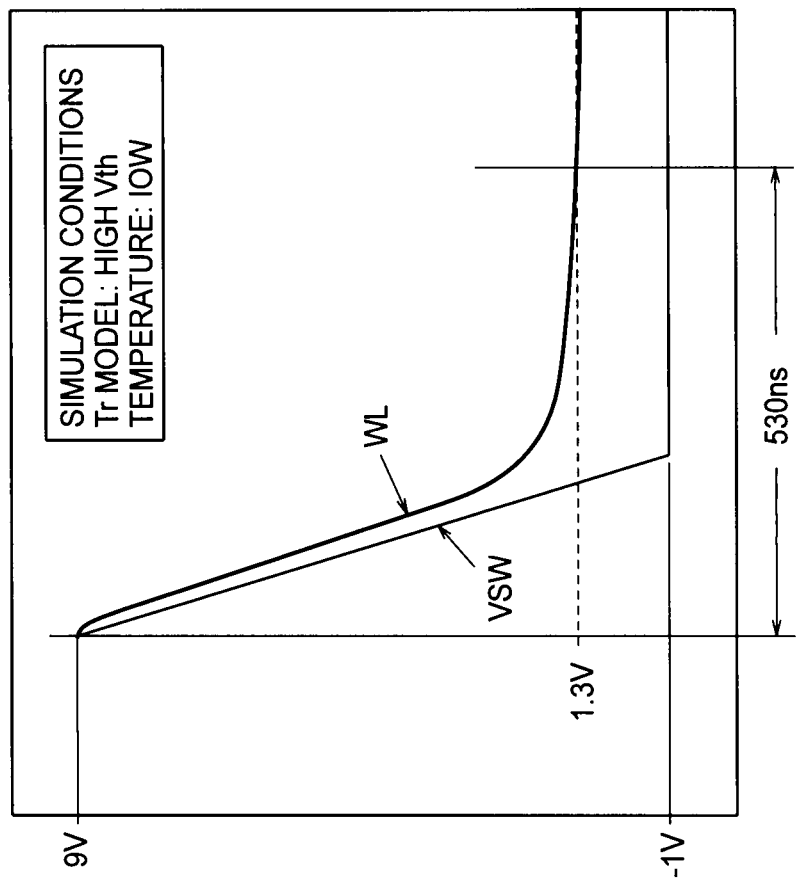
FIG. 27B is a graph showing the variation of the voltage of the select word lines.
Figure 27A:
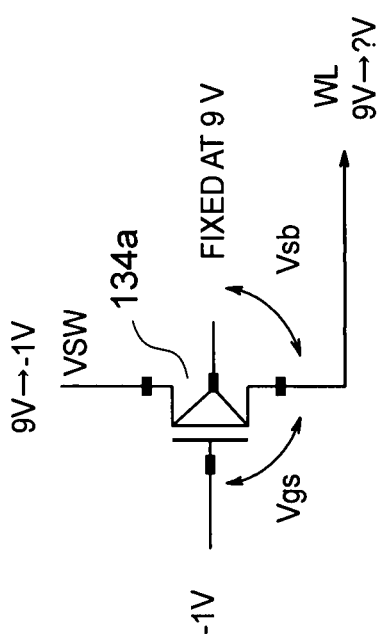
FIG. 27A shows the voltage at each terminal of the transistors in the row sub decoder.

FIG. 27A shows the voltages at the respective terminals of the PMOS transistor in the row sub decoder 134. FIG. 27B is a graph showing the variation of the voltage of the select word lines WL. In FIG. 27B, the abscissa axis indicates time, and the ordinate axis indicates voltage. FIG. 27B shows the waveforms of the power supply voltage VSW and the voltage of the select word lines WL.

As shown in FIG. 27A, in this embodiment, the power supply voltage VSW2i is fixed at the voltage VSW2 (9 V, for example) when the write sequence starts. The power supply voltage VSW2i is also supplied to the well of the PMOS transistor 134a in the row sub decoder 134. If the voltage VSW is lowered so as to lower the voltage of the select word lines WL in this state, a substrate bias effect occurs, and the threshold value of the PMOS transistor 134a becomes higher. As a result, the voltage of the word lines WL might not become lower than a certain voltage level.

FIG. 27B illustrates a case where the voltage of the select word lines WL varies when the voltage VSW is varied from 9 V to –1 V. While the source voltage of the PMOS transistor 134a is lowered from 9 V to –1 V, the voltage of the select word lines WL also varies from 9 V to 1.3 V, but does not become lower than that. In a NOR flash memory, however, the lowest voltage required for the select word lines WL to have when writing and verify reading are performed is approximately 1.8 V, and the characteristics shown in FIG. 27B cause no problems in actual operations.

The row sub decoder 134 shown in FIG. 23 has a 2-Tr structure including a NMOS transistor 134b as well as the PMOS transistor 134a. However, the row sub decoder 134 may have a 3-Tr structure further including another NMOS transistor, so as to protect the voltage of the select word lines WL from the influence of the substrate bias effect.

As described above, in the seventh embodiment, the power supply voltage VSWi is provided only for the first pre-decoder 131 in the row decoder 115. Accordingly, the load capacitance of the power supply voltage VSWi becomes smaller, and the transition speed of the voltage of the select word lines WL is increased. Meanwhile, the power supply voltage VSW2i having a voltage level that does not vary at the time of writing and verify reading is supplied to the second pre-decoder 132, the row main decoder 133, and the row sub decoder 134. Accordingly, the operating speed is not adversely affected even if the load capacitance of the power supply voltage VSW2i is large. Thus, the voltage of the select word lines WL can be promptly determined. Furthermore, the power supply voltage VSCi of the column decoder 116 is maintained at the same voltage level during each write period and each verify read period. In this manner, the power supply voltage transition time between writing and verify reading can be shortened, and high-speed writing can be performed.

Eighth Embodiment

An eighth embodiment of the present invention is characterized by the internal structure of the page buffer 109 of FIG. 23, and is designed to reduce the bit transitions in the column address signal and reduce the power consumption.

Figures 28, 29:
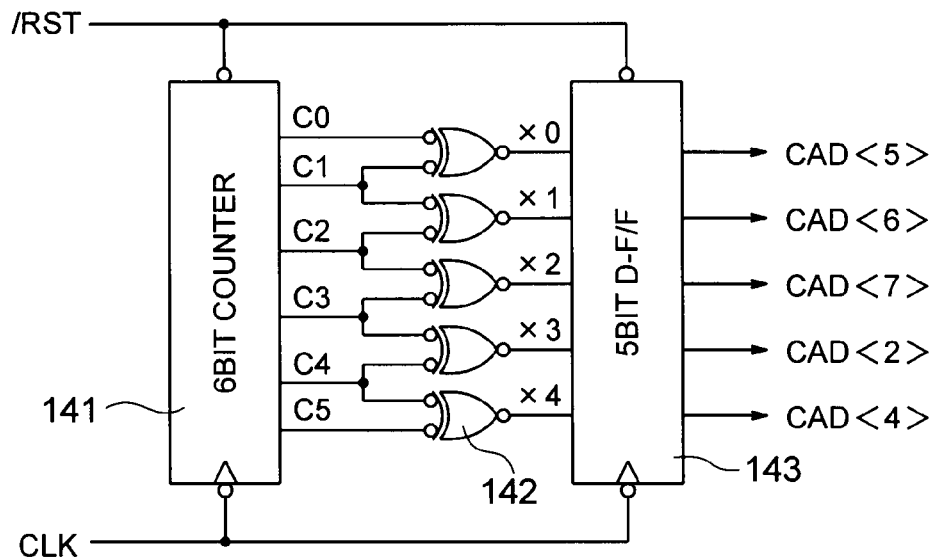
FIG. 28 is a block diagram showing an example of the column address generator provided in the page buffer of FIG. 23.
FIG. 29 illustrates an operation of the column address generator of FIG. 28.

FIG. 28 is a block diagram showing an example of a column address generator 140 provided in the page buffer 109 of FIG. 23. The column address generator 140 of FIG. 28 includes a 6-bit counter 141, five XOR (exclusive OR) circuits 142 that calculate the exclusive OR of each two adjacent bits of the output signal of the 6-bit counter 141, and a D-flip-flop (hereinafter, D-FF) 143 that latches the output signals of the XOR circuits 142.

Each of the XOR circuits 142 outputs a high-level signal when the logics of the two input signals are different, and outputs a low-level signal when the logics are the same.

FIG. 29 is a diagram for explaining the operation of the column address generator 140. The counter 141 increments "000000" by 1, and outputs "000001", "000010", "000011", "000100", . . . in sequential order. Since the five XOR circuits 142 calculate the exclusive OR of each two adjacent bits, the outputs of the XOR circuits 142 are "00000", "00001", "00011", "00010", "00110", . . . in sequential order.

In this manner, the outputs of the five XOR circuits 142 vary at only one bit of the address line when the address state transits to the next state. Accordingly, with the column address generator 140 of FIG. 28, the number of times the address bits change during address transitions can be minimized.

The D-FF 143 shuffles the outputs of the five XOR circuits 142, and supplies the shuffled outputs to the column address CAD <7:4, 2>.

Figure 30A:
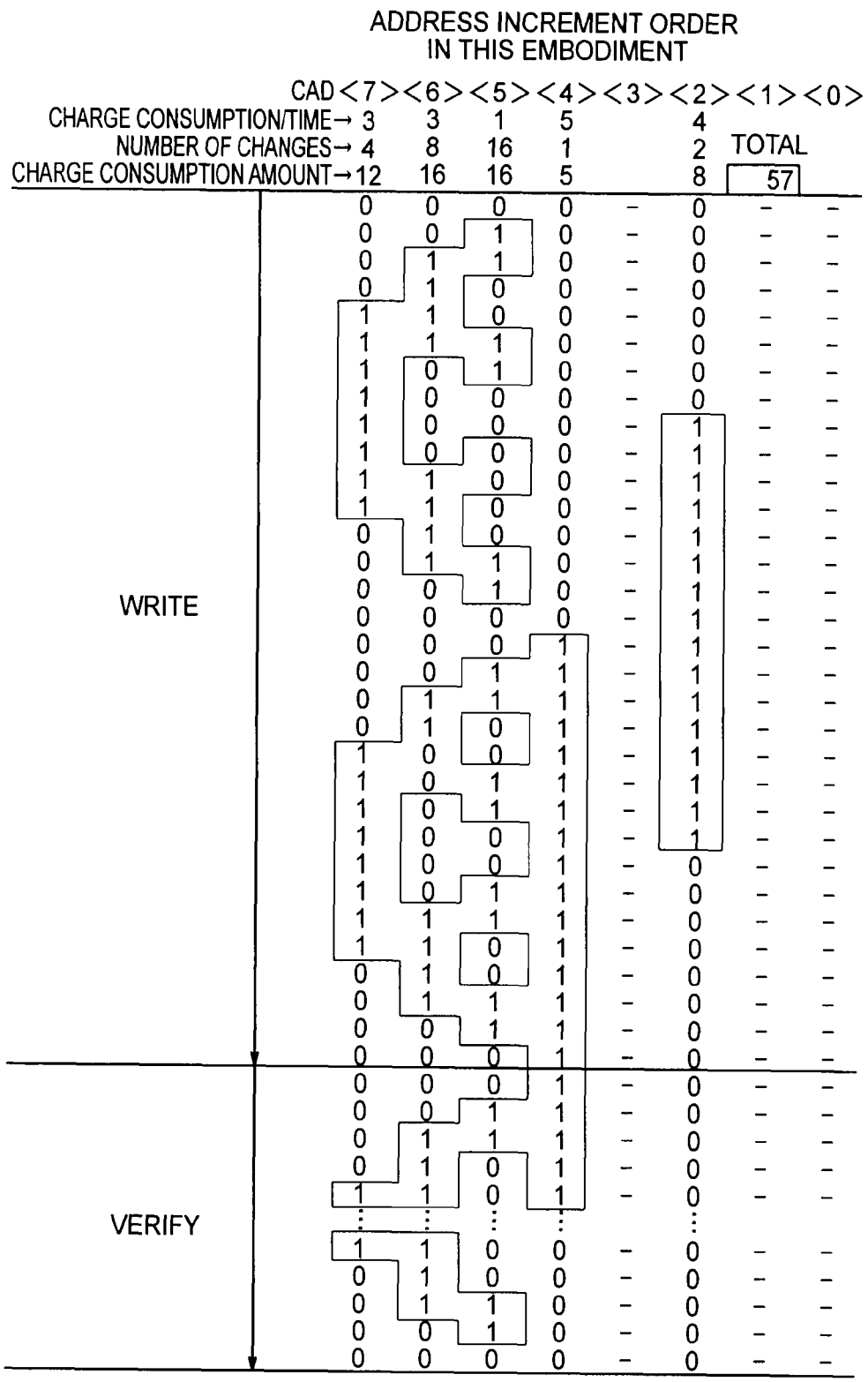
FIG. 30A shows the bit variation of the column address CAD<7-0> while writing and verify reading are performed.

FIG. 30A shows the bit variations in the column address CAD <7:0> at the time of writing and verify reading. As shown in FIG. 30A, the column address changes one bit at a time during each write period and each verify read period.

In FIG. 30A, the charge consumption corresponding to the variation of the gate voltage of the transistor CGB caused by switching the logic of CAD <2> is 4, for example. Likewise, the charge consumptions corresponding to CAD <4> to CAD <7> are weighted as 5, 1, 2, and 3, respectively. When the total sum is determined by calculating the products of the weights and the number of times the respective address bits change until the column address comes full circle, the charge consumption is approximately ¼ of the charge consumption in a case the total sum is obtained by incrementing the column address by 1 at a time as shown in FIG. 30B.

As described above, in the eighth embodiment, the column address is generated at the column address generator 140 in the page buffer 109 in such a manner that the number of address transitions becomes 1. Accordingly, the power consumptions at the column decoder 116 and the column gate circuit 108 can be greatly reduced, and the power supply circuit that generates VDDH in the charge pump and regulator 121 can be made smaller.

In an actual column address generating operation, the number of column addresses to be generated becomes smaller, as the number of memory cells MC in which writing is to be performed becomes smaller after verify is repeated. Therefore, a circuit for skipping column addresses at which a write pulse is not generated is provided. Also, the current flowing in the memory cells MC might become larger, depending on the write phases. Therefore, a circuit for performing sectional writing on a smaller number of bits (32 bits, for example) than 64 bits is provided. To sum up, it is necessary to form an address generator circuit that includes those circuits.

Ninth Embodiment

Figure 15:
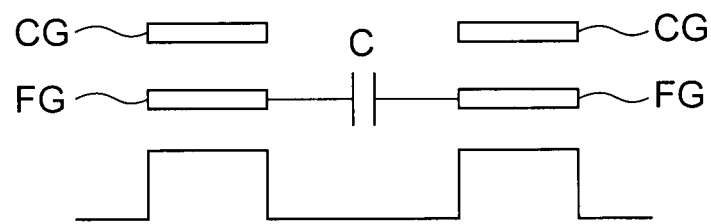
FIG. 15 is a schematic view for explaining the cause of an adjacency effect in a conventional flash memory.
Figure 16:
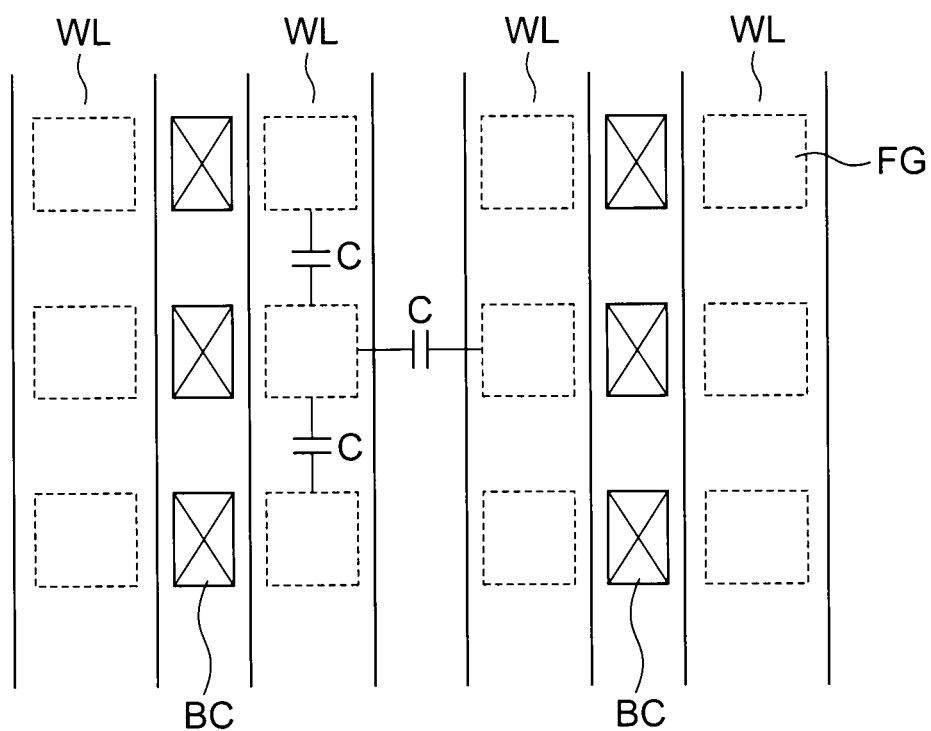
FIG. 16 is a plan view for explaining the range influenced by an adjacency effect in a conventional NOR flash memory.

When electrons are injected into the floating gate FG of a memory cell MC in a flash memory, capacitance coupling is caused between the floating gate FG and the floating gate FG of an adjacent memory cell MC, and an adjacency effect is caused as the threshold voltage of the adjacent memory cell MC is varied, as shown in FIG. 15.

To prevent the adjacency effect in a flash memory, it is necessary to minimize the threshold value variation in each adjacent memory cell MC, after the threshold value of the memory cell MC in which writing is to be performed is adjusted. Therefore, the threshold values of the memory cells that cause an adjacency effect on one another need to be adjusted at the same time.

Also, in a regular NOR flash memory, the memory capacity is larger for erasing by the block than for writing by the page, and erasing cannot be performed only on a memory cell MC having excess writing performed thereon. Therefore, attention should be paid to excess writing when the threshold values of the memory cells are controlled at the time of writing.

The ninth embodiment of the present invention is characterized by a method of controlling the threshold value of each memory cell MC in a NOR flash memory.

As shown in FIG. 2, the memory cells MC in this embodiment have the erased state (11), and three written states (10), (00), and (01). The threshold value of each memory cell MC in the state (10) is within the range of Vth1 to (Vth1+Wth1). The threshold value of each memory cell MC in the state (00) is within the range of Vth2 to (Vth2+Wth2). The threshold value of each memory cell MC in the state (01) is within the range of Vth3 to (Vth3+Wth3). To allow the sense amplifier 107 to determine each state at the time of data regular reading, the relationships, Vth2>Vth1+Wth1 and Vth3>Vth2+Wth2, need to be satisfied.

Before threshold value control is performed on the memory cells MC at the time of writing, all the memory cells MC are in the erased state (11). In the erased state, the upper limit of the threshold value of each memory cell MC is Vth0 (<Vth1) or lower, and the lower limit is set at 0 V or higher. This is because, if the threshold values of the memory cells MC are in an excess erased state at a lower value than 0 V, current leakage from the bit lines occurs when the voltage of the select word lines WL is 0 V. By repeatedly performing weak writing and verify reading after data erasing, the threshold value of each memory cell MC in the erased state (11) is set between 0 and Vth0.

Figure 31:
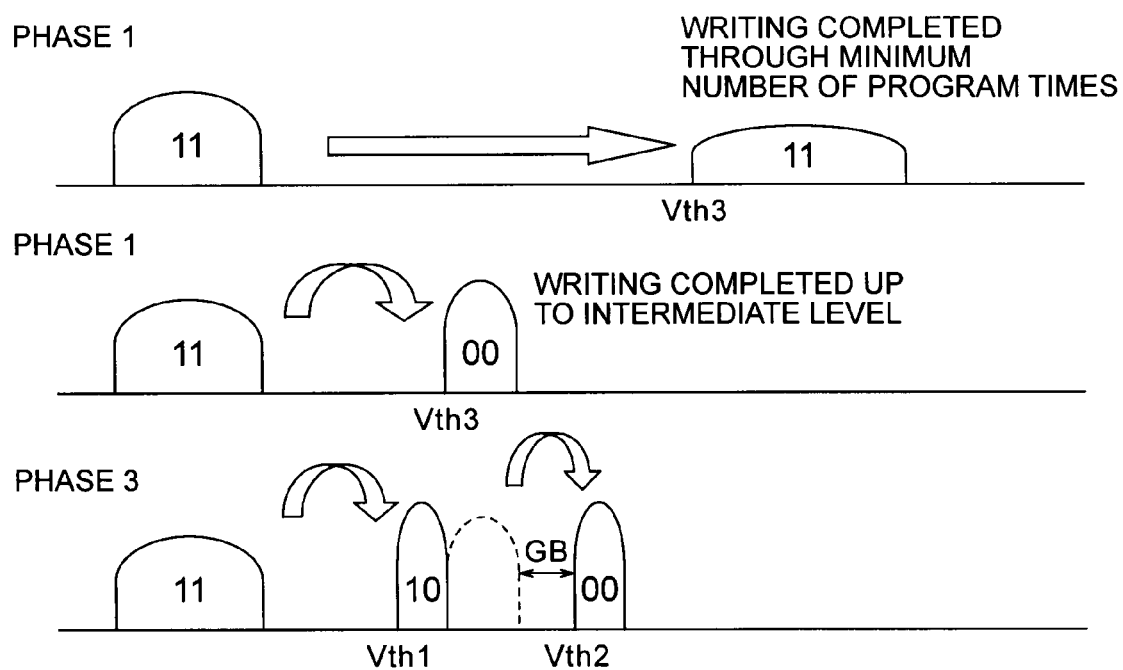
FIG. 31 is a schematic view for explaining the threshold value control operation to be performed on the memory cells in this embodiment.
Figure 32:
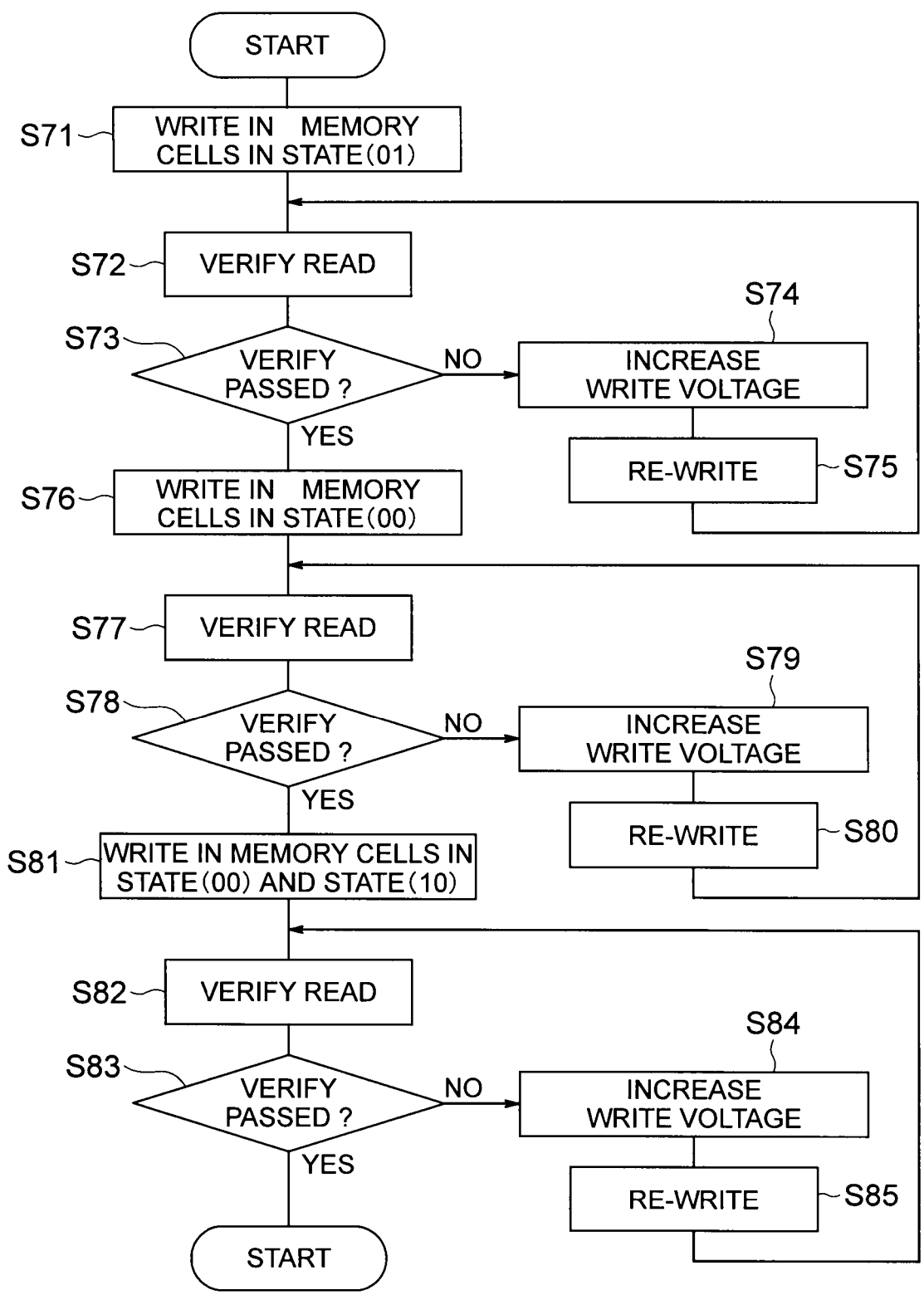
FIG. 32 is a flowchart showing an example of the procedures in the threshold value control operation to be performed on the memory cells.

FIG. 31 schematically illustrates the threshold value control operation on the memory cells MC. FIG. 32 is a flowchart showing an example of the procedures in the threshold value control operation to be performed on the memory cells MC. In this embodiment, writing is performed in three stages of Phases 1 to 3. Referring to FIG. 31 and the flowchart of FIG. 32, the threshold value control operation in accordance with this embodiment is described in sequential order.

In Phase 1, threshold value control is performed on the state (01). As shown in FIG. 31, the threshold value is the highest in the state (01). Even if excess writing is performed, overlapping with another state is not caused, and it is not necessary to take the adjacency effect into consideration. Accordingly, a high voltage is supplied to the gate of the memory cell MC via a select word line WL from the start, and the threshold value distribution of the state (01) is formed through the required smallest number of write operations.

More specifically, the gate voltage corresponding to the target threshold value Vth3 of the state (01) is supplied to the memory cell MC, so as to dramatically increase the threshold value (step S71). More preferably, the threshold value distribution of the state (01) is formed only through one-time writing. After the writing, verify reading is performed (step S72) to determine whether the threshold value has reached the target threshold value (step S73). Where the threshold value has not reached the target threshold value, a higher voltage is supplied to the gate of the memory cell MC via the select word line WL (step S74), and re-writing is performed (step S75). One of the features of this embodiment lies in that the threshold value distribution of the state (01) is ultimately decided in Phase 1. Since the threshold value control on the state (01) is completed in Phase 1, the threshold values of the states (10) and (00) are not varied due to an adjacency effect caused by the threshold value control on the state (01).

If the threshold value is determined to have reached the target threshold value in step S73, the operation moves on to Phase 2. In Phase 2, the threshold value control on the state (00) is performed. As shown in FIG. 31, the state (00) has the second highest threshold value, and it is dangerous to perform writing by supplying a high voltage to the gate of the memory cell MC from the start. Therefore, in Phase 2, an initial voltage corresponding to a threshold value (almost at the middle between Vth2 and Vth3) lower than the target threshold value Vth2 is supplied to the gate of the memory cell MC (step S76), and writing is performed roughly up to an intermediate level.

In Phase 2, writing is not completed through the minimum number of write times as in Phase 1, but writing is performed with a slightly lower initial voltage. While the voltage is gradually increased, the writing and verify reading are repeated, and the threshold value is increased to the intermediate level (steps S77 to S80).

As will be described later, in Phase 3, writing in the state (10) is performed. Since the threshold value of the state (00) becomes higher due to the influence of the writing in the state (10), the threshold value of the intermediate level is set, with the amount of increase being taken into account.

If the threshold value is determined to have reached the target threshold value in step S78, the operation moves on to Phase 3. In Phase 3, writing in the states (00) and (10) is performed. A low initial voltage is also set in Phase 3, so that the threshold value falls within the range shown in FIG. 31. The writing in the state (10) and verify reading are then performed. While the voltage is gradually increased, the writing and verify reading are repeated, so as to narrow the (10) distribution. When the gradually increasing voltage reaches the initial voltage level of the state (00) writing, the writing in the state (00) is started. Where the state (10) distribution has not reached the verify level, writing is performed on both distributions. In this manner, the threshold value distributions of the states (00) and (10) are narrowed, so as to form the threshold value distributions shown in FIG. 31 (steps S81 to S85).

Since only the writing in the state (00) is completed up to the intermediate level in Phase 2, and writing in the states (00) and (10) is then performed in Phase 3, there is no possibility of an adjacency effect caused on each other, and the threshold value variations can be restricted. If the writing in the state (10) is first performed in Phase 3, there is a point when the voltage becomes the same as the initial voltage of the writing in the state (00), while the voltage is being increased stepwise for cells with poor write characteristics. In such a case, the writing in the state (10) and the writing in the state (00) are performed at the same time, so as to realize short-time programming.

As described above, in this embodiment, the writing in the state (01) with the highest threshold value distribution is performed in Phase 1, and the threshold value distribution of the state (01) is ultimately decided. Accordingly, there is no need to perform the threshold value control on the state (01) in the later phases, and to consider an adjacency effect due to the threshold value control on the state (01). The writing in the state (00) is performed up to the intermediate level in Phase 2, and the threshold value distributions of the states (00) and (10) are formed in Phase 3. Accordingly, an adjacency effect is not caused between the states (00) and (10), and the threshold value control can be performed with high precision.

In accordance with this embodiment, only the writing in the state (01) is first performed, and only the writing in the state (00) is then performed. Lastly, the writing in the states (00) and (10) is performed to complete the writing. In this manner, the number of commands to be issued for the writing can be reduced. Accordingly, the number of program codes to be supplied to the internal controller 114 via the command register 113 can be reduced, and the processing load on the internal controller 114 can also be reduced. Furthermore, the program becomes easier to create, and it becomes possible to save the programmer the trouble of creating a complicated program.

Tenth Embodiment

A tenth embodiment of the present invention is characterized by fixing the voltage of the select word lines WL of non-selected memory cells MC to a negative constant value at the time of writing.

In a NOR flash memory, the memory cells MC connected to the same bit line are connected to different select word lines WL from one another, as shown in FIG. 20. At the time of writing, one of the select word lines WL is selected, and writing is performed on the memory cells MC on the selected select word line WL. However, in a case where a leakage current flows into the memory cells MC connected to non-selected select word lines WL, the voltage of the bit lie varies, and the write characteristics of the selected memory cell MC is adversely affected.

To counter this problem, the voltage of the select word lines WL of non-selected memory cells MC is lowered to a negative side (−1 V, for example), so as to restrict current leakage. At the time of writing, however, the select word line WL connected to a selected memory cell MC might have a considerably high voltage (9 V, for example). In such a case, the potential difference in voltage between the select word line WL of the selected memory cell MC and the select word line WL of an adjacent non-selected memory cell MC becomes large (10 V in this case), and exceeds the pressure tolerance of the row decoder 115 in the selected bank shown in FIG. 23. As a result, a problem is caused in the reliability.

Figure 33:
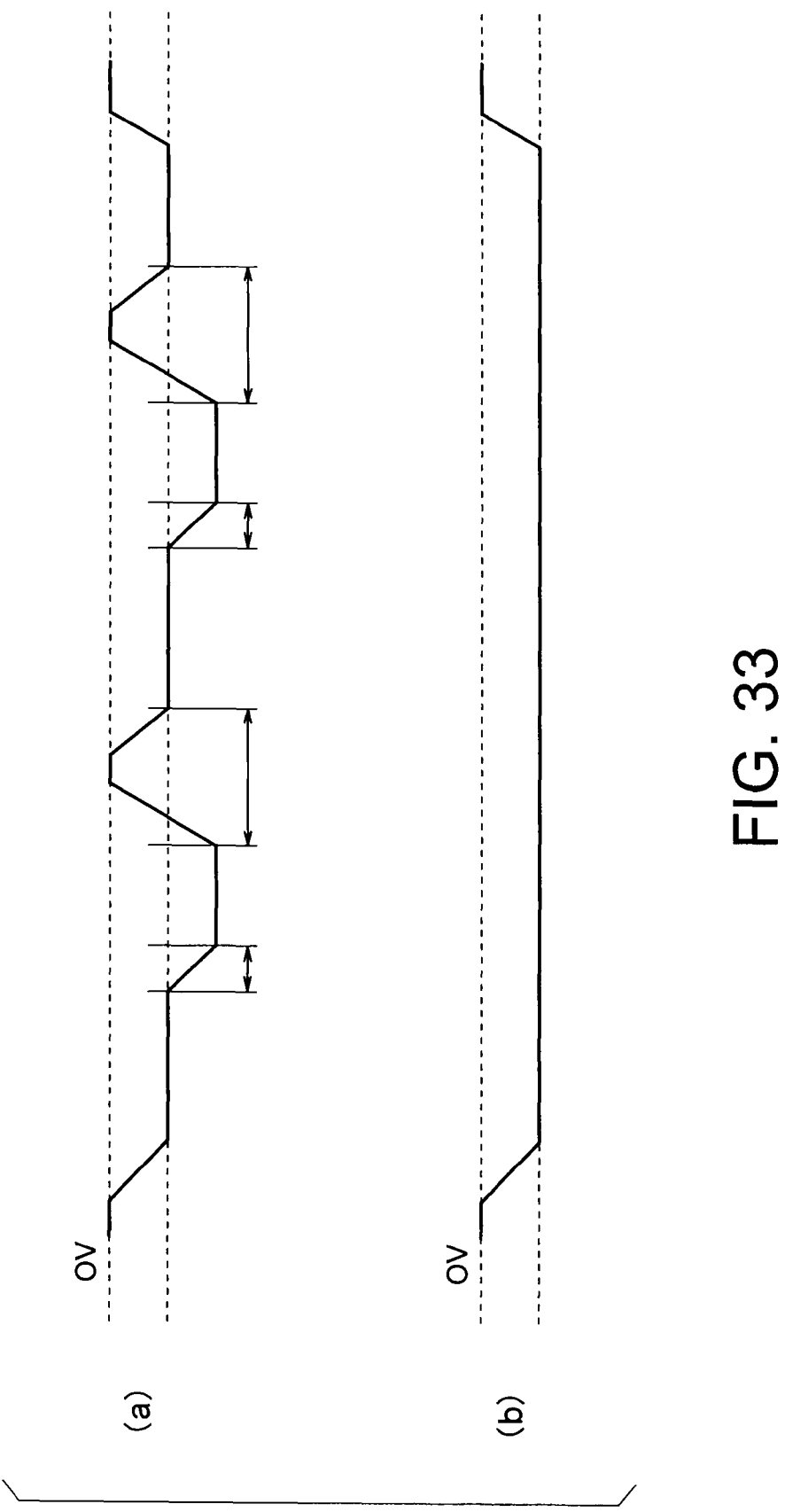
FIG. 33(a) shows an example case where the voltage of the non-select word lines of non-selected memory cells is switched between two negative voltages.
FIG. 33(b) shows an example case where the voltage of the non-select word lines WL is fixed as a predetermined negative voltage.

As a technique to solve the above problem, the voltage of the non-select word lines WL of non-selected memory cells MC may be controlled in accordance with the voltage of the select word line WL of the selected memory cell MC at the time of writing. FIG. 33(a) shows an example case where the voltage of the non-select word lines WL of non-selected memory cells MC is switched between two negative voltages in accordance with the voltage of the select word line WL of the selected memory cell MC.

When the voltage of the non-select word lines WL of the non-selected memory cells MC is controlled in a minute manner as shown in FIG. 33(a), the difference in potential between the select word lines WL and the non-select word lines can be prevented from exceeding the pressure tolerance. However, the voltage control operation to be performed on the word lines WL becomes complicated, and the number of program codes to be supplied to the internal controller 114 through the command register 113 becomes larger. Also, as indicated by the arrows in FIG. 33(a), the latency time until the voltage of the non-select word lines WL is stabilized becomes longer, and the switching between the writing and the verify reading cannot be performed promptly.

In this embodiment to solve the above problem, the voltage of the non-select word lines WL of the non-selected memory cells MC is fixed at a predetermined negative voltage at the time of writing and verify reading, as shown in FIG. 33(b). If the negative voltage is −1 V or lower, the difference in potential between the select word lines WL and the non-select word lines WL might exceed the pressure tolerance. Therefore, it is preferable that the negative voltage is set at a value lower than 0 V but higher than −1 V. The negative voltage level should be set at the optimum value in accordance with the characteristics of the memory cells MC and the likes.

In a NOR flash memory, after writing is performed, verify reading is performed to determine whether the threshold value of the memory cell MC has increased to a desired voltage level. In the verify reading, a gate voltage that is set in accordance with the desired threshold value is supplied to the memory cell MC in which the writing has been performed, and the verify reading is then performed. When the operation is switched from the writing to the verify reading, the voltage of the select word line WL connected to the gate of the memory cell MC also needs to be switched to the verify voltage level.

Figure 34:
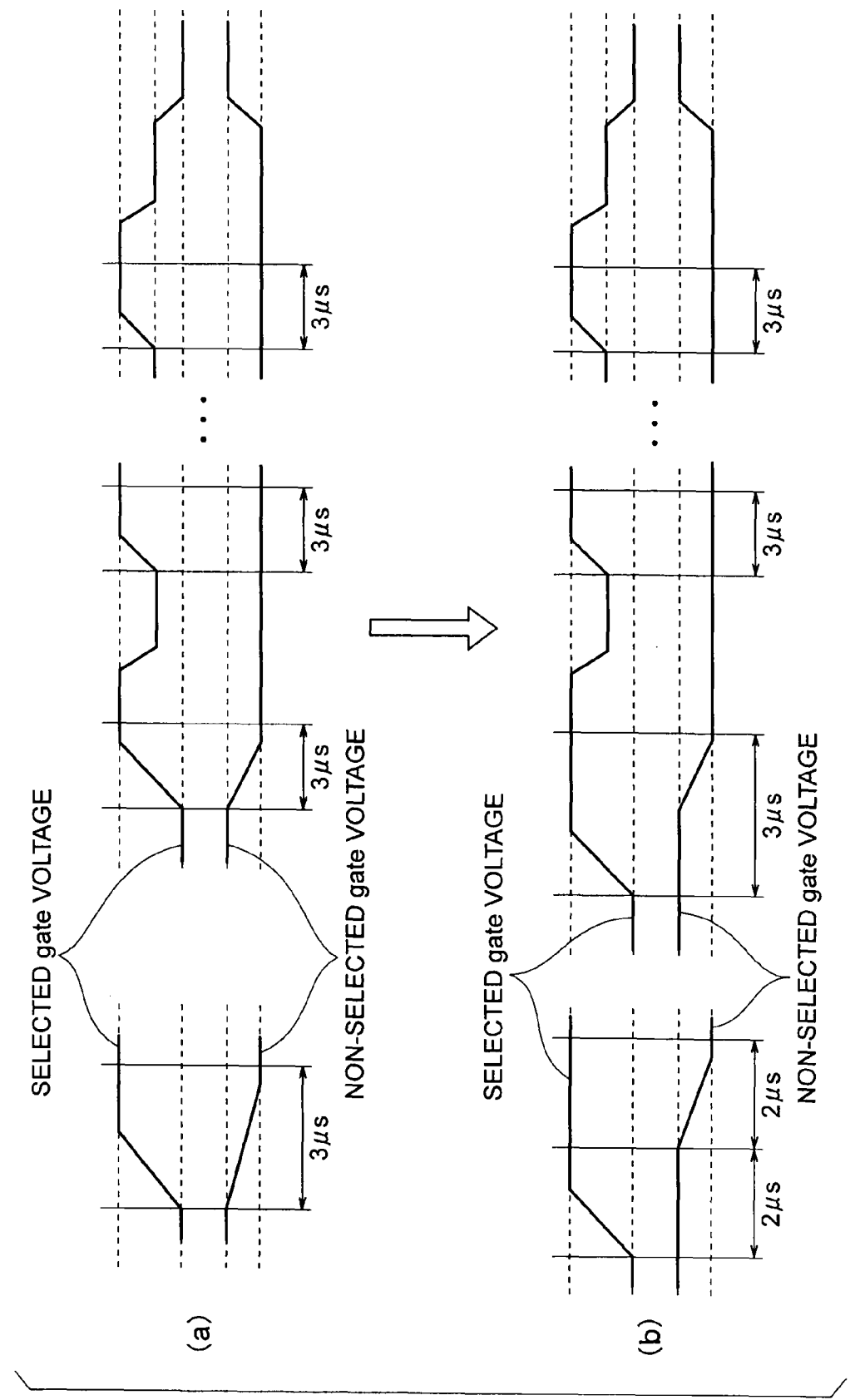
FIG. 34(a) is a voltage waveform chart showing an example case where the voltage control operation on the selected memory cell and the voltage control operation on the word lines WL of the non-selected memory cells are performed in synchronization with each other.
FIG. 34(b) is a voltage waveform chart showing an example case where the voltage control operation on the word lines WL of the selected memory cell and the voltage control operation on the word lines WL of the non-selected memory cells are performed separately from each other.

To set the word lines WL at the write voltage level, it is necessary to secure a time for performing boosting with the charge pump and regulator 121. In conventional cases, the voltage level of the non-select word lines WL of non-selected memory cells MC is adjusted when the voltage level of the select word line WL of select memory cells MC is set. FIG. 34(a) is a voltage waveform chart showing an example case where the voltage control operation on the selected memory cell MC is performed in synchronization with the voltage control operation on the non-select word lines WL of the non-selected memory cells MC. In the case shown in FIG. 34(a), the voltage level of the selected memory cell MC is switched in synchronization with the voltage level switching of the word lines WL of the non-selected memory cells MC. Accordingly, a write operation cannot be started until the voltage switching of both kinds of word lines WL is completed. The simultaneous voltage switching with the charge pump and regulator 121 takes longer than separate pressure increasing and reducing operations, due to the influence of capacitance coupling. Therefore, a switching period of approximately 3 ns is provided.

In this embodiment, on the other hand, the time for adjusting the voltage of the word line WL of the selected memory cell MC is set separately from the time for adjusting the voltage of the word lines WL of non-selected memory cells MC, as shown in FIG. 34(b). When writing is performed, writing and verify reading need to be repeated until the threshold value distribution of the selected memory cell MC is decided. In this process, a new write voltage is generated every time writing is performed. In this embodiment, the voltage of the non-select word lines WL of the non-selected memory cells MC is fixed, as shown in FIG. 33(b). Accordingly, there is no need to change the non-select word lines WL of the non-select memory cells MC, while writing and verify reading is repeatedly performed on the selected memory cell MC. Thus, the switching period for the voltage of the select word line WL of the selected memory cell MC can be further shortened. In the example case shown in FIG. 34(b), the switching period is 2 µs.

In this embodiment, the switching period for the voltage of the select word line WL of the selected memory cell MC can be set, without the switching period for the voltage of the non-select word lines WL of the non-selected memory cells MC being taken into consideration. Accordingly, the switching period for the voltage of the select word line WL of the selected memory cell MC can be made even shorter.

In FIG. 34(b), the switching period for the voltage of the non-select word lines WL of non-selected memory cells MC has a margin of 2 µs. At the beginning of the write sequence, 2 ns+2 ns=4 ns is required as the switching period for the voltage of the word lines WL of the selected memory cell MC and the non-selected memory cells MC. After that, only the switching period of 2 ns for the voltage of the select word line WL of the selected memory cell MC is required, and the switching of the voltage of the select word line WL can be performed at high speed while writing and verify reading are performed.

As described above, in the tenth embodiment, the voltage of the non-select word lines WL of non-selected memory cells MC is fixed at a predetermined negative voltage while writing and verify reading are performed. Accordingly, the voltage control operation on the select word lines WL becomes easier, and the number of program codes for controlling the internal controller 114 can be reduced. Thus, the load on the programmer can be reduced. Also, the processing speed of the internal controller 114 can be increased.

Since the time for changing the voltage of the select word line WL of the selected memory cell MC in which writing is to be performed is set separately from the time for changing the voltage of the non-select word lines WL of the non-selected memory cells MC, the switching period for the voltage of the select word line WL of the selected memory cell MC can be shortened, and writing and verify reading can be performed at high speed.

Other Embodiments

The NOR flash memories of the above described first to tenth embodiments may be used as memory devices in various electric appliances and electronic devices. In the following, an example case where the semiconductor chip 20 is used in a portable telephone device as an example of an electronic device is described.

Figure 35:
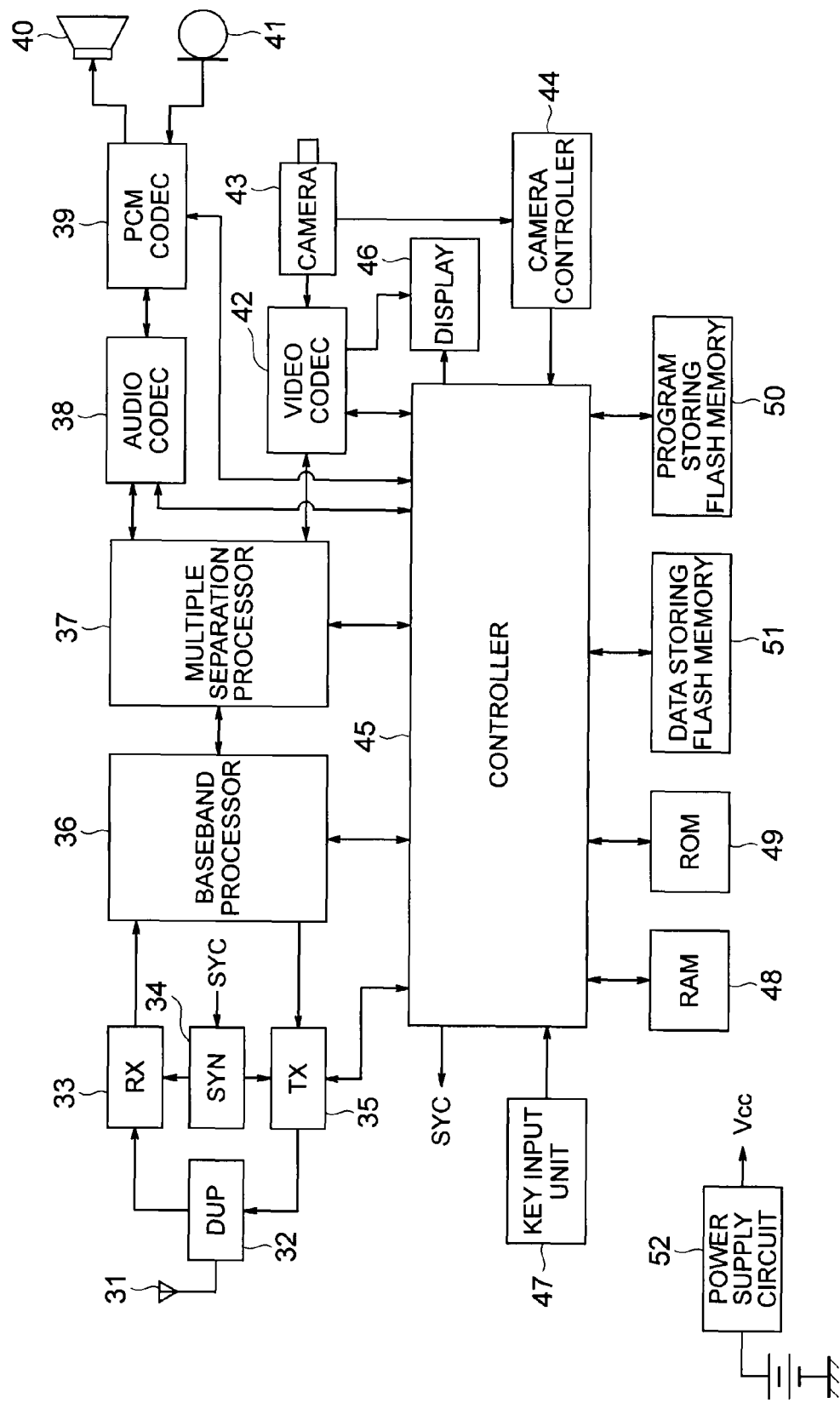
FIG. 35 is a block diagram showing an example internal structure of a portable telephone device.

FIG. 35 is a block diagram showing an example internal structure of the portable telephone device. The portable telephone device of FIG. 35 includes: an antenna 31; a duplexer 32 that switches transmission and reception signals; a receiving circuit 33 that converts a radio signal into a baseband signal; a frequency synthesizer 34 that generates a locally oscillated signal for transmission and reception; a transmitting circuit 35 that generates a radio signal by modulating a transmission signal; a baseband processor 36 that generates a reception signal in a predetermined transmission format based on the baseband signal; a multiple separation processor 37 that divides the reception signal into audio data, video data, and text data; an audio codec 38 that decodes the audio data and generates a digital audio signal; a PCM codec 39 that PCM decodes the digital audio signal and generates an analog audio signal; a speaker 40; a microphone 41; a video codec 42 that decodes the video data and generates a digital video signal; a camera 43; a camera controller 44; a controller 45 that controls the entire portable telephone device; a display 46; a key input unit 47; a RAM 48; a ROM 49; a flash memory 50 for storing programs; a flash memory 51 for storing data; and a power supply circuit 52.

In FIG. 35, the NOR flash memory 100 described in the first to tenth embodiments is used as the flash memory 50 for storing programs, and the NAND flash memory is used as the flash memory 51 for storing data. If possible, the first to tenth embodiments, specifically, the method for controlling threshold values may be applied to the NAND flash memory.

Figure 36:
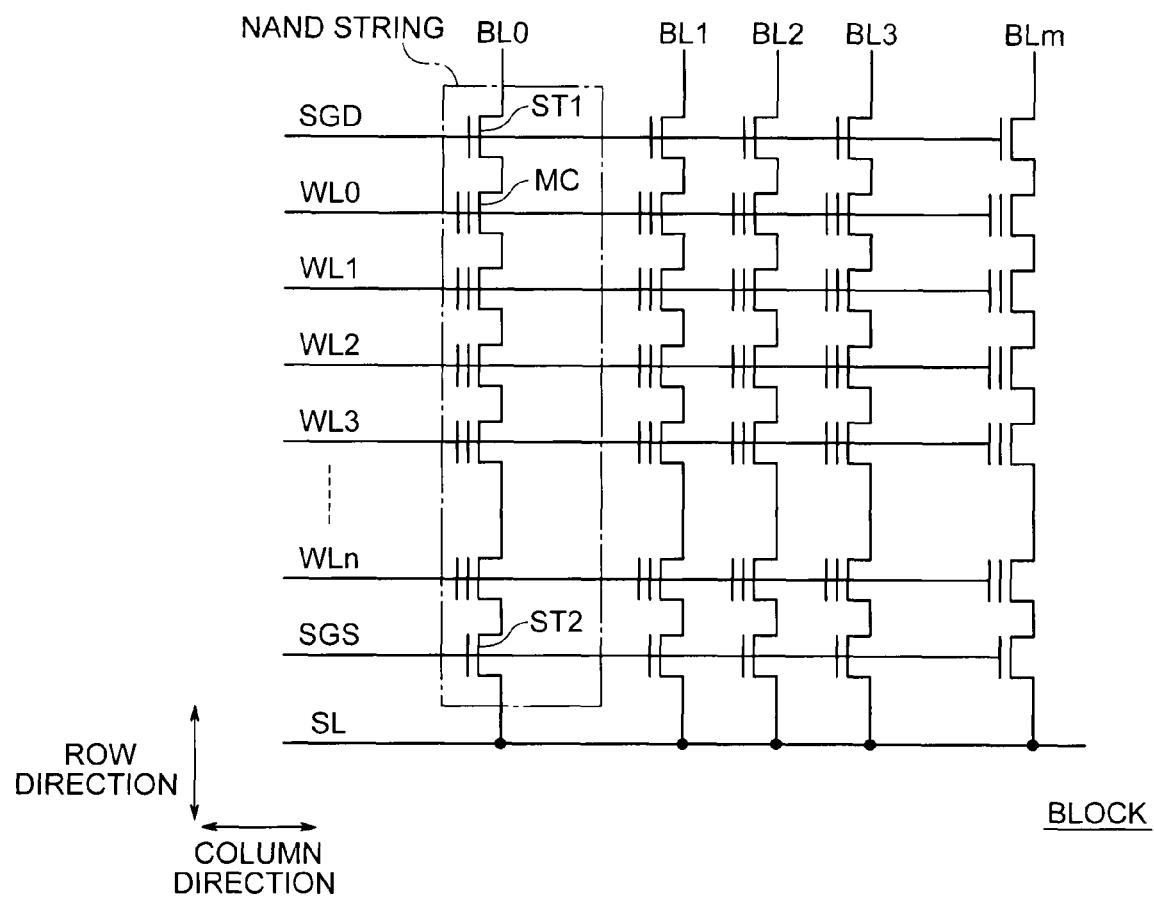
FIG. 36 is a circuit diagram showing the arrangement of a block included in the NAND flash memory.

The NAND flash memory is formed by arranging a plurality of blocks as minimum units of data erase. FIG. 36 is a circuit diagram showing the arrangement of a block included in the NAND flash memory. Each block includes (m+1) NAND strings arranged in order along the column direction (m is an integer of 0 or more). A selection transistor ST1 included in each of the (m+1) NAND strings has a drain connected to a corresponding one of bit lines BL0 to BLm, and a gate connected to a common selection gate line SGD. A selection transistor ST2 included in each of the (m+1) NAND strings has a source connected to a common source line SL, and a gate connected to a common selection gate line SGS.

In each NAND string, (n+1) memory cells MC are arranged between the source of the selection transistor ST1 and the drain of the selection transistor ST2 such that the current paths of the memory cells MC are connected in series (n is an integer of 0 or more). That is, the (n+1) memory cells MC are connected in series in the row direction such that adjacent cells share the diffusion region (source region or drain region).

Control gate electrodes are connected to word lines WL0 to WLn in order from the memory cell MC positioned closest to the drain side. Accordingly, the drain of the memory cell MC connected to the word line WL0 is connected to the source of the selection transistor ST1, and the source of the memory cell MC connected to the word line WLn is connected to the drain of the selection transistor ST2.

The word lines WL0 to WLn connect the control gate electrodes of the memory cells MC together between the NAND strings in the block. That is, the control gate electrodes of the memory cells MC in the same row in the block are connected to the same word line WL. The (m+1) memory cells MC connected to the same word line WL are handled as a page, and data write and read are performed page by page.

The bit lines BL0 to BLm connect the drains of the selection transistors ST1 together between the blocks. That is, the NAND strings in the same column in a plurality of blocks are connected to the same bit line BL.

Each memory cell MC is a metal oxide semiconductor field effect transistor (MOSFET) having a stacked gate structure formed on a semiconductor substrate. The stacked gate structure is formed by sequentially stacking a gate insulating film, charge storage layer (floating gate electrode), inter-gate insulating film, and control gate electrode on the semiconductor substrate. The memory cell MC changes its threshold voltage in accordance with the number of electrons stored in the floating gate electrode, and stores data in accordance with the difference between the threshold voltages. The memory cell MC can be designed to store binary data (one bit) or multi-level data (data having two or more bits).

The structure of the memory cell MC is not limited to the structure having the floating gate electrode, and may also be a structure such as a metal-oxide-nitride-oxide-silicon (MONOS) structure in which the threshold value can be adjusted by trapping electrons in the interface of a nitride film as a charge storage layer. The memory cell MC having this MONOS structure may also be designed to store one bit or multilevel data (data having two or more bits).

Although it may be obvious to those skilled in the art that additional effects of the present invention can be achieved and various modifications can be made to the above embodiments, the present invention is not limited to the above specific examples. Various additions, modifications, and partial deletions may be made to them, without departing from the spirit and scope of the invention based on the contents defined in the claims and their equivalents.

What is claimed is:

1. A method for controlling threshold values in a nonvolatile semiconductor memory device that includes a plurality of memory cells comprising a first memory cell and a second memory cell, each of the plurality of memory cells being capable of having a multi-value state by adjusting threshold voltages, and a word line connected to the memory cells, writing being performed by applying a write voltage to the word line, the method comprising:
performing a first operation so that the threshold value of the first memory cell is adjusted to a neighborhood of a first target threshold value, the first operation including a first writing on the first memory cell without verify reading being performed, the first target threshold value being different from the threshold value of an erased state;

performing a second operation after performing the first operation so that the threshold value of the second memory cell is adjusted to a neighborhood of a second target threshold value, the second operation including a second writing on the second memory cell without verify reading being performed, the second target threshold value being different from both the first target threshold value and the threshold value of an erased state;

performing a third operation until a threshold value on the first memory cell becomes equal to or higher than the first target threshold value after performing the second operation, the third operation including a third writing and a first verify reading on the first memory cell; and performing a fourth operation until a threshold value on the second memory cell becomes equal to or higher than the second target threshold value after performing the third operation, the fourth operation including a fourth writing and a second verify reading on the first memory cell.

2. The method according to claim 1, wherein the first target threshold value is a highest target threshold value, and the second target threshold value is between the threshold value of the erased state and the highest target threshold value.

3. The method according to claim 1, wherein, when a suspend operation is caused during the first to fourth operations, the writing is suspended, when the suspend operation is caused during the third operation, the first verify reading is performed prior to the third writing after the suspend operation is resumed, and when the suspend operation is caused during the fourth operation, the second verify reading is performed prior to the fourth writing after the operation is resumed.

4. A method for controlling threshold values in a nonvolatile semiconductor memory device that includes a plurality of memory cells comprising a first memory cell and a second memory cell, each of the plurality of memory cells being capable of having a multi-value state by adjusting threshold voltages, and a word line connected to the memory cells, writing being performed by applying a write voltage to the word line, the method comprising:
performing a first operation so that the threshold value of the first memory cell is adjusted to a neighborhood of a first target threshold value, the first operation including a first writing on the first memory cell without verify reading being performed, the first target threshold value being different from the threshold value of an erased state;

performing a second operation after performing the first operation so that the threshold value of the second memory cell is adjusted to a neighborhood of a second target threshold value, the second operation including a second writing on the second memory cell without verify reading being performed, the second target threshold value being different from both the first target threshold value and the threshold value of an erased state;

performing a third operation until a threshold value on the first memory cell becomes equal to or higher than the first target threshold value after performing the second operation, the third operation including a third writing and a first verify reading on the first memory cell;

performing a fourth operation until a threshold value on the second memory cell becomes equal to or higher than the second target threshold value after performing the third operation, the fourth operation including a fourth writing and a second verify reading on the first memory cell;

performing a fifth operation until a threshold value on the first memory cell becomes equal to or higher than a third target threshold value after performing the fourth operation, the fifth operation including a fifth writing and a third verify reading on the first memory cell, the third target threshold value being higher than the first target threshold value; and performing a sixth operation until a threshold value on the second memory cell becomes equal to or higher than the fourth target threshold value after performing the fifth operation, the sixth operation including a sixth writing and a fourth verify reading on the first memory cell.

5. The method according to claim 4, wherein the first target threshold value is a highest target threshold value, and the second target threshold value is between the threshold value of the erased state and the highest target threshold value.

6. The method according to claim 4, wherein, when a suspend operation is caused during the first to fourth operations, the writing is suspended, when the suspend operation is caused during the third operation, the first verify reading is performed prior to the third writing after the suspend operation is resumed, and when the suspend operation is caused during the fourth operation, the second verify reading is performed prior to the fourth writing after the operation is resumed.

7. A method for controlling a threshold value in a nonvolatile semiconductor memory device that includes a plurality of memory cells each capable of having a multi-value state by adjusting a threshold voltage, and a word line connected to the memory cells, verify reading being performed on the memory cells to be adjusted to a state other than an erased state, writing being performed on the memory cells having not reached a target threshold value by increasing a write voltage to be applied to the word line, the method comprising:
performing writing simultaneously on a first memory cell to be adjusted to a first target threshold value and a second memory cell connected to the same word line as the first memory cell, when the write voltage to be applied to the word line at the time of writing on the first memory cell becomes equal to or higher than a write start voltage of the second memory cell to be adjusted to a second target threshold value next higher than the first target threshold value;

performing writing collectively on a first predetermined number of the memory cells, with a first negative voltage being applied to unselected ones of the word lines, when the write voltage is lower than a predetermined value; and performing writing collectively on a second predetermined number of the memory cells, with a second negative voltage higher than the first negative voltage being applied to the unselect word lines, when the write voltage is equal to or higher than the predetermined value, the second predetermined number of the memory cells being smaller than the first predetermined number of the memory cells.

8. A method for controlling a threshold value in a nonvolatile semiconductor memory device that includes a plurality of memory cells each capable of having a multi-value state by adjusting a threshold voltage, and a word line connected to the memory cells, verify reading being performed on the memory cells to be adjusted to a state other than an erased state, writing being performed on the memory cells having not reached a target threshold value by increasing a write voltage to be applied to the word line, the method comprising:
performing writing simultaneously on a first memory cell to be adjusted to a first target threshold value and a second memory cell connected to the same word line as the first memory cell, when the write voltage to be applied to the word line at the time of writing on the first memory cell becomes equal to or higher than a write start voltage of the second memory cell to be adjusted to a second target threshold value next higher than the first target threshold value;

performing verify reading sequentially on a first memory cell and a second memory cell when the write voltage to be applied to the word line at the time of writing on the first memory cell becomes equal to or higher than a write start voltage of the second memory cell, and performing writing on the first memory cell determined not to have reached a first target threshold value and the second memory cell determined not to have reached a second target threshold value, while the write voltage to be applied to the word line is increased;

performing writing collectively on a first predetermined number of the memory cells, with a first negative voltage being applied to unselected ones of the word lines, when the threshold value distributions of the first memory cell and the second memory cells are adjusted; and performing writing collectively on a second predetermined number of the memory cells, with a second negative voltage higher than the first negative voltage being applied to the unselect word lines, when the threshold value distribution of the third memory cell is adjusted, the second predetermined number of the memory cells being smaller than the first predetermined number of the memory cells.

9. A method for controlling a threshold value in a nonvolatile semiconductor memory device that includes a plurality of memory cells each capable of having a multi-value state by adjusting a threshold voltage, and performs writing on each of the memory cells by applying one of write voltages suitable for the multi-value state to each of the memory cells, the method comprising:
performing first writing by applying a first voltage corresponding to a first target threshold value, only a required minimum number of times, to the memory cells to be adjusted to a first state different from an erased state of the multi-value state;

performing second writing with a first initial voltage lower than a voltage corresponding to a second target threshold value on the memory cells to be adjusted to a second state having the second target threshold value lower than the first target threshold value, the second state being different from the erased state and the first state, and, when a threshold value after the second writing on the memory cells to be adjusted to the second state has not reached a intermediate level lower than the second target threshold value performing re-writing with a second voltage increased from the first initial voltage to avoid excess writing; and performing third writing on first and second memory cells with a second initial voltage lower than a voltage corresponding to a third target threshold value, the first memory cells being to be adjusted to a third state having the third target threshold value lower than the first and second target threshold values, and the second memory cells being to be adjusted to the second state and having the writing performed up to the intermediate level, the third state being different from the erased state, the first state, and the second state, and, when a threshold value after the third writing on the first memory cells to be adjusted to the third state and the second memory cells to be adjusted to the second state and having the writing performed up to the intermediate level has not reached to the third target value and the second target value are not reached, performing re-writing with a third voltage increased from the second initial voltage to avoid excess writing.

10. The method according to claim 9, further comprising fixing a gate voltage of a non-selected one of the memory cells in which writing is not to be performed to a predetermined negative voltage, while the writing and verify reading are performed on the memory cells.

* * * * *